US012765365B2

(12) United States Patent
Kim et al.

(10) Patent No.: US 12,765,365 B2
(45) Date of Patent: Oct. 13, 2026

(54) INTEGRATED CIRCUIT DEVICE

(71) Applicant: Samsung Electronics Co., Ltd., Suwon-si (KR)

(72) Inventors: Geunwoo Kim, Suwon-si (KR); Hyunwoo Kang, Suwon-si (KR); Mingyu Kim, Suwon-si (KR); Wandon Kim, Suwon-si (KR); Wonkeun Chung, Suwon-si (KR); Hyoseok Choi, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 336 days.

(21) Appl. No.: 18/650,288

(22) Filed: Apr. 30, 2024

(65) Prior Publication Data

US 2025/0096134 A1 Mar. 20, 2025

(30) Foreign Application Priority Data

Sep. 19, 2023 (KR) ........................ 10-2023-0125009

(51) Int. Cl.
*H10W 20/41* (2026.01)
*H10D 30/43* (2025.01)
(Continued)

(52) U.S. Cl.
CPC .......... *H10W 20/435* (2026.01); *H10D 30/43* (2025.01); *H10D 30/6211* (2025.01);
(Continued)

(58) Field of Classification Search
CPC ... H10W 20/435; H10W 20/42; H10W 20/40; H10W 20/20; H10W 20/023;
(Continued)

(56) References Cited

U.S. PATENT DOCUMENTS

| | | | |
|---|---|---|---|
| 5,563,448 | A | 10/1996 | Lee et al. |
| 7,696,086 | B2 | 4/2010 | Hsu et al. |

(Continued)

FOREIGN PATENT DOCUMENTS

| | | | |
|---|---|---|---|
| KR | 940022708 | A | 10/1994 |
| WO | 2022/150270 | A1 | 7/2022 |
| WO | 2022/197481 | A1 | 9/2022 |

OTHER PUBLICATIONS

Lee, Baek-Ju, et al. "Study on the deposition characteristics of molybdenum thin films deposited by the thermal atomic layer deposition method using MOO2CL2 as a precursor." Coatings, vol. 13, No. 6, Jun. 9, 2023, p. 1070, https://doi.org/10.3390/coatings13061070. (Year: 2023).*

*Primary Examiner* — J. E. Schoenholtz
(74) *Attorney, Agent, or Firm* — HARNESS, DICKEY & PIERCE, P.L.C.

(57) ABSTRACT

An integrated circuit device may include a source/drain contact insulation layer on a lower structure, a source/drain contact via penetrating through the source/drain contact insulation layer, an interconnect wiring insulation layer on the source/drain contact insulation layer and including an interconnect wiring trench exposing a top surface of the source/drain contact via, a first interconnect wiring layer covering a lower portion of a sidewall of the interconnect wiring trench and including a first precursor, and a second interconnect wiring layer on the first interconnect wiring layer. The second interconnect wiring layer may cover an upper portion of a sidewall of the interconnect wiring trench and may include a second precursor. A crystal grain size of the second precursor may be larger than a crystal grain size of the first precursor.

20 Claims, 45 Drawing Sheets

(51) Int. Cl.

| | |
|---|---|
| ***H10D 30/62*** | (2025.01) |
| ***H10D 30/67*** | (2025.01) |
| ***H10D 62/10*** | (2025.01) |
| ***H10D 84/85*** | (2025.01) |
| ***H10W 20/42*** | (2026.01) |

(52) U.S. Cl.
CPC ..... *H10D 30/6219* (2025.01); *H10D 30/6729* (2025.01); *H10D 30/6735* (2025.01); *H10D 30/6757* (2025.01); *H10D 62/121* (2025.01); *H10D 84/853* (2025.01); *H10W 20/42* (2026.01)

(58) Field of Classification Search
CPC ......... H10W 20/0234; H10W 20/0242; H10W 20/0245; H10W 20/0261; H10W 20/056; H10W 20/0595; H10W 20/2125; H10W 20/427; H10W 20/4441; H10W 20/481; H10D 30/43; H10D 30/6211; H10D 30/6219; H10D 30/6729; H10D 30/6735; H10D 30/6757; H10D 62/121; H10D 84/853; H10D 30/014; H10D 64/017; H10D 84/0158; H10D 84/834; H10P 14/43
See application file for complete search history.

(56) References Cited

U.S. PATENT DOCUMENTS

| | | | | |
|---|---|---|---|---|
| 8,846,524 | B2 | 9/2014 | Kao et al. | |
| 10,354,975 | B2 | 7/2019 | Soares et al. | |
| 11,056,344 | B2 | 7/2021 | Zhu et al. | |
| 11,869,806 | B2 * | 1/2024 | Ganguli | H10W 20/033 |
| 12,553,131 | B2 * | 2/2026 | Thombare | C23C 16/45527 |
| 2018/0286668 | A1 * | 10/2018 | Baum | H10W 20/045 |
| 2019/0067014 | A1 | 2/2019 | Shrestha et al. | |
| 2022/0216105 | A1 | 7/2022 | Zope et al. | |
| 2022/0238466 | A1 | 7/2022 | Tsai et al. | |
| 2022/0349048 | A1 | 11/2022 | Chandrashekar et al. | |
| 2022/0359281 | A1 * | 11/2022 | Ganguli | H10W 20/033 |
| 2024/0047269 | A1 * | 2/2024 | Na | C23C 16/08 |
| 2024/0203879 | A1 * | 6/2024 | Xie | H10D 84/0149 |
| 2024/0355673 | A1 * | 10/2024 | Lei | H10P 14/432 |
| 2026/0092369 | A1 * | 4/2026 | Thombare | C23C 16/45527 |

* cited by examiner

Y3 - Y3'

INTEGRATED CIRCUIT DEVICE

CROSS-REFERENCE TO RELATED APPLICATION

This application is based on and claims priority under 35 U.S.C. § 119 to Korean Patent Application No. 10-2023-0125009, filed on Sep. 19, 2023 in the Korean Intellectual Property Office, the disclosure of which is incorporated by reference herein in its entirety.

BACKGROUND

Inventive concepts relate to an integrated circuit device, and more particularly, to an integrated circuit device including a wiring structure.

Due to the development of electronic technology, down-scaling of integrated circuit devices is rapidly progressing, and thus the line width and the pitch of metal wiring layers included in the integrated circuit devices are becoming finer. Therefore, there is a need to develop an integrated circuit device having a wiring structure capable of suppressing an increase in the resistance of metal wiring layers and improving electrical characteristics and reliability.

SUMMARY

Inventive concepts provide an integrated circuit device having a wiring structure capable of limiting and/or suppressing an increase in the resistance of metal wiring layers and improving electrical characteristics and/or reliability of the integrated circuit device.

In addition, aspects of inventive concepts are not limited to the technical goals mentioned above, and other aspects may be clearly understood by one of ordinary skill in the art from the following description.

According to an embodiment of inventive concepts, an integrated circuit device may include a source/drain contact insulation layer on a lower structure; a source/drain contact via penetrating through the source/drain contact insulation layer; an interconnect wiring insulation layer on the source/drain contact insulation layer, the interconnect wiring insulation layer including an interconnect wiring trench exposing a top surface of the source/drain contact via; a first interconnect wiring layer covering a lower portion of a sidewall of the interconnect wiring trench, the first interconnect wiring layer including a first precursor; and a second interconnect wiring layer on the first interconnect wiring layer, the second interconnect wiring layer covering an upper portion of the sidewall of the interconnect wiring trench, and the second interconnect wiring layer including a second precursor. A crystal grain size of the second precursor may be larger than a crystal grain size of the first precursor.

According to an embodiment of inventive concepts, an integrated circuit device may include an interconnect wiring pattern on a lower structure; a source/drain contact via between the interconnect wiring pattern and the lower structure, the source/drain contact via electrically connecting the interconnect wiring pattern and the lower structure to each other; a via power rail extending from a bottom surface of the interconnect wiring pattern and penetrating through an upper portion of the lower structure; and a backside power rail connected to the via power rail, the backside power rail penetrating through a lower portion of the lower structure that is not penetrated by the via power rail. The backside power rail may include a first backside power conductive layer and a second backside power conductive layer. The first backside power conductive layer may contain oxygen and may cover a bottom surface of the via power rail. The second backside power conductive layer may not contain oxygen. The second backside power conductive layer may cover a bottom surface of the first backside power conductive layer.

According to an embodiment of inventive concepts, an integrated circuit device may include a substrate including a fin-type active region protruding from a surface of the substrate; a source/drain region on the fin-type active region; a metal silicide layer in contact with a top surface of the source/drain region; a gate line extending over the fin-type active region in a direction crossing the fin-type active region; an insulation structure on the source/drain region, the metal silicide layer, and the gate line; a source/drain contact penetrating through a first portion of the insulation structure in a vertical direction and connecting to the source/drain region through the metal silicide layer; a gate contact penetrating through a second portion of the insulation structure in the vertical direction and connecting to the gate line; an interconnect wiring pattern electrically connected to the source/drain contact or the gate contact; and a plurality of wiring structures on the interconnect wiring pattern and arranged at different levels in the vertical direction. The plurality of wiring structures may include a plurality of wiring patterns. At least one of the interconnect wiring pattern and the plurality of wiring patterns may include a first wiring layer and a second wiring layer covering a top surface of the first wiring layer. The first wiring layer may contain oxygen. The second wiring layer may not contain oxygen.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
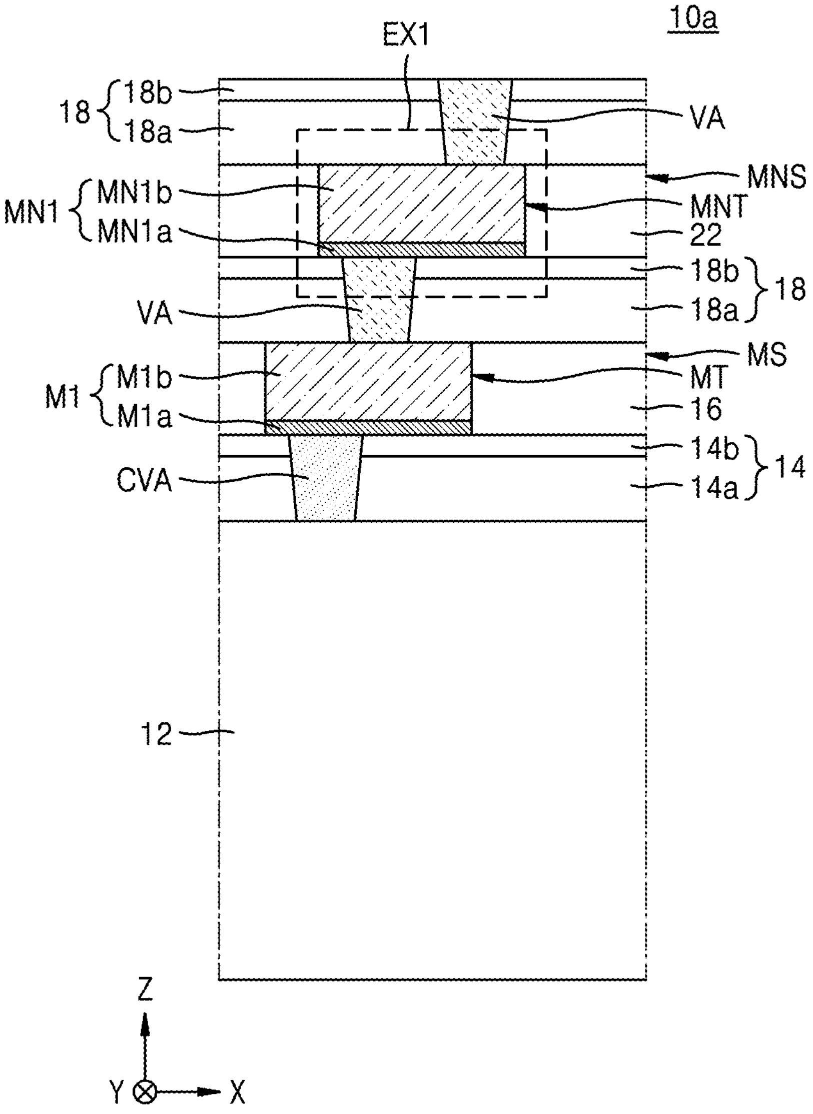
FIG. 1 is a diagram for describing an integrated circuit device according to embodiments.
Figure 2:
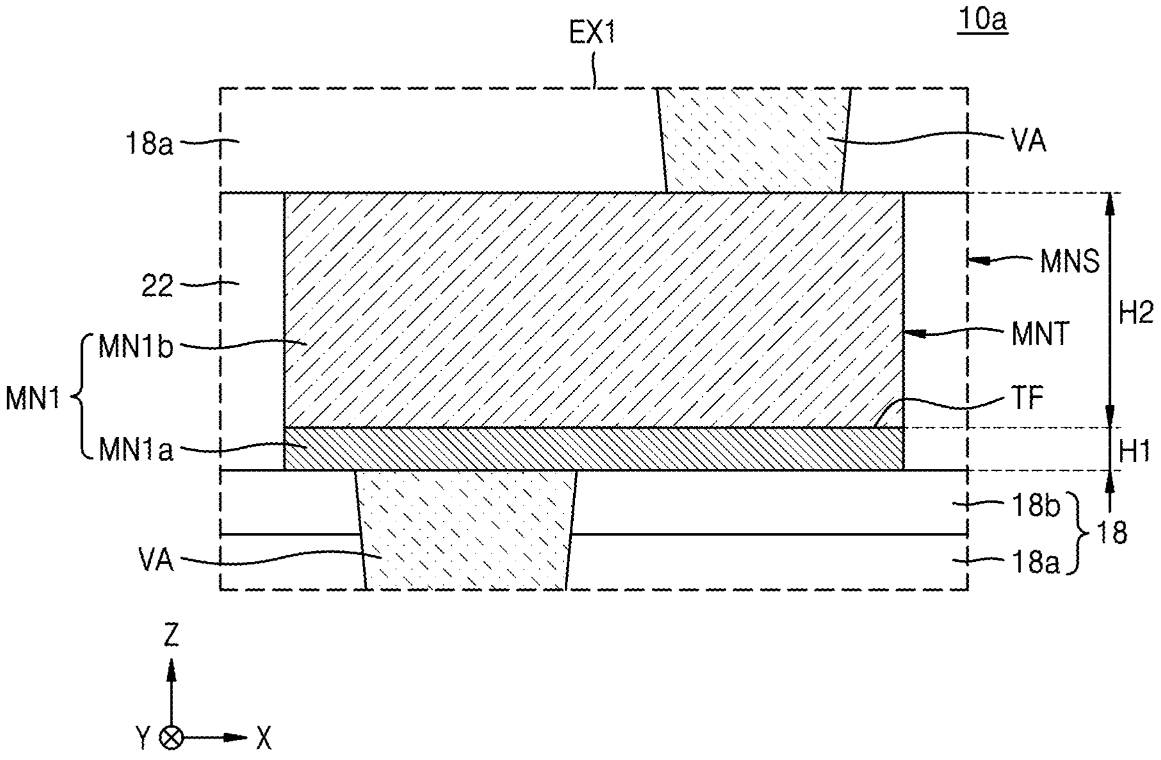
FIG. 2 is an enlarged view of a region "EX1" of FIG. 1.

FIG. 1 is a diagram for describing an integrated circuit device 10*a* according to embodiments. FIG. 2 is an enlarged view of a region "EX1" of FIG. 1.

Referring to FIGS. 1 and 2, the integrated circuit device 10*a* includes a lower structure 12, an interconnect wiring structure MS disposed on the lower structure 12, and a plurality of wiring structures MNS arranged on the interconnect wiring structure MS.

According to embodiments, the lower structure 12 may include a substrate containing silicon, such as monocrystalline silicon, polycrystalline silicon, or amorphous silicon, or at least one selected from among Ge, SiGe, SiC, GaAs, InAs, and InP. According to embodiments, the substrate may include a conductive region, e.g., a well doped with an impurity or a structure doped with an impurity. According to embodiments, the lower structure 12 may include circuit elements (not shown) such as a gate structure, an impurity region, a contact plug, etc. For example, the lower structure 12 may include a source/drain contact (not shown) connected to a source/drain region (not shown) or a gate contact (not shown) connected to a gate electrode (not shown).

In the present specification, a direction in which the lower structure 12 extends may be referred to as a first horizontal direction X, a direction, which intersects the first horizontal direction X and is another extending direction of the lower structure 12, may be referred to as a second horizontal direction Y, and a direction intersecting the first horizontal direction X and the second horizontal direction Y may be referred to as a vertical direction Z.

The lower structure 12 may have a frontside surface and a backside surface opposite thereto. In the present specification, the top surface of the lower structure 12 may be referred to as a frontside surface, and the bottom surface of the lower structure 12 may be referred to as a backside surface. According to embodiments, a supply voltage may be provided from the frontside surface of lower structure 12, and the integrated circuit device 10*a* may be configured as a frontside power delivery network (FSPDN).

The interconnect wiring structure MS and the plurality of wiring structures MNS may be sequentially arranged on the lower structure 12.

The interconnect wiring structure MS may include a source/drain contact insulation layer 14, at least one source/drain contact via CVA penetrating through the source/drain contact insulation layer 14, an interconnect wiring insulation layer 16, and at least one interconnect wiring pattern M1 penetrating through the interconnect wiring insulation layer 16. The at least one interconnect wiring pattern M1 may each be electrically connected to a corresponding source/drain contact via CVA.

The source/drain contact via CVA may have a shape in which the width of the source/drain contact via CVA in the first horizontal direction X gradually increases in a direction away from the lower structure 12 or the width of the source/drain contact via CVA in the first horizontal direction X is constant. According to embodiments, the source/drain contact via CVA may include a contact plug. The contact plug may include Mo, Cu, W, Co, Ru, Mn, Ti, Ta, Al, or a combination thereof. According to embodiments, the source/drain contact via CVA may include a contact plug and a conductive barrier film surrounding the contact plug. The conductive barrier film may include Ti, Ta, W, TIN, TaN, WN, WCN, TiSiN, TaSiN, WSiN, or a combination thereof.

According to embodiments, the source/drain contact via CVA may be electrically connected to a source/drain region (not shown) or a gate electrode (not shown) of a transistor formed in the lower structure 12 through a source/drain contact (not shown) or a gate contact (not shown).

The source/drain contact insulation layer 14 may cover the top surface of the lower structure 12 and surround the sidewall of the source/drain contact via CVA. According to embodiments, the source/drain contact insulation layer 14 may include a first source/drain contact insulation layer 14*a* and a second source/drain contact insulation layer 14*b* disposed on the first source/drain contact insulation layer 14*a*.

According to embodiments, the first source/drain contact insulation layer 14*a* may include an insulation material such as an oxide or silicon oxide. For example, the first source/drain contact insulation layer 14*a* may include an oxide film, a nitride film, an ultra-low k (ULK) film having an ultra-low dielectric constant k from about 2.2 to about 2.4, or a combination thereof. For example, the first source/drain contact insulation layer 14*a* may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The second source/drain contact insulation layer 14*b* may include a material having a different etch selectivity from that of the first source/drain contact insulation layer 14*a* and may include an insulation material such as a nitride or silicon nitride. For example, the second source/drain contact insulation layer 14*b* may include silicon carbide (SIC), SiN, nitrogen-doped silicon carbide (SiC:N), SiOC, AlN, AlON, AlO, AlOC, or a combination thereof. The terms such as "SiN", "SiON", "SiOC", and "SiCOH" used herein refer to materials composed of elements included in the respective terms and are not chemical formulas indicating stoichiometric relationships.

The interconnect wiring insulation layer 16 may be disposed on the source/drain contact insulation layer 14. According to embodiments, the interconnect wiring insulation layer 16 may include an oxide film, a nitride film, an ultra-low k (ULK) film having an ultra-low dielectric constant k from about 2.2 to about 2.4, or a combination thereof. For example, the interconnect wiring insulation layer 16 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The interconnect wiring insulation layer 16 may include at least one interconnect wiring trench MT. The top surface of the source/drain contact via CVA may be exposed through the interconnect wiring trench MT.

The interconnect wiring pattern M1 may be arranged to fill the interior of the interconnect wiring trench MT. According to embodiments, the interconnect wiring pattern M1 may cover the top surface of the source/drain contact via CVA and a portion of the top surface of the source/drain contact insulation layer 14 adjacent to the source/drain contact via CVA. In other words, the source/drain contact via CVA may cover a portion of the bottom surface of the interconnect wiring pattern M1.

According to embodiments, the interconnect wiring pattern M1 may have a shape in which the width of the interconnect wiring pattern M1 in the first horizontal direction X gradually increases in a direction away from the source/drain contact via CVA or the width of the interconnect wiring pattern M1 in the first horizontal direction X is constant. At this time, the maximum horizontal width of the interconnect wiring pattern M1 may be greater than the maximum horizontal width of the source/drain contact via CVA.

According to embodiments, the interconnect wiring pattern M1 may have a multi-layer structure including a first interconnect wiring layer M1*a* and a second interconnect wiring layer M1*b* on top of the first interconnect wiring layer M1*a*. The first interconnect wiring layer M1*a* may cover a lower portion of the sidewall of the interconnect wiring trench MT, and the second interconnect wiring layer M1*b* may cover an upper portion of the first interconnect wiring layer M1*a*.

The first interconnect wiring layer M1*a* may contact the source/drain contact via CVA and the source/drain contact insulation layer 14. The second interconnect wiring layer M1*b* may be spaced apart from the source/drain contact via CVA and the source/drain contact insulation layer 14 with the first interconnect wiring layer M1*a* therebetween.

According to embodiments, the first interconnect wiring layer M1*a* may include a first metal, and the second interconnect wiring layer M1*b* may include a second metal. According to embodiments, the first metal and the second metal may be identical to each other. For example, the first metal and the second metal may include molybdenum (Mo). In some embodiments, the first interconnect wiring layer M1*a* and the second interconnect wiring layer M1*b* may essentially include Mo.

A precursor used in a deposition process of the first metal for forming the first interconnect wiring layer M1*a* may include the first metal. The deposition process of the first metal may be performed by exposing the interconnect wiring trench MT to the precursor to attach the precursor along the inner wall of the interconnect wiring trench MT and removing the remainder of the precursor other than the first metal thereafter. At this time, the remainder of the precursor other than the first metal may not be completely removed and some of the remainder may remain. In the present specification, a remaining part of the precursors may be referred to as a first precursor, and the first interconnect wiring layer M1*a* may include the first precursor.

According to embodiments, the first precursor included in the first interconnect wiring layer M1*a* may include molybdenum halide, e.g., molybdenum oxychloride or $MoO_2Cl_2$. In some embodiments, the first precursor may include $MoO_2Cl_2$. In other words, according to embodiments, since the first interconnect wiring layer M1*a* includes the first precursor, the first interconnect wiring layer M1*a* may include oxygen or chlorine. In particular, since the first precursor may be located at a location of the lower portion of the first interconnect wiring layer M1*a* adjacent to the inner wall of the interconnect wiring trench MT, the location of the lower portion of the first interconnect wiring layer M1*a* adjacent to the inner wall of the interconnect wiring trench MT may include oxygen or chlorine.

A precursor used in a deposition process of the second metal for forming the second interconnect wiring layer M1*b* may include the second metal. The deposition process of the second metal may be performed by exposing the interconnect wiring trench MT having formed thereon the first interconnect wiring layer M1*a* to the precursor to attach the precursor on the top surface of the first interconnect wiring layer M1*a* and removing the remainder of the precursor other than the second metal thereafter. At this time, the remainder of the precursor other than the second metal may not be completely removed and some of the remainder may remain in the state of the precursor. In the present specification, a remaining part of the precursors may be referred to as a second precursor, and the second interconnect wiring layer M1*b* may include the second precursor.

According to embodiments, the second precursor included in the second interconnect wiring layer M1*b* may include molybdenum halide, for example, molybdenum chloride or $MoCl_5$. In some embodiments, the second precursor may include $MoCl_5$. In other words, since the second interconnect wiring layer M1*b* includes the second precursor, the second interconnect wiring layer M1*b* may include chlorine. In particular, since the second precursor may be located below a portion of the second interconnect wiring layer M1*b* adjacent to the top surface of the first interconnect wiring layer M1*a* (e.g., below the second interconnect wiring layer M1*b*), the lower portion of the second interconnect wiring layer M1*b* may include chlorine. Also, unlike the first interconnect wiring layer M1*a*, the second interconnect wiring layer M1*b* includes $MoCl_5$ as the second precursor, and thus the second interconnect wiring layer M1*b* may not include oxygen.

According to embodiments, the first interconnect wiring layer M1*a* may include $MoO_2Cl_2$ with a grain size of about 9 nanometers as the first precursor, and the second interconnect wiring layer M1*b* may include $MoCl_5$ with a grain size of about 11 nanometers as the second precursor. Therefore, the average grain size of the second interconnect wiring layer M1*b* may be greater than the average grain size of the first interconnect wiring layer M1*a*. In detail, the grain size of the lower portion of the second interconnect wiring layer M1*b* may be greater than the grain size of the lower portion of the first interconnect wiring layer M1*a*.

Unlike the first interconnect wiring layer M1*a*, the second interconnect wiring layer M1*b* does not contain oxygen and the average grain size of the second interconnect wiring layer M1*b* is greater than the average grain size of the first interconnect wiring layer M1*a*, and thus the electrical resistance of the second interconnect wiring layer M1*b* may be lower than that of the first interconnect wiring layer M1*a*.

The plurality of wiring structures MNS may be arranged on the interconnect wiring structure MS. The plurality of wiring structures MNS may each include a contact insulation layer 18, at least one contact via VA penetrating through the contact insulation layer 18, a wiring insulation layer 22 on the contact insulation layer 18, and at least one wiring pattern MN1 penetrating through the wiring insulation layer 22. The at least one wiring pattern MN1 may each be electrically connected to a corresponding contact via VA.

The contact insulation layer 18 may be disposed on the interconnect wiring pattern M1, and the contact via VA penetrating through the contact insulation layer 18 on the interconnect wiring pattern M1 may be electrically connected to the interconnect wiring pattern M1.

The contact via VA may have a shape in which the width of the contact via VA in the first horizontal direction X gradually increases in a direction away from the interconnect wiring pattern M1 or is constant. The contact via VA may cover a portion of the top surface of the interconnect wiring pattern M1. In other words, the interconnect wiring pattern M1 may cover the bottom surface of the contact via VA and may cover a portion of the bottom surface of the contact insulation layer 18 surrounding the contact via VA.

According to embodiments, the detailed configuration of the contact via VA is substantially identical to that described for a contact plug and a conductive barrier layer constituting the source/drain contact via CVA.

The contact insulation layer 18 may surround the sidewall of the contact via VA. The contact insulation layer 18 may include a first contact insulation layer 18*a* and a second contact insulation layer 18*b* disposed on the first contact insulation layer 18*a*. According to embodiments, the first contact insulation layer 18*a* may include substantially the same material as that described for the first source/drain contact insulation layer 14*a*, and the second contact insulation layer 18*b* may include substantially the same material as that described for the second source/drain contact insulation layer 14*b*.

The wiring insulation layer 22 may be disposed on the contact insulation layer 18. The wiring insulation layer 22 may include substantially the same material as that described for the interconnect wiring insulation layer 16. The wiring insulation layer 22 may include at least one wiring trench MNT. The top surface of the contact via VA may be exposed through the wiring trench MNT.

The wiring pattern MN1 may be arranged to fill the interior of the wiring trench MNT. According to embodiments, the wiring pattern MN1 may cover the top surface of the contact via VA and a portion of the top surface of the contact insulation layer 18 adjacent to the contact via VA. In other words, the contact via VA may cover a portion of the bottom surface of the wiring pattern MN1.

According to embodiments, the wiring pattern MN1 may have a shape in which the width of the wiring pattern MN1 in the first horizontal direction X gradually increases in a direction away from the interconnect wiring pattern M1 or is constant. Here, the maximum horizontal width of the wiring pattern MN1 may be greater than the maximum horizontal width of the contact via VA.

According to embodiments, the wiring pattern MN1 may have a multi-layered structure including a first wiring layer MN1*a* and a second wiring layer MN1*b* on the first wiring layer MN1*a*. The first wiring layer MN1*a* may cover a lower portion of the sidewall of the wiring trench MNT, and the second wiring layer MN1*b* may cover an upper portion of the sidewall of the wiring trench MNT.

The first wiring layer MN1*a* may contact the contact via VA and the contact insulation layer 18. The second wiring layer MN1*b* may be spaced apart from the contact via VA and the contact insulation layer 18 with the first wiring layer MN1*a* therebetween.

According to embodiments, the first wiring layer MN1*a* and the second wiring layer MN1*b* may include substantially the same materials as those described for the first interconnect wiring layer M1*a* and the second interconnect wiring layer M1*b*, respectively. For example, the first wiring layer MN1*a* and the second wiring layer MN1*b* may include Mo. In some embodiments, the first wiring layer MN1*a* and the second wiring layer MN1*b* may essentially include Mo.

According to embodiments, the first wiring layer MN1*a* and the second wiring layer MN1*b* may be manufactured through substantially the same process as the manufacturing process of the first interconnect wiring layer M1*a* and the second interconnect wiring layer M1*b*, respectively. According to embodiments, similar to the first interconnect wiring layer M1*a* and the second interconnect wiring layer M1*b*, during the deposition process of the first metal and the second metal, some of precursors may remain, the first wiring layer MN1*a* may include the first precursor, and the second wiring layer MN1*b* may include the second precursor.

According to embodiments, the first precursor of the first wiring layer MN1*a* may include oxygen, and the second precursor of the second wiring layer MN1*b* may not include oxygen. For example, the first precursor may include $MoO_2Cl_2$, and the second precursor may include $MoCl_5$. Also, the crystal grain size of the second precursor of the second wiring layer MN1*b* may be greater than the crystal grain size of the first precursor of the first wiring layer MN1*a*. In other words, the average crystal grain size of the second wiring layer MN1*b* may be greater than the average grain size of the first wiring layer MN1*a*. Therefore, the electrical resistance of the second wiring layer MN1*b* may be lower than the electrical resistance of the first wiring layer MN1*a*.

As shown in FIG. 2, the first wiring layer MN1*a* may have a top surface TF, which is in contact with the second wiring layer MN1*b*, and a bottom surface opposite to the top surface TF. According to embodiments, the first wiring layer MN1*a* may have a flat top surface TF. For example, the top surface TF of the first wiring layer MN1*a* may be a flat surface extending until it contacts the sidewall of the wiring trench MNT in the first horizontal direction X and the second horizontal direction Y. Also, the first interconnect wiring layer M1*a* may have a flat top surface, like the top surface TF of the first wiring layer MN1*a*. For example, the top surface of the first interconnect wiring layer M1*a* may be a flat surface extending until it contacts the sidewall of the interconnect wiring trench MT in the first horizontal direction X and the second horizontal direction Y.

According to embodiments, a thickness H1 of the first wiring layer MN1*a* in the vertical direction Z may be smaller than a thickness H2 of the second wiring layer MN1*b* in the vertical direction Z. The first wiring layer MN1*a* may have the thickness H1 from about 2 nanometers to about 10 nanometers and may have the thickness H1 of about 3 nanometers.

The contact insulation layer 18 may be disposed on the wiring pattern MN1, and the contact via VA penetrating through the contact insulation layer 18 on the wiring pattern MN1 may be electrically connected to the wiring pattern MN1. Therefore, at least one wiring pattern MN1 included in the plurality of wiring structures MNS may be electrically connected to at least one contact via VA, at least one wiring pattern MN1 may be electrically connected to a corresponding interconnect wiring pattern M1 through the contact via VA electrically connected to the at least one wiring pattern MN1, and the at least one wiring pattern MN1 may be electrically connected to a corresponding source/drain contact via CVA through the contact via VA electrically connected to the at least one wiring pattern MN1.

According to embodiments, the interconnect wiring pattern M1 or wiring pattern MN1 may include multiple layers. In detail, since the interconnect wiring pattern M1 includes the second interconnect wiring layer M1*b* having a greater average grain size than the first interconnect wiring layer M1*a*, the wiring pattern MN1 includes the second wiring layer MN1*b* having a greater average grain size than the first wiring layer MN1*a*, and the second interconnect wiring layer M1*b* and the second wiring layer MN1*b* do not include oxygen, an integrated circuit device including a metal wiring layer having a low electrical resistance may be provided.

Also, when the interconnect wiring pattern M1 or the wiring pattern MN1 has a single-layer structure, during formation of the interconnect wiring pattern M1 or the wiring pattern MN1, the sidewall of the interconnect wiring pattern M1 or the wiring pattern MN1 may be distorted due to stress. However, since the interconnect wiring pattern M1 or the wiring pattern MN1 has a multi-layered structure, the stress applied to the interconnect wiring pattern M1 or the wiring pattern MN1 may be reduced, and thus an integrated circuit device with improved structural stability may be provided.

Figure 3:
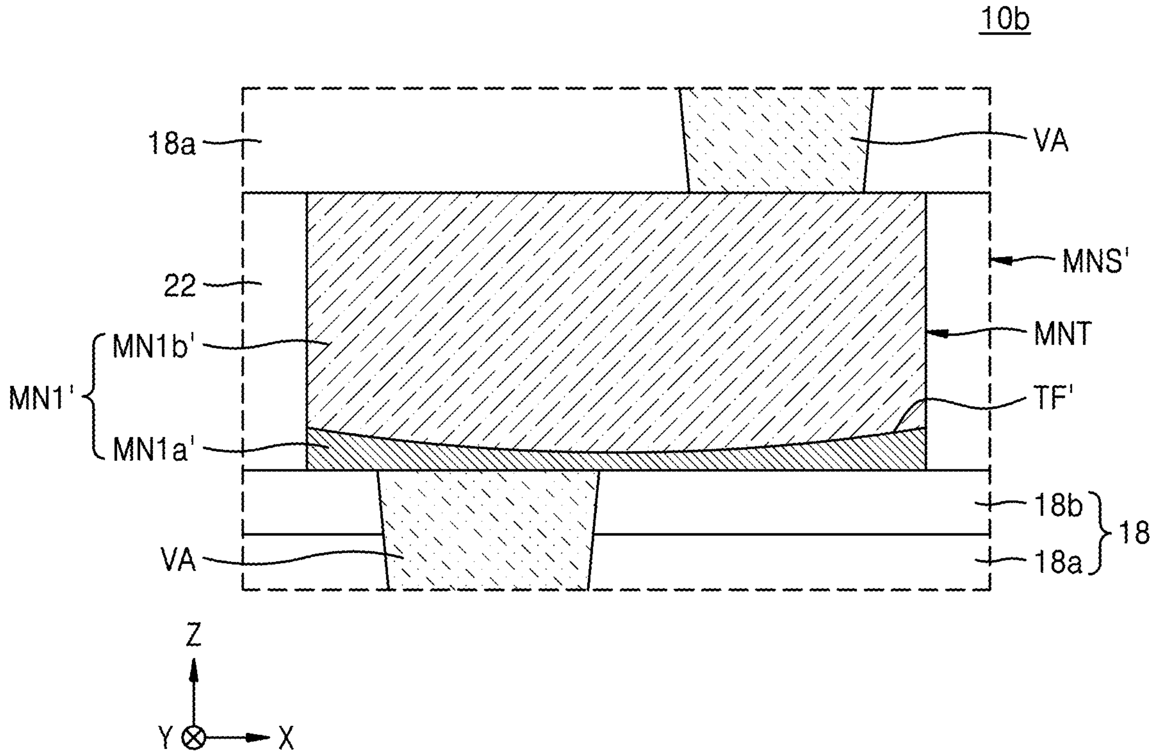
FIG. 3 is a diagram for describing an integrated circuit device according to other embodiments.

FIG. 3 is a diagram for describing an integrated circuit device 10*b* according to embodiments. FIG. 3 shows a portion corresponding to a region "EX1" of FIG. 1. Since the integrated circuit device 10*b* is configured in a generally similar manner to the above-described integrated circuit device 10*a*, descriptions below will focus on the differences between the integrated circuit device 10*a* and the integrated circuit device 10*b*.

Referring to FIG. 3, the integrated circuit device 10*b* may include a lower structure (not shown), an interconnect wiring structure (not shown) disposed on the lower structure, and a plurality of wiring structures MNS' arranged on the interconnect wiring structure.

The plurality of wiring structures MNS' may each include the contact insulation layer 18, the at least one contact via VA penetrating through the contact insulation layer 18, the wiring insulation layer 22 on the contact insulation layer 18, and the at least one wiring pattern MN1' penetrating through the wiring insulation layer 22. The contact via VA may be electrically connected to a corresponding wiring pattern MN1'.

The wiring pattern MN1' may have a multi-layered structure including a first wiring layer MN1*a*' and a second wiring layer MN1*b*' on the first wiring layer MN1*a*'. The first wiring layer MN1*a*' may cover a lower portion of the sidewall of the wiring trench MNT, and the second wiring layer MN1*b*' may cover an upper portion of the sidewall of the wiring trench MNT.

As shown in FIG. 3, the first wiring layer MN1*a*' may have a top surface TF, which is in contact with the second wiring layer MN1*b*', and a bottom surface opposite to the top surface TF. According to embodiments, the first wiring layer MN1*a*' may have the top surface TF' that is concave toward the lower side of the first wiring layer MN1*a*'. According to embodiments, the thickness of the edge portion of the first wiring layer MN1*a*' in the vertical direction Z may be greater than the thickness of the center portion of the first wiring layer' MN1*a*' in the vertical direction Z.

According to embodiments, the interconnect wiring structure (not shown) may be configured generally similarly to a wiring structure FWS'. A first interconnect wiring layer may have a top surface that is concave toward the lower side of the first interconnect wiring layer. According to embodiments, the thickness of the edge portion of the first interconnect wiring layer in the vertical direction Z may be greater than the thickness of the center portion of the first interconnect wiring layer in the vertical direction Z.

Figure 4A:
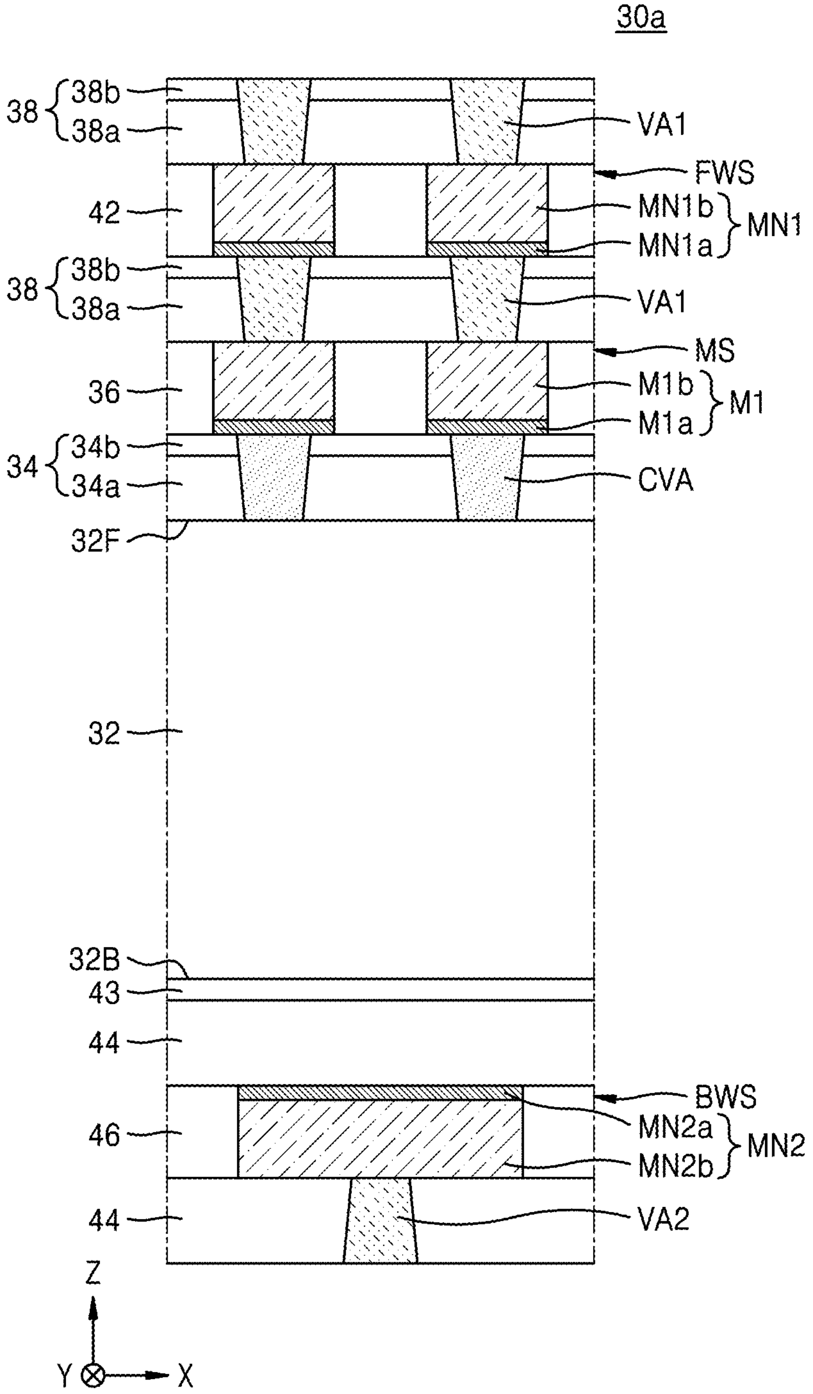
FIG. 4A is a diagram for describing an integrated circuit device according to embodiments.
Figure 4B:
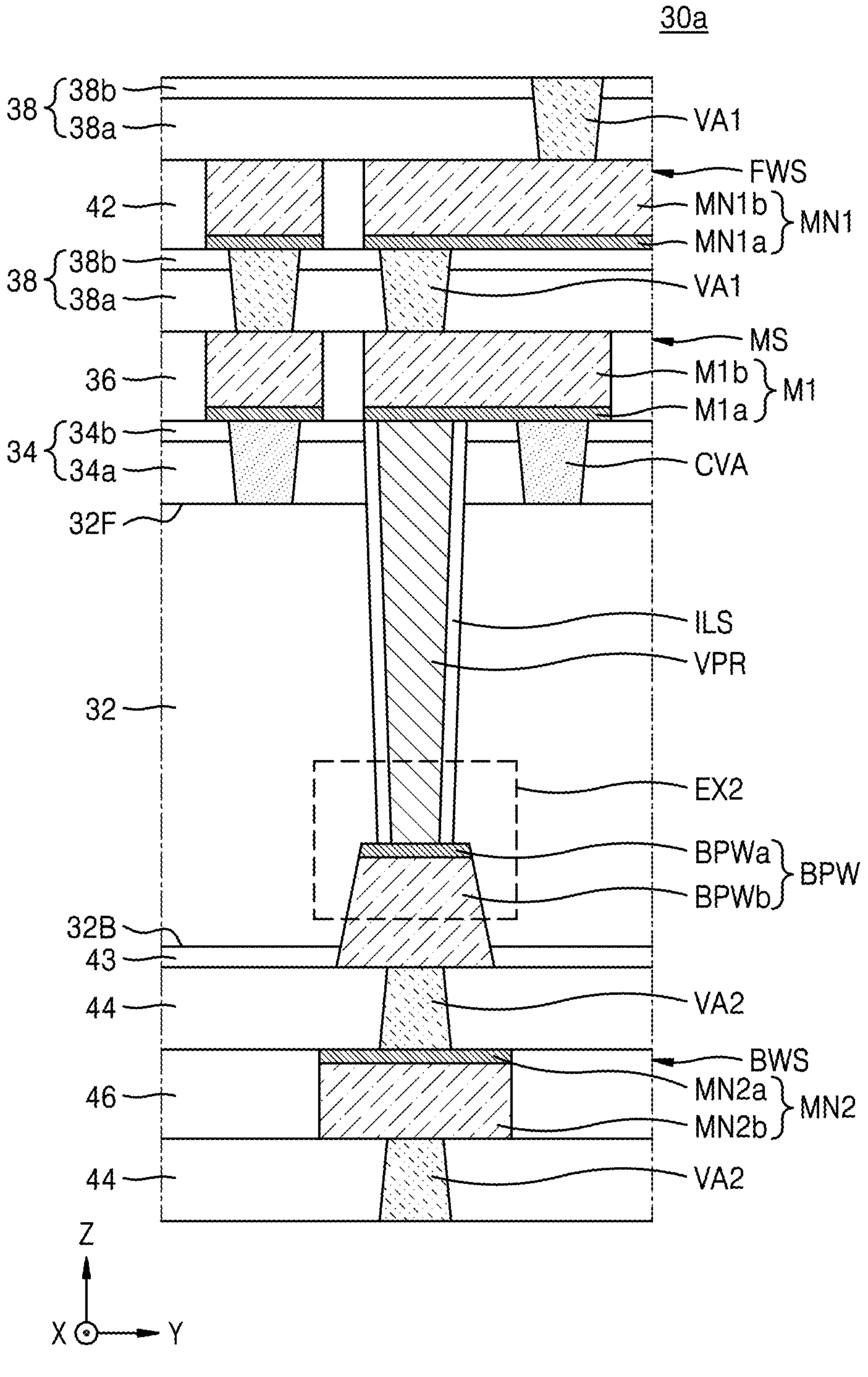
FIG. 4B is a diagram for describing an integrated circuit device according to embodiments.
Figure 5:
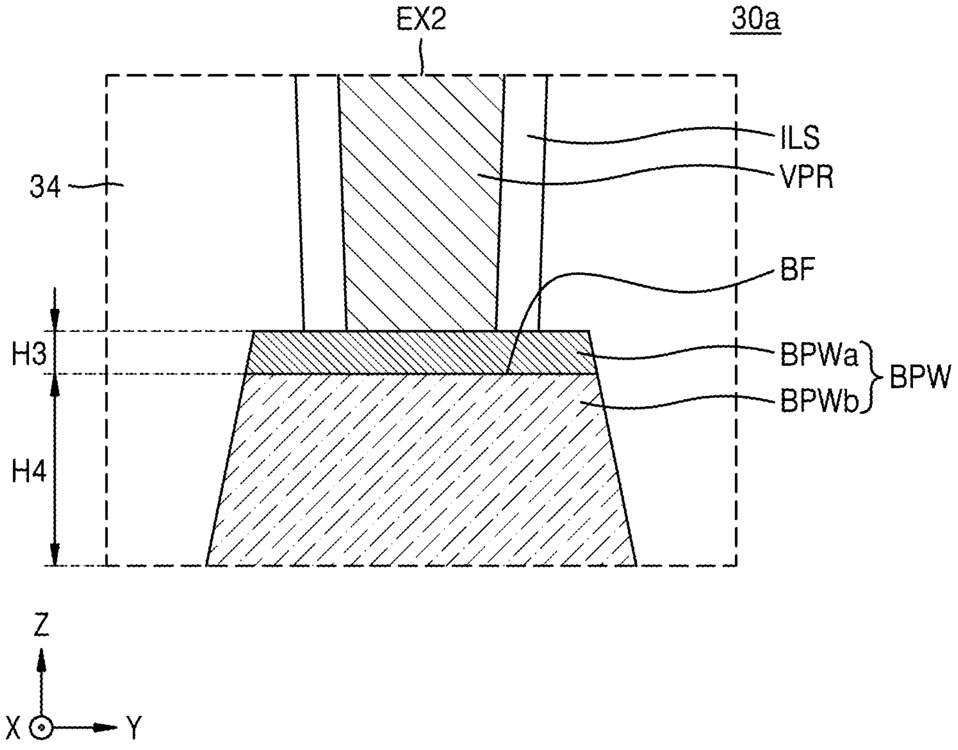
FIG. 5 is an enlarged view of a region "EX2" of FIG. 4B.

FIG. 4A is a diagram for describing an integrated circuit device 30*a* according to embodiments. FIG. 4B is a diagram for describing an integrated circuit device 30*a* according to embodiments. FIG. 5 is an enlarged view of a region "EX2" of FIG. 4B.

Referring to FIGS. 4A, 4B, and 5, the integrated circuit device 30*a* may include a lower structure 32, the interconnect wiring structure MS disposed on a frontside surface 32F of the lower structure 32, and a plurality of front wiring structures FWS disposed on the interconnect wiring structure MS.

According to embodiments, the lower structure 32 may include a substrate containing silicon, such as monocrystalline silicon, polycrystalline silicon, or amorphous silicon, or at least one selected from among Ge, SiGe, SiC, GaAs, InAs, and InP. According to embodiments, the lower structure 32 may include a conductive region, e.g., a well doped with an impurity or a structure doped with an impurity. According to embodiments, the lower structure 32 may include circuit elements (not shown) such as a gate structure, an impurity region, a contact plug, etc. For example, the lower structure 32 may include a source/drain contact (not shown) connected to a source/drain region (not shown) or a gate contact (not shown) connected to a gate electrode (not shown).

The lower structure 32 may have the frontside surface 32F and a backside surface 32B opposite thereto. In the present specification, the top surface of the lower structure 32 may be referred to as the frontside surface 32F, and the bottom surface of the lower structure 32 may be referred to as the backside surface 32B.

According to embodiments, a supply voltage may be provided from the backside surface 32B of lower structure 32, and the integrated circuit device 10*a* may be configured as a backside power delivery network (BSPDN).

The interconnect wiring structure MS may include a source/drain contact insulation layer 34, at least one source/drain contact via CVA penetrating through the source/drain contact insulation layer 34, an interconnect wiring insulation layer 36, and at least one interconnect wiring pattern M1 penetrating through the interconnect wiring insulation layer 36. The at least one interconnect wiring pattern M1 may each be electrically connected to a corresponding source/drain contact via CVA.

The source/drain contact via CVA may have a shape in which the width of the source/drain contact via CVA in the first horizontal direction X and the second horizontal direction Y gradually increases in a direction away from the lower structure 32 or is constant. According to embodiments, the source/drain contact via CVA may include a contact plug. The contact plug may include Mo, Cu, W, Co, Ru, Mn, Ti, Ta, Al, or a combination thereof. According to embodiments, the source/drain contact via CVA may include a contact plug and a conductive barrier film surrounding the contact plug. The conductive barrier film may include Ti, Ta, W, TiN, TaN, WN, WCN, TiSiN, TaSiN, WSiN, or a combination thereof.

According to embodiments, the source/drain contact via CVA may be electrically connected to a source/drain region (not shown) or a gate electrode (not shown) of a transistor formed in the lower structure 32 through a source/drain contact (not shown) or a gate contact (not shown).

The source/drain contact insulation layer 34 may cover the top surface of the lower structure 32 and surround the sidewall of the source/drain contact via CVA. According to embodiments, the source/drain contact insulation layer 34 may include a first source/drain contact insulation layer 34*a* and a second source/drain contact insulation layer 34*b* disposed on the first source/drain contact insulation layer 34*a*.

According to embodiments, the first source/drain contact insulation layer 34*a* may include an insulation material such as an oxide or silicon oxide. For example, the first source/drain contact insulation layer 34*a* may include an oxide film, a nitride film, an ultra-low k (ULK) film having an ultra-low dielectric constant k from about 2.2 to about 2.4, or a combination thereof. For example, the first source/drain contact insulation layer 34*a* may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The second source/drain contact insulation layer 34*b* may include a material having a different etch selectivity from that of the first source/drain contact insulation layer 34*a* and may include an insulation material such as a nitride or silicon nitride. For example, the second source/drain contact insulation layer 34*b* may include silicon carbide (SiC), SiN, nitrogen-doped silicon carbide (SiC:N), SiOC, AlN, AlON, AlO, AlOC, or a combination thereof.

The interconnect wiring insulation layer 36 may be disposed on the source/drain contact insulation layer 34. According to embodiments, the interconnect wiring insulation layer 36 may include an oxide film, a nitride film, an ultra-low k (ULK) film having an ultra-low dielectric constant k from about 2.2 to about 2.4, or a combination thereof. For example, the interconnect wiring insulation layer 36 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The interconnect wiring insulation layer 36 may include at least one interconnect wiring trench MT. The top surface of the source/drain contact via CVA may be exposed through the interconnect wiring trench MT.

The interconnect wiring pattern M1 may be arranged to fill the interior of the interconnect wiring trench MT. According to embodiments, the interconnect wiring pattern M1 may cover the top surface of the source/drain contact via CVA and a portion of the top surface of the source/drain contact insulation layer 34 adjacent to the source/drain contact via CVA. In other words, the source/drain contact via CVA may cover a portion of the bottom surface of the interconnect wiring pattern M1.

According to embodiments, the interconnect wiring pattern M1 may have a shape in which the width of the interconnect wiring pattern M1 in the first horizontal direction X and the second horizontal direction Y gradually increases in a direction away from the source/drain contact via CVA or the width of the interconnect wiring pattern M1 in the first horizontal direction X and the second horizontal direction Y is constant. At this time, the maximum horizontal width of the interconnect wiring pattern M1 may be greater than the maximum horizontal width of the source/drain contact via CVA.

According to embodiments, the interconnect wiring pattern M1 may have a multi-layer structure including a first interconnect wiring layer M1*a* and a second interconnect wiring layer M1*b* on top of the first interconnect wiring layer M1*a*. The first interconnect wiring layer M1*a* may cover a lower portion of the sidewall of the interconnect wiring trench MT, and the second interconnect wiring layer M1*b* may cover an upper portion of the sidewall of the interconnect wiring trench MT.

The first interconnect wiring layer M1*a* may contact the source/drain contact via CVA and the source/drain contact insulation layer 14. The second interconnect wiring layer M1*b* may be spaced apart from the source/drain contact via CVA and the source/drain contact insulation layer 34 with the first interconnect wiring layer M1*a* therebetween.

According to embodiments, the first interconnect wiring layer M1*a* may include a first metal, the second interconnect wiring layer M1*b* may include a second metal, and the first metal and the second metal may be identical to each other. For example, the first metal and the second metal may include molybdenum (Mo). In some embodiments, the first interconnect wiring layer M1*a* and the second interconnect wiring layer M1*b* may essentially include Mo.

According to embodiments, the first interconnect wiring layer M1*a* and the second interconnect wiring layer M1*b* may be fabricated through fabricating processes substantially identical to the fabricating processes of the first interconnect wiring layer M1*a* and the second interconnect wiring layer M1*b* described above with reference to FIGS. 1 and 2, respectively.

According to embodiments, during the deposition processes of the first metal and the second metal, some of precursors may remain, the first interconnect wiring layer M1*a* may include the first precursor, and the second interconnect wiring layer M1*b* may include the second precursor.

According to embodiments, the first precursor of the first interconnect wiring layer M1*a* may include oxygen, and the second precursor of the second interconnect wiring layer M1*b* may not include oxygen. For example, the first precursor may include $MoO_2Cl_2$, and the second precursor may include $MoCl_5$. Also, the crystal grain size of the second precursor of the second interconnect wiring layer M1*b* may be greater than the crystal grain size of the first precursor of the first interconnect wiring layer M1*a*. In other words, the average crystal grain size of the second interconnect wiring layer M1*b* may be greater than the average crystal grain size of the first interconnect wiring layer M1*a*. Therefore, the electrical resistance of the second interconnect wiring layer M1*b* may be lower than the electrical resistance of the first interconnect wiring layer M1*a*.

The plurality of front wiring structures FWS may be arranged on the interconnect wiring structure MS. The plurality of front wiring structures FWS may each include a contact insulation layer 38, at least one contact via VA1 penetrating through the contact insulation layer 38, a wiring insulation layer 42 on the contact insulation layer 38, and at least one wiring pattern MN1 penetrating through the wiring insulation layer 42. The at least one wiring pattern MN1 may each be electrically connected to a corresponding contact via VA1.

The contact insulation layer 38 may be disposed on the interconnect wiring pattern M1, and the contact via VA1 penetrating through the contact insulation layer 38 on the interconnect wiring pattern M1 may be electrically connected to the interconnect wiring pattern M1.

The contact via VA1 may have a shape in which the width of the contact via VA in the first horizontal direction X and the second horizontal direction Y gradually increases in a direction away from the interconnect wiring pattern M1 or is constant. The contact via VA1 may cover a portion of the top surface of the interconnect wiring pattern M1. In other words, the interconnect wiring pattern M1 may cover the bottom surface of the contact via VA1 and may cover a portion of the bottom surface of the contact insulation layer 38 surrounding the contact via VA1.

According to embodiments, the detailed configuration of the contact via VA1 is substantially identical to that described for a contact plug and a conductive barrier layer constituting the source/drain contact via CVA.

The contact insulation layer 38 may surround the sidewall of the contact via VA1. The contact insulation layer 38 may include a first contact insulation layer 38*a* and a second contact insulation layer 38*b* disposed on the first contact insulation layer 38*a*. According to embodiments, the first contact insulation layer 38*a* may include substantially the same material as that described for the first source/drain contact insulation layer 34*a*, and the second contact insulation layer 38*b* may include substantially the same material as that described for the second source/drain contact insulation layer 14*b*.

The wiring insulation layer 42 may be disposed on the contact insulation layer 38. The wiring insulation layer 42 may include substantially the same material as that described for the interconnect wiring insulation layer 36. The wiring insulation layer 42 may include at least one wiring trench MNT. The top surface of the contact via VA1 may be exposed through the wiring trench MNT.

The wiring pattern MN1 may be arranged to fill the interior of the wiring trench MNT. According to embodiments, the wiring pattern MN1 may cover the top surface of the contact via VA1 and a portion of the top surface of the contact insulation layer 38 adjacent to the contact via VA1. In other words, the contact via VA1 may cover a portion of the bottom surface of the wiring pattern MN1.

According to embodiments, the wiring pattern MN1 may have a shape in which the width of the wiring pattern MN1 in the first horizontal direction X and the second horizontal direction Y gradually increases in a direction away from the interconnect wiring pattern M1 or is constant. The maximum horizontal width of the wiring pattern MN1 may be greater than the maximum horizontal width of the contact via VA1.

According to embodiments, the wiring pattern MN1 may have a multi-layered structure including a first wiring layer MN1*a* and a second wiring layer MN1*b* on the first wiring layer MN1*a*. The first wiring layer MN1*a* may cover a lower portion of the sidewall of the wiring trench MNT, and the second wiring layer MN1*b* may cover an upper portion of the sidewall of the wiring trench MNT.

The first wiring layer MN1*a* may contact the contact via VA and the contact insulation layer 38. The second wiring layer MN1*b* may be spaced apart from the contact via VA and the contact insulation layer 18 with the first wiring layer MN1*a* therebetween.

According to embodiments, the first wiring layer MN1*a* and the second wiring layer MN1*b* may include substantially the same materials as those described for the first interconnect wiring layer M1*a* and the second interconnect wiring layer M1*b*, respectively. According to embodiments, the first wiring layer MN1*a* and the second wiring layer MN1*b* may include the same metal. For example, the first wiring layer MN1*a* and the second wiring layer MN1*b* may include Mo. In some embodiments, the first wiring layer MN1*a* and the second wiring layer MN1*b* may essentially include Mo. According to embodiments, the first wiring layer MN1*a* and the second wiring layer MN1*b* may be manufactured through substantially the same process as the manufacturing process of the first interconnect wiring layer M1*a* and the second interconnect wiring layer M1*b*, respectively.

According to embodiments, similar to the first interconnect wiring layer M1*a* and the second interconnect wiring layer M1*b*, during the deposition process of the first metal and the second metal, some of precursors may remain, the first wiring layer MN1*a* may include the first precursor, and the second wiring layer MN1*b* may include the second precursor.

According to embodiments, the first precursor of the first wiring layer MN1*a* may include oxygen, and the second precursor of the second wiring layer MN1*b* may not include oxygen. For example, the first precursor may include $MoO_2Cl_2$, and the second precursor may include $MoCl_5$. Also, the crystal grain size of the second precursor of the second wiring layer MN1*b* may be greater than the crystal grain size of the first precursor of the first wiring layer MN1*a*. In other words, the average crystal grain size of the second wiring layer MN1*b* may be greater than the average grain size of the first wiring layer MN1*a*. Therefore, the electrical resistance of the second wiring layer MN1*b* may be lower than the electrical resistance of the first wiring layer MN1*a*.

The first wiring layer MN1*a* may have the top surface in contact with the second wiring layer MN1*b* and the bottom surface opposite to the top surface. According to embodiments, as described with respect to the top surface TF of the first wiring layer MN1*a* of FIGS. 1 and 2, the first wiring layer MN1*a* may have a flat top surface. For example, the top surface of the first wiring layer MN1*a* may be a flat surface extending until it contacts the sidewall of the wiring trench MNT in the first horizontal direction X and the second horizontal direction Y. Also, the first interconnect wiring layer M1*a* may have a flat top surface, like the top surface of the first wiring layer MN1*a*. For example, the top surface of the first interconnect wiring layer M1*a* may be a flat surface extending until it contacts the sidewall of the interconnect wiring trench MT in the first horizontal direction X and the second horizontal direction Y.

According to embodiments, as described with respect to the thickness of the first wiring layer MN1*a* in the vertical direction Z of FIGS. 1 and 2, the thickness of the first wiring layer MN1*a* in the vertical direction Z is It may be smaller than the thickness of the second wiring layer MN1*b* in the vertical direction Z. The first wiring layer MN1*a* may have the thickness from about 2 nanometers to about 10 nanometers and may have the thickness of about 3 nanometers.

The contact insulation layer 38 may be disposed on the wiring pattern MN1, and the contact via VA1 penetrating through the contact insulation layer 38 on the wiring pattern MN1 may be electrically connected to the wiring pattern MN1. Therefore, at least one wiring pattern MN1 included in the plurality of front wiring structures FWS may be electrically connected to at least one contact via VA1, at least one wiring pattern MN1 may be electrically connected to a corresponding interconnect wiring pattern M1 through the contact via VA1 electrically connected to the at least one wiring pattern MN1, and the at least one wiring pattern MN1 may be electrically connected to a corresponding source/drain contact via CVA through the contact via VA1 electrically connected to the at least one wiring pattern MN1.

The backside surface 32B of the lower structure 32 may be covered by a backside insulation layer 43. The backside insulation layer 43 may include a silicon oxide film, a silicon nitride film, a silicon carbide film, a low-k film, or a combination thereof. The low-k film may include fluorine-doped silicon oxide, organosilicate glass, carbon-doped oxide, porous silicon oxide, porous organosilicate glass, spin-on organic polymeric dielectric, spin-on silicon based polymeric dielectric, or a combination thereof, but is not limited to the above-stated examples.

The interconnect wiring pattern M1 selected from among the at least one interconnect wiring pattern M1 may be electrically connected to a via power rail VPR disposed below the interconnect wiring pattern M1. The via power rail VPR may extend in the vertical direction Z from the bottom surface of the interconnect wiring pattern M1, penetrate through the source/drain contact insulation layer 34 below the interconnect wiring pattern M1, and penetrate through a portion of the lower structure 32. The sidewalls of the via power rail VPR may be surrounded by insulation spacers ILS.

According to embodiments, the via power rail VPR may include a conductive layer and a conductive barrier layer surrounding the conductive layer. The conductive layer may have a tapered shape in which the widths in the first horizontal direction X and the second horizontal direction Y decrease downward. The conductive layer may include Ru, Co, W, or a combination thereof. The conductive barrier layer may include Ti, TiN, Ta, TaN, or a combination thereof. An insulation spacer ILS may include a silicon oxide film, a silicon oxynitride film, a silicon nitride film, or a combination thereof.

A backside power rail BPW may be disposed below the via power rail VPR. The backside power rail BPW may extend in the vertical direction Z from the bottom surface of the via power rail VPR, penetrate through a portion of the lower structure 32 that is not penetrated by the via power rail VPR, and penetrate through the backside insulation layer 43 disposed on the backside surface 32B of the lower structure 32. According to embodiments, the backside power rail BPW may have a tapered shape in which the width in the second horizontal direction Y decreases upward. At this time, the minimum horizontal width of the backside power rail BPW may be greater than the minimum horizontal width of the via power rail VPR. In other words, the via power rail VPR may cover a portion of the top surface of the backside power rail BPW.

According to embodiments, the backside power rail BPW may have a multi-layered structure including a first backside power conductive layer BPWa covering the bottom surface of the via power rail VPR and a second backside power conductive layer BPWb covering the bottom surface of the first backside power conductive layer BPWa. The first backside power conductive layer BPWa may contact the via power rail VPR. The second backside power conductive layer BPWb may be spaced apart from the via power rail VPR with the first backside power conductive layer BPWa therebetween.

According to embodiments, the first backside power conductive layer BPWa and the second backside power conductive layer BPWb may include substantially the same materials as those described for the first interconnect wiring layer M1*a* and the second interconnect wiring layer M1*b*, respectively. According to embodiments, the first backside power conductive layer BPWa and the second backside power conductive layer BPWb may include the same metal. For example, the first backside power conductive layer BPWa and the second backside power conductive layer BPWb may include Mo. In some embodiments, the first backside power conductive layer BPWa and the second backside power conductive layer BPWb may essentially include Mo. According to embodiments, the first backside power conductive layer BPWa and the second backside power conductive layer BPWb may be manufactured through substantially the same process as the manufacturing process of the first interconnect wiring layer M1*a* and the second interconnect wiring layer M1*b*, respectively.

According to embodiments, similar to the first interconnect wiring layer M1*a* and the second interconnect wiring layer M1*b*, during the deposition process of the first metal and the second metal, some of precursors may remain, the first backside power conductive layer BPWa may include the first precursor, and the second backside power conductive layer BPWb may include the second precursor.

According to embodiments, the first precursor of the first backside power conductive layer BPWa may include oxygen, and the second precursor of the second backside power conductive layer BPWb may not include oxygen. For example, the first precursor may include $MoO_2Cl_2$, and the second precursor may include $MoCl_5$. Also, the crystal grain size of the second precursor of the second backside power conductive layer BPWb may be greater than the crystal grain size of the first precursor of the first backside power conductive layer BPWa. In other words, the average crystal grain size of the second backside power conductive layer BPWb may be greater than the average crystal grain size of the first backside power conductive layer BPWa. Therefore, the electrical resistance of the second backside power conductive layer BPWb may be lower than the electrical resistance of the first backside power conductive layer BPWa.

As shown in FIG. 5, the first backside power conductive layer BPWa may have a bottom surface BF in contact with the second backside power conductive layer BPWb and a top surface opposite to the bottom surface BF. According to embodiments, the first backside power conductive layer BPWa may have the flat bottom surface BF. For example, the bottom surface BF of the first backside power conductive layer BPWa may be a flat surface extending in the first horizontal direction X and the second horizontal direction Y.

According to embodiments, a thickness H3 of the first backside power conductive layer BPWa in the vertical direction Z may be smaller than a thickness H4 of the second backside power conductive layer BPWb in the vertical direction Z. The first backside power conductive layer BPWa may have the thickness H3 from about 2 nanometers to about 10 nanometers and may have the thickness H3 of about 3 nanometers.

On the backside insulation layer 43, a plurality of backside wiring structures BWS electrically connected to the backside power rail BPW may be arranged. The plurality of backside wiring structures BWS may each include a contact insulation layer 44, at least one contact via VA2 penetrating through the contact insulation layer 44, a wiring insulation layer 46 below the contact insulation layer 44, and at least one wiring pattern MN2 penetrating through the wiring insulation layer 46. At least one wiring pattern MN2 may be electrically connected to a selected contact via VA2 from among the at least one contact via VA2.

The contact insulation layer 44 may be disposed below the backside insulation layer 43, and the material constituting the contact insulation layer 44 is substantially identical to the material constituting the source/drain contact insulation layer 34 described above. The backside insulation layer 43 and the contact insulation layer 44 may be penetrated by at least one contact via VA2, and the contact via VA2 may be electrically connected to the backside power rail BPW. The top surface of the contact via VA2 may be in contact with the bottom surface of the backside power rail BPW, and the bottom surface of the contact via VA2 may be in contact with one wiring pattern MN2 selected from among at least one wiring pattern MN2.

The backside power rail BPW may be connected to the one wiring pattern MN2 selected from among the at least one wiring pattern MN2 through the contact via VA2. Like the wiring pattern MN1 described above, the wiring pattern MN2 may have a multi-layered structure including a first wiring layer MN2*a* and a second wiring layer MN2*b* covering the bottom surface of the first wiring layer MN2*a*, and the materials constituting the first wiring layer MN2*a* and the second wiring layer MN2*b* are substantially identical to the materials constituting the first interconnect wiring layer M1*a* and the second interconnect wiring layer M1*b* described above. The wiring pattern MN2 may be surrounded by the wiring insulation layer 46 when viewed from above, and the material constituting the wiring insulation layer 46 is substantially identical to the material constituting the interconnect wiring insulation layer 36 described above.

According to example embodiments, the backside power rail BPW may have a multi-layered structure including the first backside power conductive layer BPWa and the second backside power conductive layer BPWb, the second backside power conductive layer BPWb has a relatively larger crystal grain size than the first backside power conductive layer BPWa, and the second backside power conductive layer BPWb does not include oxygen. Therefore, an integrated circuit device including the backside power rail BPW having a low electrical resistance may be provided.

Figure 6:
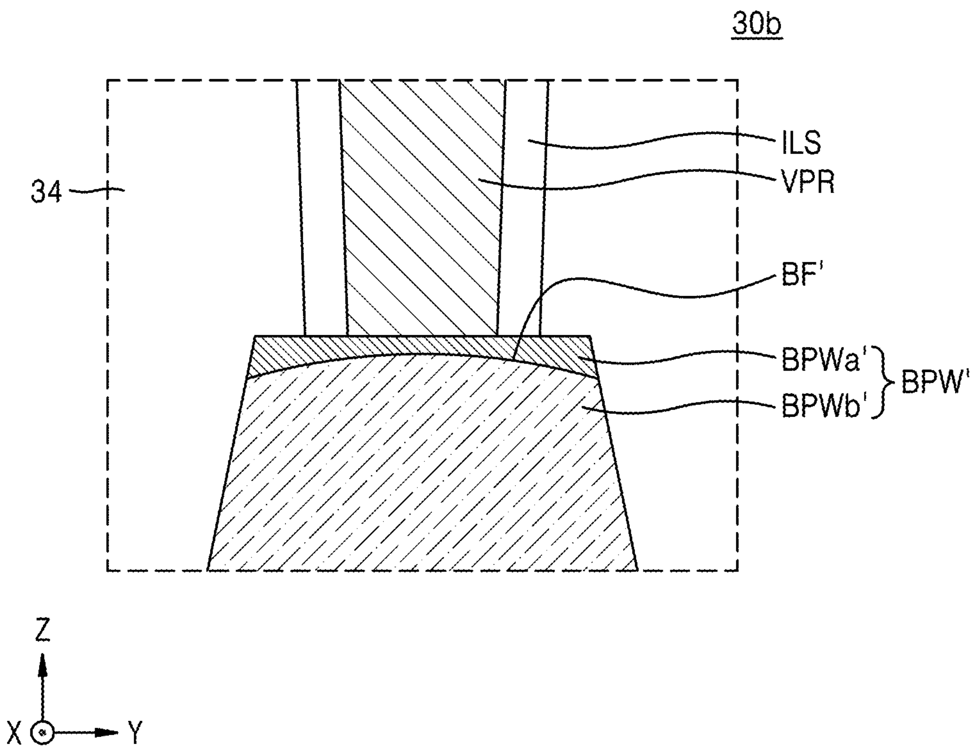
FIG. 6 is a diagram for describing an integrated circuit device according to other embodiments.

FIG. 6 is a diagram for describing an integrated circuit device 30*b* according to embodiments. FIG. 6 shows a portion corresponding to a region "EX2" of FIG. 4B. Since the integrated circuit device 30*b* is configured in a generally similar manner to the above-described integrated circuit device 30*a*, descriptions below will focus on the differences between the integrated circuit device 30*a* and the integrated circuit device 30*b*.

Referring to FIG. 6, the integrated circuit device 30*b* may include the lower structure 32, the via power rail VPR penetrating through a portion of the lower structure 32, the insulation spacers ILS surrounding the sidewall of the via power rail VPR, and a backside power rail BPW' disposed below the via power rail VPR.

According to embodiments, the backside power rail BPW' may have a multi-layered structure including a first backside power conductive layer BPWa' and a second backside power conductive layer BPWb' covering the bottom surface of the first backside power conductive layer BPWa'. The first backside power conductive layer BPWa' may contact the via power rail VPR. The second backside power conductive layer BPWb' may be spaced apart from the via power rail VPR with the first backside power conductive layer BPWa' therebetween.

As shown in FIG. 6, the first backside power conductive layer BPWa' may have a bottom surface BF' in contact with the second backside power conductive layer BPWb and a top surface opposite to the bottom surface BF'. According to embodiments, the first backside power conductive layer BPWa' may have the bottom surface BF' that is concave toward the top of the first backside power conductive layer BPWa'. The edge portion of the first backside power conductive layer BPWa' may have a thickness greater than the thickness of the center portion of the first backside power conductive layer BPWa' in the vertical direction Z. The minimum thickness of the center portion of the first backside power conductive layer BPWa' in the vertical direction Z may be from about 2 nanometers to about 4 nanometers, and the maximum thickness of the edge portion of the first backside power conductive layer BPWa' in the vertical direction Z may be from about 4 nanometers to about 10 nanometers.

Figure 7:
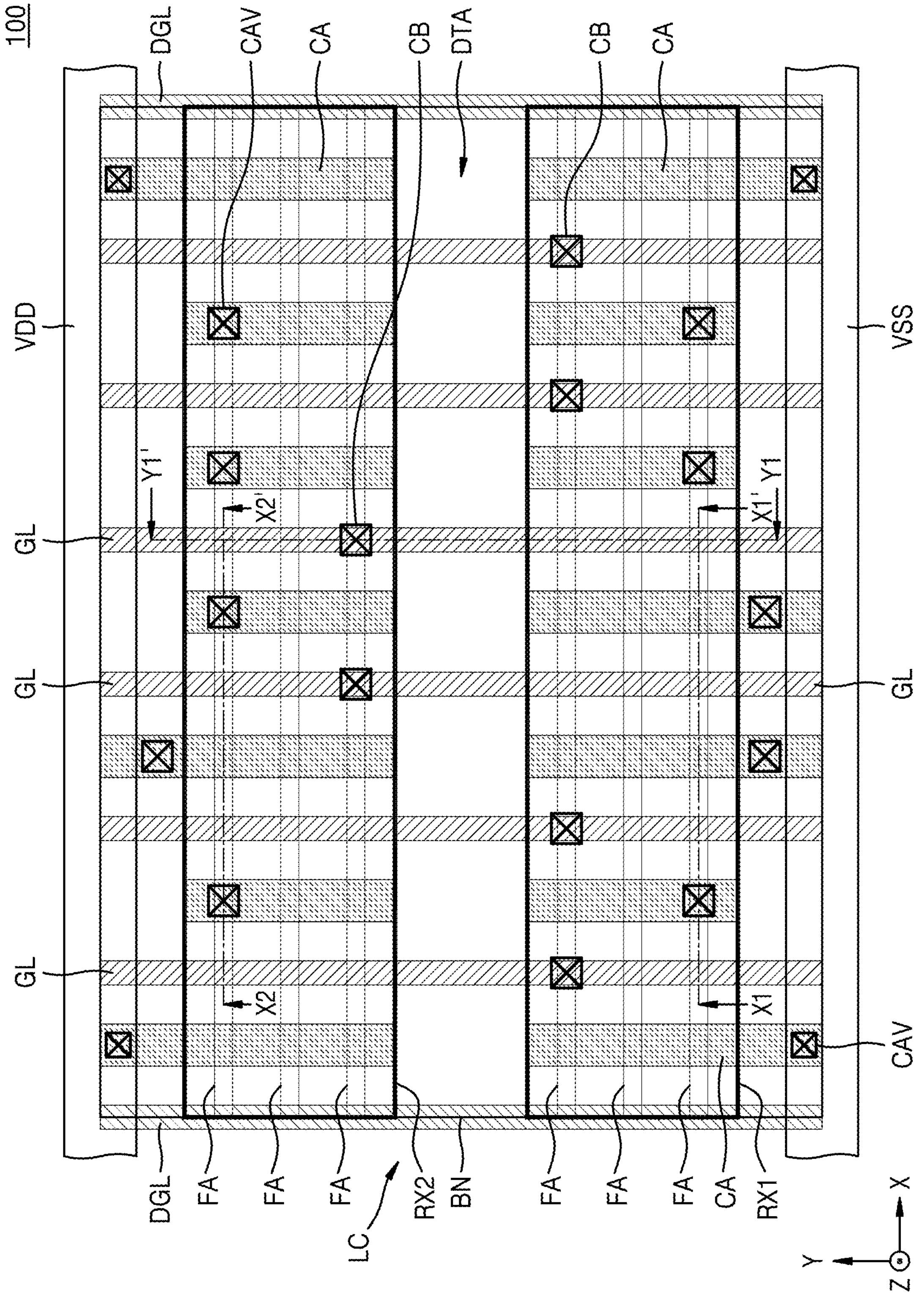
FIG. 7 is a diagram for describing an integrated circuit device according to embodiments.
Figure 8A:
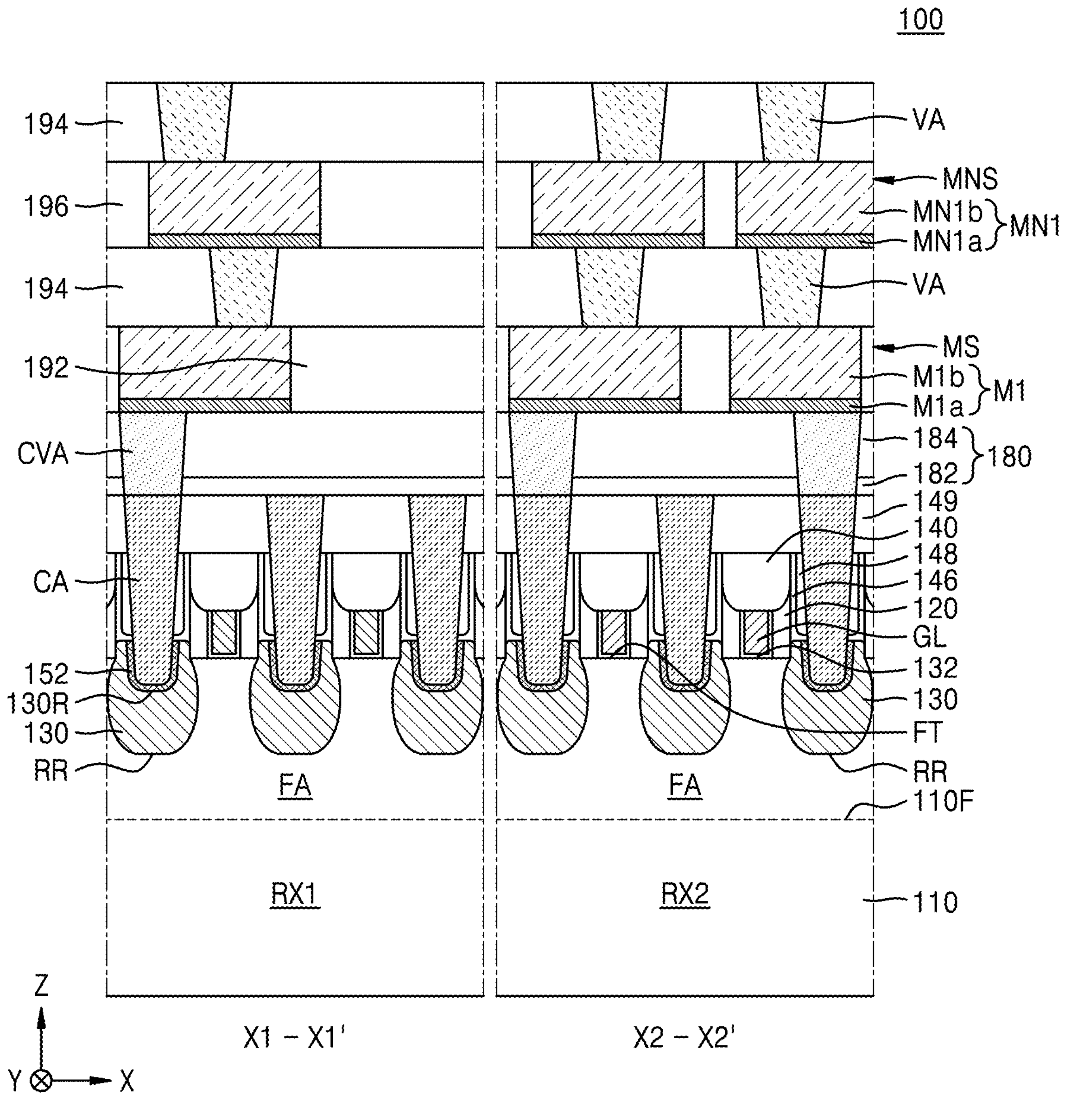
FIG. 8A is a diagram showing partial configurations of cross-sections taken along lines X1-X1' and X2-X2' of FIG. 7.
Figure 8B:
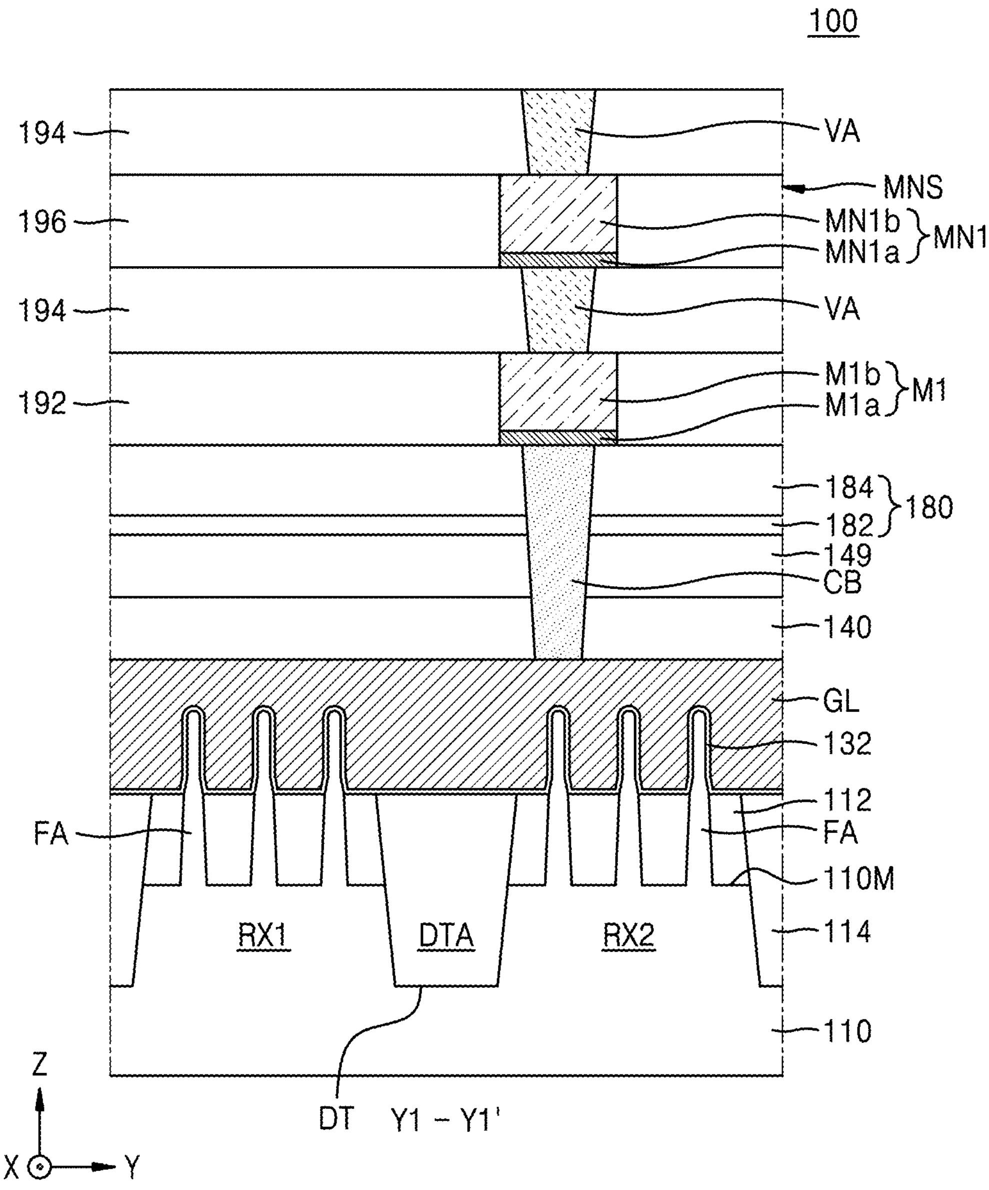
FIG. 8B is a diagram showing a partial configuration of a cross-section taken along a line Y1-Y1' of FIG. 7.

FIG. 7 is a diagram for describing an integrated circuit device 100 according to embodiments. FIG. 8A is a cross-sectional view of a partial configuration of a cross-section taken along a line X1-X1' and a line X2-X2' of FIG. 7 and FIG. 8B is a cross-sectional view of a partial configuration of a cross-section taken along a line Y1-Y1' of FIG. 7.

Hereinafter, the integrated circuit device 100 including a fin field-effect transistor (FinFET) device will be described with reference to FIGS. 7 and 8A and 8B. For example, the integrated circuit device 100 may be an integrated circuit device in which the lower structure 12 includes a FinFET device, from among embodiments that may be included in the integrated circuit device 10*a* described in FIGS. 1 and 2.

The integrated circuit device 100 may include a logic cell LC formed in a region defined by a cell boundary BN on a substrate 110.

The substrate 110 may have a frontside surface 110F extending in horizontal directions (X-Y plane-wise direction). The substrate 110 may include a semiconductor like Si or Ge or a compound semiconductor like SiGe, SiC, GaAs, InAs, or InP. The substrate 110 may include a conductive region, e.g., a well doped with an impurity or a structure doped with an impurity.

The logic cell LC may include a first device region RX1 and a second device region RX2. A plurality of fin-type active regions FA protruding from the substrate 110 may be arranged in the first device region RX1 and the second device region RX2. The plurality of fin-type active regions FA may extend parallel to one another in a width-wise direction of the logic cell LC, that is, a first horizontal direction X.

As shown in FIG. 8B, in the first device region RX1 and the second device region RX2, a device isolation layer 112 may be disposed on the substrate 110. The device isolation layer 112 may be disposed between the plurality of fin-type active regions FA and may cover lower sidewalls of the plurality of fin-type active regions FA. In the first device region RX1 and the second device region RX2, the fin-type active regions FA may protrude above the device isolation layer 112 in fin-like shapes. An inter-device isolation region DTA may be disposed between the first device region RX1 and the second device region RX2. In the inter-device isolation region DTA, a deep trench DT defining the first device region RX1 and the second device region RX2 is formed, and the deep trench DT may be filled with an inter-device isolating insulation layer 114. The device isolation layer 112 and the inter-device isolating insulation layer 114 may each include an oxide film.

On the substrate 110, a plurality of gate insulation layers 132 and a plurality of gate lines GL may extend in the height wise direction of the logic cell LC crossing the plurality of fin-type active regions FA (e.g., the second horizontal direction Y). The gate insulation layers 132 and the gate lines GL may cover the top surface and both sidewalls of each of the fin-type active regions FA, the top surface of the device isolation layer 112, and the top surface of the inter-device isolating insulation layer 114.

A plurality of MOS transistors may be formed along the plurality of gate lines GL in the first device region RX1 and the second device region RX2. The MOS transistors may each be a MOS transistors having a 3-dimensional structure in which channels are formed on top surfaces and both sidewalls of the fin-type active regions FA, respectively. In example embodiments, the first device region RX1 may be an NMOS transistor region, and a plurality of NMOS transistors may be formed in portions of the first device region RX1 where the fin-type active regions FA and the gate lines GL intersect each other. The second device region RX2 may be a PMOS transistor region, and a plurality of PMOS transistors may be formed in portions of the second device region RX2 where the fin-type active regions FA and the gate lines GL intersect each other.

A dummy gate line DGL may extend along a portion of the cell boundary BN extending in the second horizontal direction Y. The dummy gate line DGL may include the same material as the plurality of gate lines GL. The dummy gate line DGL may maintain an electrically floated state during the operation of the integrated circuit device 100, and thus the dummy gate line DGL may function as an electrical isolation region between the logic cell LC and other logic cells around the logic cell LC. The plurality of gate lines GL and a plurality of dummy gate lines DGL may have the same width in the first horizontal direction X and may be arranged at a constant pitch in the first horizontal direction X.

The gate insulation layers 132 may include silicon oxide films, high-k films, or a combination thereof. The high-k layer may include a material having a higher dielectric constant than that of a silicon oxide layer. The high-k layer may include a metal oxide or a metal oxynitride. An interfacial layer (not shown) may be interposed between the fin-type active region FA and a gate insulation layer 132. The interfacial layer may include an oxide film, a nitride film, or an oxynitride film.

The plurality of gate lines GL and the plurality of dummy gate lines DGL may each have a structure in which a metal nitride layer, a metal layer, a conductive capping layer, and a gap-fill metal layer are sequentially stacked. The metal nitride layer and the metal layer may include at least one metal selected from among titanium (Ti), tantalum (Ta), tungsten (W), ruthenium (Ru), niobium (Nb), Mo, and hafnium (Hf). The gap-fill metal layer may include a W layer or an Al layer. The gate lines GL and the dummy gate lines DGL may each include a work function metal-containing layer. The work function metal-containing layer may include at least one metal selected from among Ti, W, Ru, Nb, Mo, Hf, nickel (Ni), Co, platinum (Pt), ytterbium (Yb), terbium (Tb), dysprosium (Dy), erbium (Er), and palladium (Pd). In example embodiments, the plurality of gate lines GL and the plurality of dummy gate lines DGL may each have a stacked structure of TiAlC/TiN/W, a stacked structure of TiN/TaN/TiAlC/TiN/W, or a stacked structure of TiN/TaN/TiN/TiAlC/TiN/W, but inventive concepts are not limited thereto.

A plurality of insulation spacers 120 may cover both sidewalls of the plurality of gate lines GL and the plurality of dummy gate lines DGL. The plurality of gate lines GL, the plurality of dummy gate lines DGL, the plurality of gate insulation layers 132, and the plurality of insulation spacers 120 may be covered by an insulation capping line 140. The insulation capping line 140 and the plurality of insulation spacers 120 may each extend in a line-like shape in the second horizontal direction Y.

The insulation spacers 120 may each include silicon nitride (SiN), SiCN, SiBN, SION, SiOCN, SiBCN, or a combination thereof, but is not limited thereto. A plurality of insulation capping lines 140 may include SiN. The terms "SiN", "SiCN", "SiBN", "SION", "SiOCN", and "SiBCN" as used herein refer to a material composed of elements included in each term and is not a formula representing a stoichiometric relationship.

A plurality of recess regions RR may be formed in the top surfaces of the plurality of fin-type active regions FA. The plurality of gate lines GL may be arranged adjacent to one recess region RR and may include a pair of gate lines GL spaced apart from each other with the one recess region RR therebetween. A plurality of source/drain regions 130 may be respectively arranged in the plurality of recess regions RR. At least some of the source/drain regions 130 from among the source/drain regions 130 may be interposed between the pair of gate lines GL. The gate line GL and a source/drain region 130 may be spaced apart from each other with the gate insulation layer 132 and the insulation spacer 120 therebetween.

The plurality of source/drain regions 130 may include epitaxial semiconductor layers epitaxially grown from the plurality of recess regions RR. For example, the plurality of source/drain regions 130 may include an epitaxially grown Si layer, an epitaxially grown SiC layer, or a plurality of epitaxially grown SiGe layers. When the first device region RX1 is an NMOS transistor region and the second device region RX2 is a PMOS transistor region, the plurality of source/drain regions 130 in the first device region RX1 may include a Si layer doped with an n-type dopant or a SiC layer doped with an n-type dopant and the plurality of source/drain regions 130 in the second device region RX2 may include a SiGe layer doped with a p-type dopant. The n-type dopant may be selected from among phosphorus (P), arsenic As), and antimony (Sb). The p-type dopant may be selected from between boron (B) and gallium (Ga).

According to embodiments, the plurality of source/drain regions 130 in the first device region RX1 and the plurality of source/drain regions 130 in the second device region RX2 may have different shapes and sizes.

Each of the plurality of source/drain regions 130 may have a recess surface 130R on the top surface thereof. A plurality of metal silicide layers 152 may be arranged on the plurality of source/drain regions 130 along the recess surfaces 130R of the plurality of source/drain regions 130. The plurality of metal silicide layers 152 may cover the top surfaces of the source/drain regions 130. Each of the plurality of source/drain regions 130 and each of the plurality of metal silicide layers 152 may constitute a conductive region.

According to embodiments, the plurality of metal silicide layers 152 may each include Ti, W, Ru, Nb, Mo, Hf, Ni, Co, Pt, Yb, Tb, Dy, Er, Pd, or a combination thereof. For example, the metal silicide layer 152 may include titanium silicide, but is not limited thereto.

An insulation liner 146 and an inter-gate insulation layer 148 may be sequentially arranged on the plurality of source/drain regions 130 and the plurality of metal silicide layers 152. The insulation liner 146 and the inter-gate insulation layer 148 may constitute a lower insulation structure. According to embodiments, the insulation liner 146 may include silicon nitride (SiN), SiCN, SiBN, SION, SIOCN, SiBCN, or a combination thereof but is not limited thereto. The inter-gate insulation layer 148 may include a silicon oxide film but is not limited thereto.

A plurality of source/drain contacts CA may each be configured to penetrate through the inter-gate insulation layer 148 and the insulation liner 146 in the vertical direction Z and be connected to the source/drain region 130 through the metal silicide layer 152. The source/drain contacts CA may be spaced apart from the gate lines GL in the first horizontal direction X with the insulation spacers 120 therebetween. The source/drain regions 130 may each be connected to the interconnect wiring pattern M1 thereabove through the metal silicide layer 152 and the source/drain contact CA.

The source/drain contact CA may penetrate through the inter-gate insulation layer 148 and the insulation liner 146 and extend long in the vertical direction Z. The bottom surface and the lower sidewall of the source/drain contact CA may be in contact with the metal silicide layer 152, and the upper sidewall of the source/drain contact CA may be in contact with the lower insulation structure including the insulation liner 146 and the inter-gate insulation layer 148.

According to embodiments, the source/drain contact CA may include, but is not limited to, Mo, Cu, W, Co, Ru, Mn, Ti, Ta, and Al or a combination thereof. According to embodiments, the source/drain contact CA and the metal silicide layer 152 may include elements different from each other. According to other embodiments, the source/drain contact CA and the metal silicide layer 152 may include the same elements.

The integrated circuit device 100 may include an insulation layer 149 covering the top surface of each of the plurality of source/drain contacts CA and the top surface of each of the plurality of insulation capping lines 140. The plurality of source/drain contacts CA may each be disposed in a source/drain contact hole CAH penetrating through the insulation layer 149 in the vertical direction Z. The upper sidewall of a conductive plug 156 included in each of the plurality of source/drain contacts CA may contact the insulation layer 149. The insulation layer 149 may constitute an intermediate insulation structure. According to embodiments, the insulation layer 149 may include a silicon oxide film but is not limited thereto.

As shown in FIGS. 8A and 8B, top surfaces of the insulation layer 149 and the plurality of source/drain contacts CA may be covered by an upper insulation structure 180. The upper insulation structure 180 may include an etch stop layer 182 and a source/drain contact insulation layer 184 sequentially stacked on the plurality of source/drain contacts CA and the insulation layer 149. The etch stop layer 182 may include silicon carbide (SIC), SiN, nitrogen-doped silicon carbide (SiC:N), SiOC, AlN, AlON, AlO, AlOC, or a combination thereof. The source/drain contact insulation layer 184 may include an oxide film, a nitride film, an ultra-low k (ULK) film having an ultra-low dielectric constant K from about 2.2 to about 2.4, or a combination thereof. For example, the source/drain contact insulation layer 184 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. According to embodiments, the source/drain contact insulation layer 184 may include a first source/drain contact insulation layer and a second source/drain contact insulation layer located on top of the first source/drain contact insulation layer, as described above with reference to FIG. 1, and the materials constituting the first source/drain contact insulation layer and the second source/drain contact insulation layer may be substantially identical to the materials constituting the first source/drain contact insulation layer and the second source/drain contact insulation layer described above with reference to FIG. 1.

As shown in FIGS. 7 and 8A, a plurality of source/drain contact vias CVA may be arranged on the plurality of source/drain contacts CA. The plurality of source/drain contact vias CVA may penetrate through the upper insulation structure 180 and contact the plurality of source/drain contacts CA, respectively. According to embodiments, the bottom surface of each of the plurality of source/drain contact vias CVA may contact the top surface of one source/drain contact CA selected from among the plurality of source/drain contacts CA.

According to embodiments, the plurality of source/drain contact vias CVA may include contact plugs including Mo, Cu, W, Co, Ru, Mn, Ti, Ta, Al, or a combination thereof, but materials constituting the contact plug are not limited to the above-stated examples. According to embodiments, the plurality of source/drain contact vias CVA may further include a conductive barrier pattern surrounding a portion of the contact plugs. The conductive barrier pattern included in the plurality of source/drain contact vias CVA may include a metal or a metal nitride. For example, the conductive barrier pattern may include Ti, Ta, W, TiN, TaN, WN, WCN, TiSiN, TaSiN, WSiN, or a combination thereof but is not limited thereto.

According to embodiments, the plurality of source/drain contact vias CVA may include Mo, Cu, W, Co, Ru, Mn, Ti, Ta, Al, or a combination thereof. According to embodiments, the bottom surface of each of the plurality of source/drain contact vias CVA may contact the top surface of one source/drain contact CA selected from among the plurality of source/drain contacts CA.

As shown in FIGS. 7 and 8B, a plurality of gate contacts CB may be arranged on the plurality of gate lines GL. The plurality of gate contacts CB may penetrate through the upper insulation structure 180, the insulation layer 149, and the insulation capping line 140 and contact the top surfaces of the gate line GL. The plurality of gate lines GL may be connected to the interconnect wiring pattern M1 thereabove through the gate contacts CB. The detailed configuration of the gate contact CB is substantially identical to that described for the source/drain contact CA.

As shown in FIGS. 7, 8A, and 8B, a plurality of interconnect wiring patterns M1 may be arranged on the plurality of source/drain contact vias CVA and the plurality of gate contacts CB, and the plurality of wiring structures MNS may be arranged on the interconnect wiring pattern M1. The plurality of wiring structures MNS may include a plurality of wiring patterns MN1 and a plurality of contact vias VA arranged below the plurality of wiring patterns MN1. The plurality of contact vias VA may be arranged between the plurality of interconnect wiring patterns M1 and the plurality of wiring patterns MN1 and may electrically interconnect any one interconnect wiring pattern M1 selected from among the plurality of interconnect wiring patterns M1 and a wiring pattern MN1 corresponding thereto. Also, the plurality of contact vias VA may be arranged between the plurality of wiring patterns MN1 and the plurality of wiring patterns MN1 located at different levels in the vertical direction Z and electrically interconnect any one wiring pattern MN1 selected from among the plurality of wiring patterns MN1 and a wiring pattern MN1, which corresponds thereto and is located at a different level in the vertical direction Z.

Similar to the integrated circuit device 10*a* described with reference to FIGS. 1 and 2, the plurality of interconnect wiring patterns M1 may have a multi-layered structure including the first interconnect wiring layer M1*a* and the second interconnect wiring layer M1*b*, and the plurality of wiring patterns MN1 may have a multi-layered structure including the first wiring layer MN1*a* and the second wiring layer MN1*b*. Detailed configurations and effects of the first interconnect wiring layer M1*a* and the second interconnect wiring layer M1, and detailed configurations and effects of the first interconnect wiring layer MN1*a* and the second wiring layer MN1*b* are substantially identical to those described above for the first interconnect wiring layer M1*a* and the second interconnect wiring layer M1*b* or the first wiring layer MN1*a* and the second wiring layer MN1*b* with reference to FIGS. 1 and 2.

The plurality of interconnect wiring patterns M1 may be surrounded an interconnect wiring insulation layer 192 when viewed from above, and the plurality of contact vias VA may be surrounded by a contact insulation layer 194 when viewed from above, and the plurality of wiring pattern MN1 may be surrounded by a wiring insulation layer 196 when viewed from above. According to embodiments, the interconnect wiring insulation layer 192 may include an oxide film, a nitride film, an ultra-low k (ULK) film having an ultra-low dielectric constant k from about 2.2 to about 2.4, or a combination thereof. For example, the interconnect wiring insulation layer 192 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The detailed configuration of the contact insulation layer 194 is substantially identical to that described for the source/drain contact insulation layer 184. Also, the detailed configuration of the wiring insulation layer 196 is substantially identical to that described for the interconnect wiring insulation layer 192.

As shown in FIG. 7, in the logic cell LC, a ground line VSS may be connected to the fin-type active region FA in the first device region RX1 through the source/drain contact CA in the first device region RX1 from among the source/drain contacts CA, and a power line VDD may be connected to the fin-type active region FA in the second device region RX2 through the source/drain contact CA in the second device region RX2 from among the source/drain contacts CA. The ground line VSS and the power line VDD may be formed at a level higher than those of the top surfaces of the source/drain contacts CA and the gate contacts CB.

According to embodiments, the ground line VSS and the power line VDD may include a conductive barrier pattern and a conductive layer for wiring, respectively. The conductive barrier pattern and the conductive layer for wiring, which respectively constitute the ground line VSS and the power line VDD, may have substantially the same configuration as the second interconnect wiring layer M1*b* and the first interconnect wiring layer M1*a* constituting the interconnect wiring pattern M1 and may have substantially the same configuration as the second wiring layer MN1*b* and the first wiring layer MN1*a* constituting the wiring pattern MN1.

Figure 9:
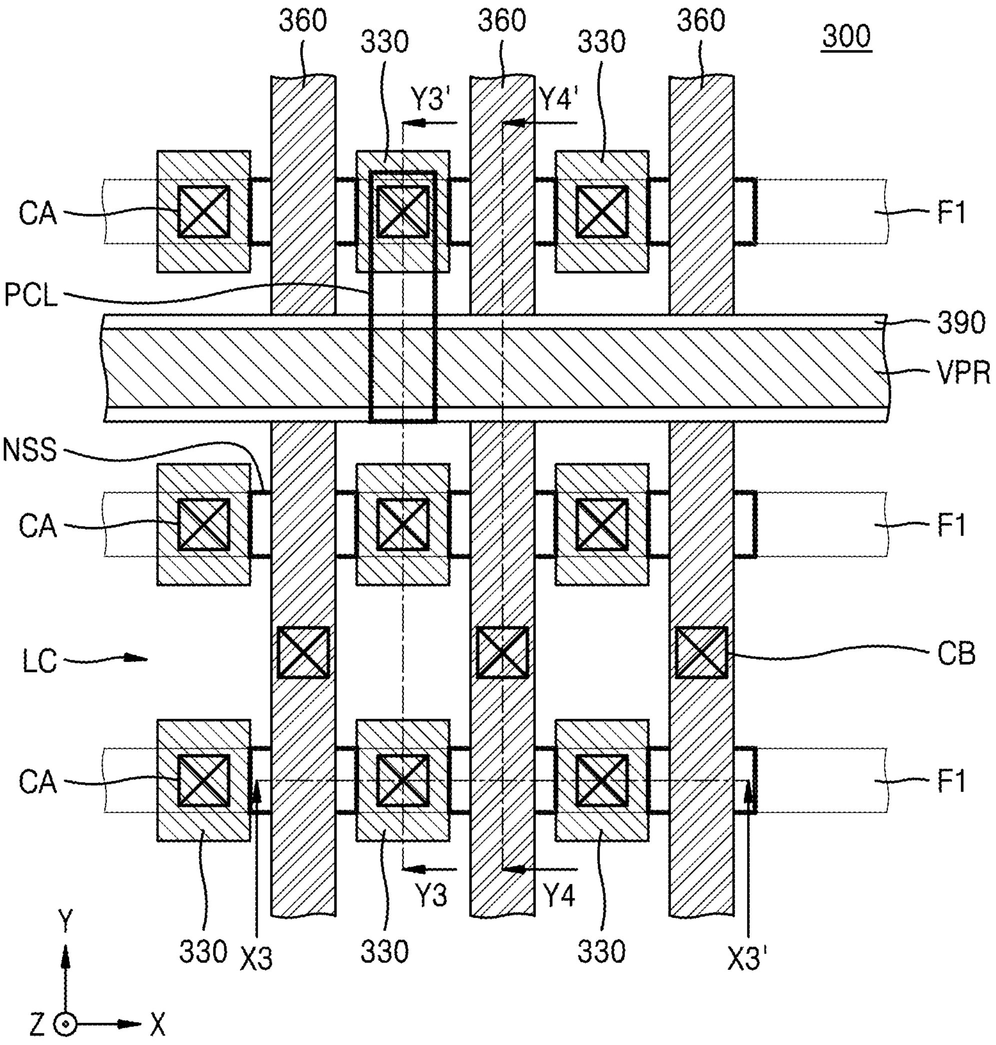
FIG. 9 is a diagram for describing an integrated circuit device according to embodiments.
Figure 10A:
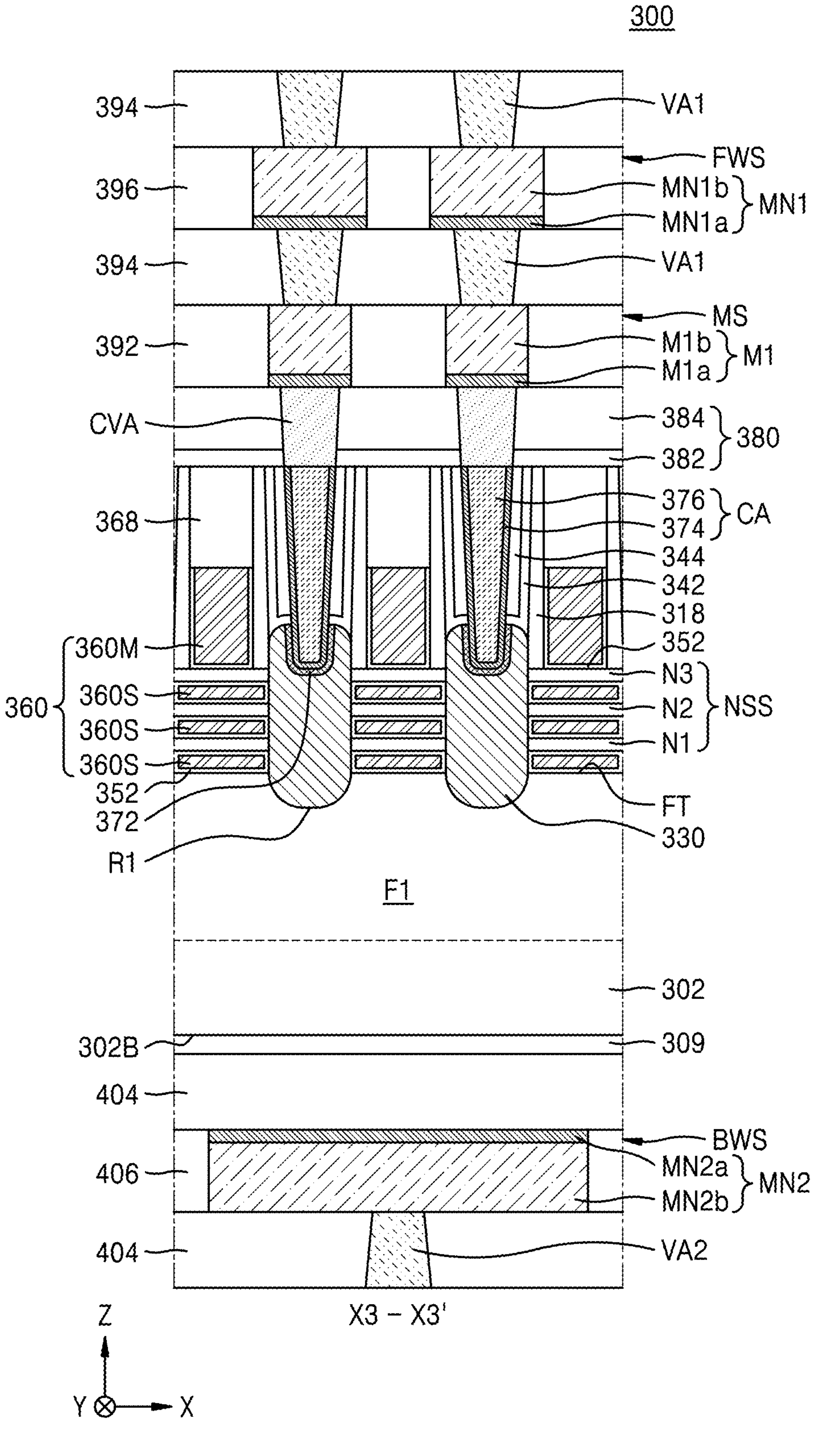
FIG. 10A is a cross-sectional view taken along a line X1-X1' of FIG. 9.
Figure 10B:
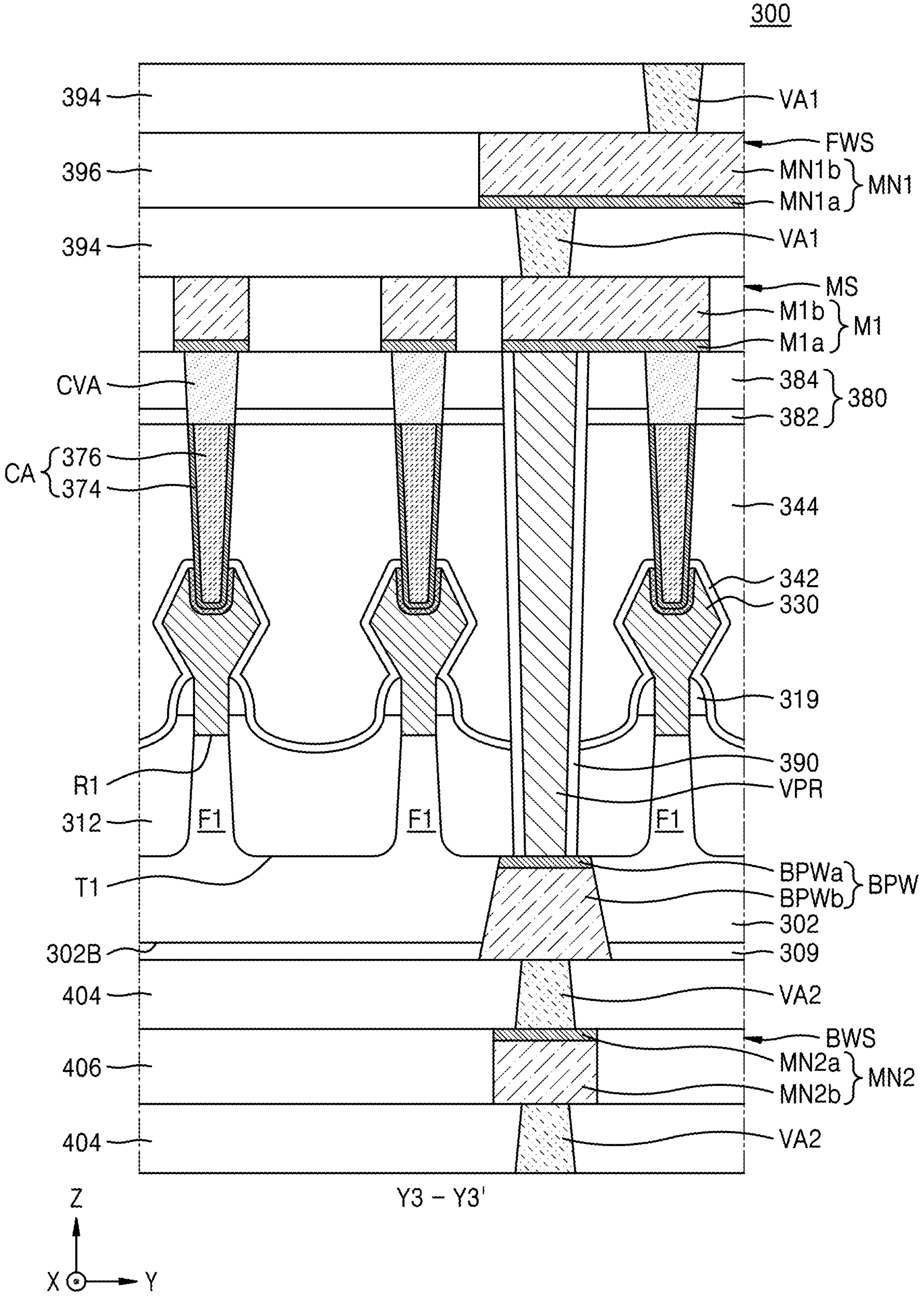
FIG. 10B is a cross-sectional view taken along a line Y1-Y1' of FIG. 9.
Figure 10C:
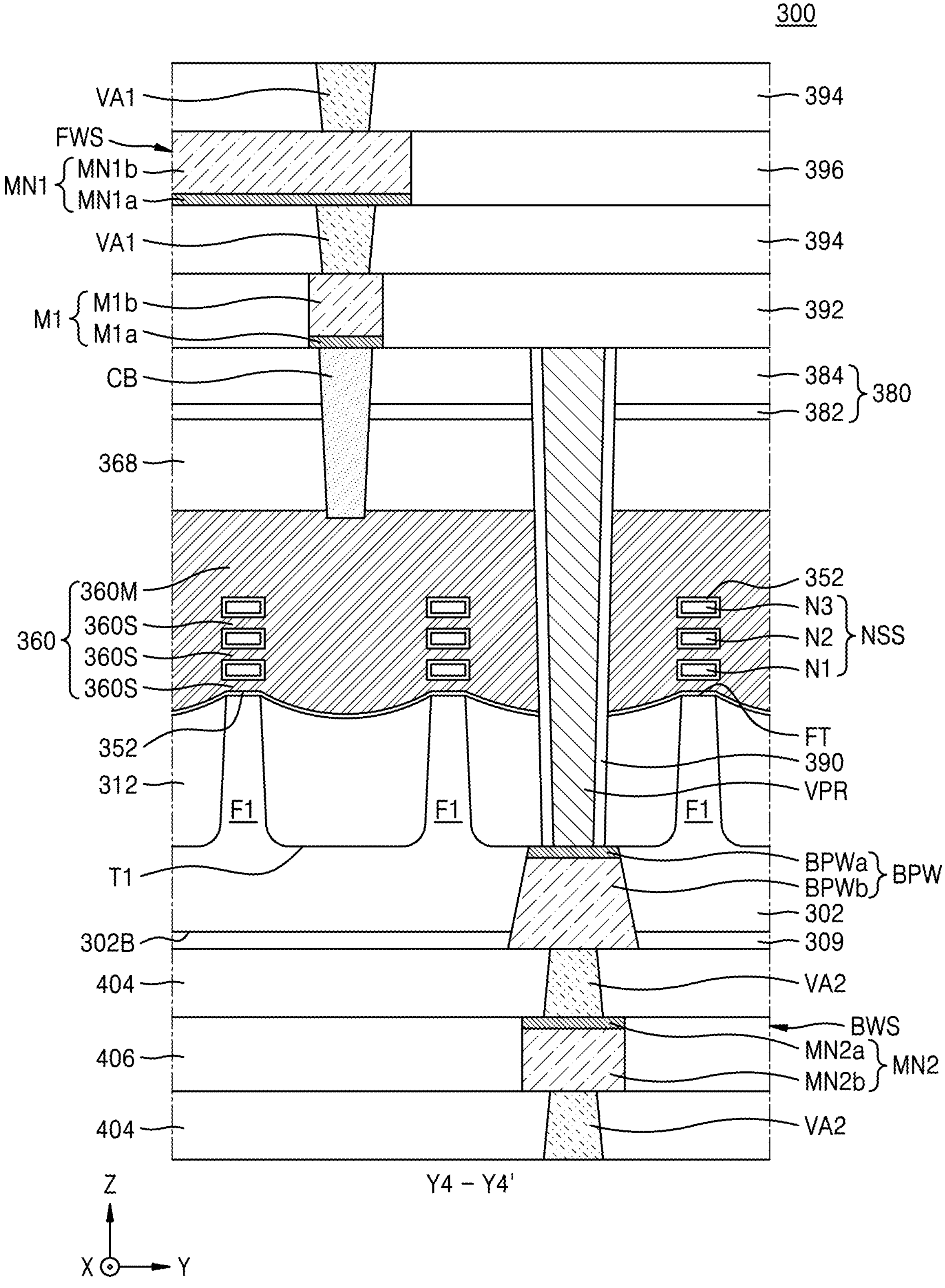
FIG. 10C is a cross-sectional view taken along a line Y2-Y2' of FIG. 9.

FIG. 9 is a diagram for describing an integrated circuit device 300 according to embodiments. FIG. 10A is a cross-sectional view taken along a line'X3-X3' of FIG. 9, FIG. 10B is a cross-sectional view taken along a line'Y3-Y3' of FIG. 9, and FIG. 10C is a cross-sectional view taken along a line'Y4-Y4' of FIG. 9.

Hereinafter, with reference to FIGS. 9, 10A, 10B, and 10C, the integrated circuit device 300 including a field-effect transistor having a gate-all-around structure, which includes an active region in the shape of a nano-wire or a nano-sheet and a gate surrounding the active region, will be described. From among the embodiments that may be included in the integrated circuit device 30*a* described with reference to FIGS. 4A, 4B, and 5, the integrated circuit device 300 may be an integrated circuit device including a field-effect transistor in which the lower structure 32 has a gate-all-around structure including an active region in the shape of a nano-wire or a nano-sheet and a gate surrounding the active region. The integrated circuit device 300 may include two logic cells LC that are adjacent to each other in the second horizontal direction Y with the via power rail VPR therebetween. According to embodiments, the via power rail VPR may constitute the ground line VSS shown in FIG. 9.

The integrated circuit device 300 may include a substrate 302 having a backside surface 302B and a plurality of fin-type active regions F1 protruding from a surface of the substrate 302 opposite to the backside surface 302B to define a plurality of trench regions T1. The plurality of fin-type active regions F1 may extend long in the first horizontal direction X on the substrate 302 and may extend parallel to each other.

The substrate 302 may include a semiconductor like Si or Ge or a compound semiconductor like SiGe, SiC, GaAs, InAs, InGaAs, or InP. The terms "SiGe", "SiC", "GaAs", "InAS", "InGaAs", and "InP" as used herein refer to a material composed of elements included in each term and is not a formula representing a stoichiometric relationship. The substrate 302 may include a conductive region, e.g., a well doped with an impurity or a structure doped with an impurity.

A device isolation layer 312 may be disposed in the trench regions T1 defining the plurality of fin-type active regions F1. The device isolation layer 312 may cover a portion of the sidewall of each of the plurality of fin-type active regions F1 in the plurality of trench regions T1. The device isolation film 312 may include a silicon oxide film, but is not limited thereto.

As shown in FIGS. 10B and 10C, the via power rail VPR may extend in the vertical direction Z between a pair of fin-type active regions F1, which are selected from among the plurality of fin-type active regions F1 and are adjacent to each other, and between a pair of source/drain regions 330 arranged on the pair of fin-type active regions F1. The via power rail VPR may penetrate through the device isolation layer 312 in the vertical direction Z.

The sidewall of the via power rail VPR may be surrounded by insulation spacers 390. According to embodiments, the via power rail VPR may include a conductive layer and a conductive barrier layer surrounding the conductive layer. The conductive layer may include Ru, Co, W, or a combination thereof. The conductive barrier layer may include Ti, TiN, Ta, TaN, or a combination thereof. The insulation spacers 390 may include a silicon oxide film, a silicon oxynitride film, a silicon nitride film, or a combination thereof.

The backside surface 302B of the substrate 302 may be covered by a backside insulation layer 309. The backside insulation layer 309 may include a silicon oxide film, a silicon nitride film, a silicon carbide film, a low-k film, or a combination thereof. The low-k film may include fluorine-doped silicon oxide, organosilicate glass, carbon-doped oxide, porous silicon oxide, porous organosilicate glass, spin-on organic polymeric dielectric, spin-on silicon based polymeric dielectric, or a combination thereof, but is not limited to the above-stated examples.

The substrate 302 may include the backside power rail BPW that penetrates through the substrate 302 in the vertical direction Z at a position at which the backside power rail BPW overlaps the via power rail VPR in the vertical direction Z. The backside power rail BPW may penetrate through the substrate 302 in the vertical direction Z at a position at which the backside power rail BPW overlaps the via power rail VPR in the vertical direction Z and may be connected to an end of the via power rail VPR. The top surface of the backside power rail BPW facing the device isolation layer 312 and the bottom surface of the via power rail VPR facing the substrate 302 may be in contact with each other. According to embodiments, the backside power rail BPW may have a tapered shape in which the width in the second horizontal direction Y decreases downward. At this time, the minimum horizontal width of the backside power rail BPW may be greater than the minimum horizontal width of the via power rail VPR. In other words, the via power rail VPR may cover a portion of the top surface of the backside power rail BPW.

According to embodiments, the backside power rail BPW may have a multi-layered structure including a first backside power conductive layer BPWa covering the bottom surface of the via power rail VPR and a second backside power conductive layer BPWb covering the bottom surface of the first backside power conductive layer BPWa. Detailed configurations and effects of the first backside power conductive layer BPWa and the second backside power conductive layer BPWb are substantially identical to those of the first backside power conductive layer BPWa and the second backside power conductive layer BPWb described above with reference to FIGS. 4A, 4B, and 5. The backside power rail BPW may be spaced apart from a pair of fin-type active regions F1 on both sides of the via power rail VPR with the substrate 302 therebetween.

As shown in FIGS. 9, 10A, 10B, and 10C, a plurality of gate lines 360 may be arranged on the plurality of fin-type active regions F1. The plurality of gate lines 360 may each extend long in a second horizontal direction Y intersecting with the first horizontal direction X. In regions where the plurality of fin-type active regions F1 and the plurality of gate lines 360 intersect with each other, the plurality of nano-sheet stacks NSS may be arranged over the fin top surfaces FT of the plurality of fin-type active regions F1, respectively. The plurality of nano-sheet stacks NSS may each include at least one nano-sheet facing the fin top surface FT at a position spaced apart from the fin top surface FT of the fin-type active region F1 in the vertical direction Z. The term "nano-sheet" as used herein refers to a conductive structure having a cross-section substantially perpendicular to a direction in which an electric current flows. It should be understood that a nano-sheet includes nano-wires.

The plurality of nano-sheet stacks NSS may include a first nano-sheet N1, a second nano-sheet N2, and a third nano-sheet N3, which overlap one another in the vertical direction Z above the fin-type active region F1. The first nano-sheet N1, the second nano-sheet N2, and the third nano-sheet N3 may be apart from the fin top surface FT of the fin-type active region F1 by different vertical distances (distances in the Z direction). The plurality of gate lines 360 may surround the first nano-sheet N1, the second nano-sheet N2, and the third nano-sheet N3 included in the nano-sheet stacks NSS which overlaps one another in the vertical direction Z.

Although FIG. 9 shows a case in which the planar shape of the nano-sheet stack NSS is substantially rectangular, but inventive concepts are not limited thereto. The nano-sheet stack NSS may have various planar shapes according to the planar shapes of the fin-type active regions F1 and the gate lines 360. The present embodiment shows a configuration in which the nano-sheet stacks NSS and the gate lines 360 are arranged on one fin-type active region F1, and the nano-sheet stacks NSS are arranged in a line in the first horizontal direction X on the one fin-type active region F1. However, the number of nano-sheet stacks NSS and the number of gate lines 360 arranged on one fin-type active region F1 are not particularly limited.

The first nano-sheet N1, the second nano-sheet N2, and the third nano-sheet N3 included in the nano-sheet stack NSS may each function as a channel region. According to embodiments, the first nano-sheet N1, the second nano-sheet N2, and the third nano-sheet N3 may each have a thickness selected within a range from about 4 nm to about 6 nm but are not limited thereto. Here, the thickness of each of the first nano-sheet N1, the second nano-sheet N2, and the third nano-sheet N3 refers to a size in the vertical direction Z. According to embodiments, the first nano-sheet N1, the second nano-sheet N2, and the third nano-sheet N3 may have substantially the same thickness in the vertical direction Z. According to other embodiments, at least some of the first nano-sheet N1, the second nano-sheet N2, and the third nano-sheet N3 may have different thicknesses in the vertical direction Z. According to embodiments, the first nano-sheet N1, the second nano-sheet N2, and the third nano-sheet N3 included in the nano-sheet stack NSS may each include a Si layer, a SiGe layer, or a combination thereof.

As shown in FIG. 10A, the first nano-sheet N1, the second nano-sheet N2, and the third nano-sheet N3 included in one nano-sheet stack NSS may have the same size or sizes similar to one another in the first horizontal direction X. According to other embodiments, unlike as shown in FIG. 3A, at least some of the first nano-sheet N1, the second nano-sheet N2, and the third nano-sheet N3 included in one nano-sheet stack NSS may have different sizes in the first horizontal direction X. Although the present embodiment may be a non-limiting example where one nano-sheet stack NSS includes three nano-sheets, inventive concepts are not limited thereto. For example, the nano-sheet stack NSS may include at least one nano-sheet, and the number of nano-sheets constituting the nano-sheet stack NSS is not particularly limited.

As shown in FIGS. 10A, 10B, and 10C, the plurality of gate lines 360 may each include a main gate portion 360M and a plurality of sub-gate portions 360S. The main gate portion 360M may cover the top surface of the nano-sheet stack NSS and extend long in the second horizontal direction Y. The plurality of sub-gate portions 360S may be integrally connected to the main gate portion 360M and may each be disposed between the first nano-sheet N1, the second nano-sheet N2, and the third nano-sheet N3 and between the first nano-sheet N1 and the fin-type active region F1. In the vertical direction Z, the thickness of each of the plurality of sub-gate portions 360S may be less than that of the main gate portion 360M.

A plurality of recesses R1 may be formed on the fin-type active region F1. The vertical level of the lowermost surface of each of the plurality of recesses R1 may be lower than the vertical level of the fin top surface FT of the fin-type active region F1.

The plurality of source/drain regions 330 may be respectively arranged in the plurality of recesses R1. The plurality of source/drain regions 330 may each be disposed adjacent to at least one gate line 360 selected from among the plurality of gate lines 360. The plurality of source/drain regions 330 may have surfaces facing the first nano-sheet N1, the second nano-sheet N2, and the third nano-sheet N3 included in the adjacent nano-sheet stack NSS, respectively. The plurality of source/drain regions 330 may contact the first nano-sheet N1, the second nano-sheet N2, and the third nano-sheet N3 included in the adjacent nano-sheet stack NSS, respectively.

The plurality of gate lines 360 may each include a metal, a metal nitride, a metal carbide, or a combination thereof. The metal may be selected from among Ti, W, Ru, Nb, Mo, Hf, Ni, Co, Pt, Yb, Tb, Dy, Er, and Pd. The metal nitride may be selected from TiN and TaN. The metal carbide may be TiAlC. However, the materials constituting the plurality of gate lines 360 are not limited to the examples above.

A gate dielectric layer 352 may be disposed between the nano-sheet stack NSS and the gate line 360. According to embodiments, the gate dielectric layer 352 may include a stacked structure of an interfacial dielectric layer and a high-k layer. The interfacial dielectric layer may include a low-k material layer having a dielectric constant of about 9 or less, e.g., a silicon oxide layer, a silicon oxynitride layer, or a combination thereof. According to embodiments, the interfacial dielectric layer may be omitted. The high-k layer may include a material having a higher dielectric constant than that of a silicon oxide layer. For example, the high-k layer may have a dielectric constant from about 10 to about 25. The high-k layer may include hafnium oxide but is not limited thereto.

The top surfaces of the gate dielectric layer 352 and the gate line 360 may be covered by a capping insulation pattern 368. The capping insulation pattern 368 may include a silicon nitride layer. Both sidewalls of each of the gate line 360 and the capping insulation pattern 368 may be covered by an outer insulation spacer 318. The outer insulation spacer 318 may cover both sidewalls of the main gate portion 360M on top surfaces of the plurality of nano-sheet stacks NSS. The outer insulation spacer 318 may be spaced apart from the gate line 360 with the gate dielectric layer 352 therebetween.

As shown in FIG. 10B, a plurality of recess side insulation spacers 319 may be arranged on the top surface of the device isolation layer 312 to cover the sidewall of a source/drain region 330. According to embodiments, the plurality of recess side insulation spacers 319 may each be integrally connected to the outer insulation spacer 318 adjacent thereto.

The plurality of outer insulation spacers 318 and the plurality of recess side insulation spacers 319 may each include silicon nitride, silicon oxide, SiCN, SiBN, SION, SiOCN, SiBCN, SiOC, or a combination thereof. The terms “SiCN”, “SiBN”, “SiON”, “SiOCN”, “SiBCN”, and “SiOC” as used herein refer to a material composed of elements included in each term and is not a formula representing a stoichiometric relationship.

A metal silicide layer 372 may be formed on the top surface of each of the plurality of source/drain regions 330. The metal silicide layer 372 may include a metal including Ti, W, Ru, Nb, Mo, Hf, Ni, Co, Pt, Yb, Tb, Dy, Er, or Pd. For example, the metal silicide layer 372 may include titanium silicide, but is not limited thereto.

On the substrate 302, the plurality of source/drain regions 330, a plurality of metal silicide layers 372, and a plurality of outer insulation spacers 318 may be covered by an insulation liner 342. According to embodiments, the insulation liner 342 may be omitted. An inter-gate insulation layer 344 may be disposed on the insulation liner 342. When the insulation liner 342 is omitted, the inter-gate insulation layer 344 may contact the plurality of source/drain regions 330. According to embodiments, the insulation liner 342 may include SiN, SiCN, SiBN, SiON, SiOCN, SiBCN, or a combination thereof but is not limited thereto. The inter-gate insulation layer 344 may include a silicon oxide film but is not limited thereto.

Both sidewalls of each of the plurality of sub-gate portions 360S included in the plurality of gate lines 360 may be spaced apart from the source/drain region 330 with the gate dielectric layer 352 therebetween. The gate dielectric layer 352 may be disposed between a sub-gate portion 360S included in the gate line 360 and each of the first nano-sheet N1, the second nano-sheet N2, and the third nano-sheet N3 and between the sub-gate portions 360S included in the gate line 360 and the source/drain region 330.

The nano-sheet stacks NSS are arranged on the fin top surfaces FT of the fin-type active regions F1 in regions where the fin-type active regions F1 and the gate lines 360 intersect each other and may face the fin top surfaces FT of the fin-type active regions F1 at locations spaced apart from the fin-type active regions F1. A plurality of nano-sheet transistors may be formed on the substrate 302 at the intersections between the fin-type active regions F1 and the gate lines 360.

As shown in FIGS. 10A and 10B, the plurality of source/drain contacts CA may be arranged on the plurality of source/drain regions 330. The plurality of source/drain contacts CA may each penetrate through the inter-gate insulation layer 344 and the insulation liner 342 in the vertical direction Z and contact the metal silicide layer 372. The plurality of source/drain contacts CA may be configured to be electrically connectable to the source/drain regions 330 through the metal silicide layer 372. The plurality of source/drain contacts CA may each be spaced apart from the main gate portion 360M in the first horizontal direction X with the outer insulation spacer 318 therebetween.

The plurality of source/drain contacts CA may include a conductive barrier pattern 374 and a contact plug 376 sequentially stacked on the source/drain region 330. The conductive barrier pattern 374 may surround the bottom surface and the sidewall of the contact plug 376 and may be in contact with the bottom surface and the sidewall of the contact plug 376. The plurality of source/drain contacts CA may each penetrate through the inter-gate insulation layer 344 and the insulation liner 342 and extend long in the vertical direction Z. The conductive barrier pattern 374 may be disposed between the metal silicide layer 372 and the contact plug 376. The conductive barrier pattern 374 may have a surface contacting the metal silicide layer 372 and a surface contacting the contact plug 376. According to embodiments, the conductive barrier pattern 374 may include a metal or a metal nitride. For example, the conductive barrier pattern 374 may include Ti, Ta, W, TiN, TaN, WN, WCN, TiSiN, TaSiN, WSiN, or a combination thereof but is not limited thereto. The contact plug 376 may include Mo, copper (Cu), W, cobalt (Co), Ru, manganese (Mn), Ti, Ta, aluminum (Al), a combination thereof, or an alloy thereof, but is not limited thereto.

As shown in FIG. 10B, from among the plurality of source/drain contacts CA, the source/drain contact CA adjacent to the via power rail VPR may be spaced apart from the via power rail VPR in the second horizontal direction Y.

As shown in FIGS. 10A and 10B, the top surfaces of the plurality of source/drain contacts CA, a plurality of capping insulation patterns 368, and the inter-gate insulation layer 344 may be covered by an upper insulation structure 380. The upper insulation structure 380 may include an etch stop layer 382 and a source/drain contact insulation layer 384 sequentially stacked on each of the plurality of source/drain contacts CA, the plurality of capping insulation patterns 368, and the inter-gate insulation layer 344. The etch stop layer 382 may include silicon carbide (SiC), SiN, nitrogen-doped silicon carbide (SiC:N), SiOC, AlN, AlON, AlO, AlOC, or a combination thereof. The source/drain contact insulation layer 384 may include an oxide film, a nitride film, an ultra-low k (ULK) film having an ultra-low dielectric constant K from about 2.2 to about 2.4, or a combination thereof. For example, the source/drain contact insulation layer 384 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The source/drain contact insulation layer 384 may include a first source/drain contact insulation layer and a second source/drain contact insulation layer located on top of the first source/drain contact insulation layer, as described above for the source/drain contact insulation layer 34 of FIGS. 4A and 4B, and the materials constituting the first source/drain contact insulation layer and the second source/drain contact insulation layer may be substantially identical to the materials constituting the first source/drain contact insulation layer and the second source/drain contact insulation layer described above with reference to FIGS. 4A and 4B.

As shown in FIGS. 10A and 10B, a plurality of source/drain contact vias CVA may be arranged on the plurality of source/drain contacts CA. The plurality of source/drain contact vias CVA may penetrate through the upper insulation structure 380 and contact the plurality of source/drain contacts CA, respectively. According to embodiments, the bottom surface of each of the plurality of source/drain contact vias CVA may contact the top surface of one source/drain contact CA selected from among the plurality of source/drain contacts CA.

According to embodiments, the plurality of source/drain contact vias CVA may include contact plugs including Mo, Cu, W, Co, Ru, Mn, Ti, Ta, Al, or a combination thereof, but materials constituting the contact plug are not limited to the above-stated examples. According to embodiments, the plurality of source/drain contact vias CVA may further include a conductive barrier pattern surrounding a portion of the contact plugs. The conductive barrier pattern included in the plurality of source/drain contact vias CVA may include a metal or a metal nitride. For example, the conductive barrier pattern may include Ti, Ta, W, TiN, TaN, WN, WCN, TiSiN, TaSiN, WSiN, or a combination thereof but is not limited thereto.

As shown in FIG. 10C, the gate contact CB may be disposed on the gate line 360. The gate contact CB may be configured to penetrate through the upper insulation structure 380 and the capping insulation pattern 368 in the vertical direction Z and be connected to the gate line 360. The bottom surface of the gate contact CB may contact the top surface of the gate line 360. The plurality of gate lines 360 may be connected to the interconnect wiring pattern M1 thereabove through the gate contacts CB. The detailed configuration of the gate contact CB is substantially identical to that described for the source/drain contact CA.

The via power rail VPR and the insulation spacers 390 may penetrate through the upper insulation structure 380, the capping insulation pattern 368, the gate line 360, the inter-gate insulation layer 344, the insulation liner 342, and the device isolation layer 312 in the vertical direction Z. The portion of the gate line 360 through which the via power rail VPR and the insulation spacers 390 penetrate in the vertical direction Z may be a region between a pair of nano-sheet stacks NSS adjacent to each other from among the plurality of nano-sheet stacks NSS. The via power rail VPR may be spaced apart from the gate line 360 in a horizontal direction, e.g., the second horizontal direction Y, with the insulation spacer 390 therebetween. The via power rail VPR and the insulation spacer 390 may be spaced apart from the plurality of source/drain regions 330 in a horizontal direction, e.g., the second horizontal direction Y.

As shown in FIGS. 10A, 10B, and 10C, the plurality of interconnect wiring patterns M1 may be arranged on the plurality of source/drain contact vias CVA and the plurality of gate contacts CB, and the plurality of front wiring structures FWS may be arranged on the interconnect wiring pattern M1. The plurality of front wiring structures FWS may include a plurality of wiring patterns MN1 and a plurality of contact vias VA arranged below the plurality of wiring patterns MN1. The plurality of contact vias VA may be arranged between the plurality of interconnect wiring patterns M1 and the plurality of wiring patterns MN1 and may electrically interconnect any one interconnect wiring pattern M1 selected from among the plurality of interconnect wiring patterns M1 and a wiring pattern MN1 corresponding thereto. Also, the plurality of contact vias VA may be arranged between the plurality of wiring patterns MN1 and the plurality of wiring patterns MN1 located at different levels in the vertical direction Z and electrically interconnect any one wiring pattern MN1 selected from among the plurality of wiring patterns MN1 and a wiring pattern MN1, which corresponds thereto and is located at a different level in the vertical direction Z.

Similar to the integrated circuit device 30*a* described with reference to FIGS. 4A, 4B, and 5, the plurality of interconnect wiring patterns M1 may have a multi-layered structure including the first interconnect wiring layer M1*a* and the second interconnect wiring layer M1*b*, and the plurality of wiring patterns MN1 may have a multi-layered structure including the first wiring layer MN1*a* and the second wiring layer MN1*b*. Detailed configurations and effects of the first interconnect wiring layer M1*a* and the second interconnect wiring layer M1*b* are substantially identical to those of the first interconnect wiring layer M1*a* and the second interconnect wiring layer M1*b* described above with reference to FIGS. 4A, 4B, and 5, and detailed configurations and effects of the first wiring layer MN1*a* and the second wiring layer MN1*b* are substantially identical to those of the first wiring layer MN1*a* and the second wiring layer MN1*b* described above with reference to FIGS. 4A, 4B, and 5.

The plurality of interconnect wiring patterns M1 may be surrounded an interconnect wiring insulation layer 392 when viewed from above, and the plurality of contact vias VA may be surrounded by a contact insulation layer 394 when viewed from above, and the plurality of wiring pattern MN1 may be surrounded by a wiring insulation layer 396 when viewed from above. According to embodiments, the interconnect wiring insulation layer 392 may include an oxide film, a nitride film, an ultra-low k (ULK) film having an ultra-low dielectric constant k from about 2.2 to about 2.4, or a combination thereof. For example, the interconnect wiring insulation layer 392 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The detailed configuration of the contact insulation layer 394 is substantially identical to that described for the source/drain contact insulation layer 384. Also, the detailed configuration of the wiring insulation layer 396 is substantially identical to that described for the interconnect wiring insulation layer 392.

A contact insulation layer 404 may be disposed below the backside insulation layer 309, and the material constituting the contact insulation layer 404 is substantially identical to the material constituting the drain contact insulation layer 394 described above. The backside insulation layer 309 and the contact insulation layer 404 may be penetrated by at least one contact via VA2, and the contact via VA2 selected from among the at least one contact via VA2 may be electrically connected to the backside power rail BPW. The top surface of the contact via VA2 selected from among the at least one contact via VA2 may be in contact with the bottom surface of the backside power rail BPW, and the bottom surface of the contact via VA2 selected from among the at least one contact via VA2 may be in contact with the wiring pattern MN2.

The backside power rail BPW may be connected to the wiring pattern MN2 through the contact via VA2. Like the above-described wiring pattern MN1, the wiring pattern MN2 may have a multi-layered structure including the first wiring layer MN2*a* and the second wiring layer MN2*b*, and detailed configurations and effects of the first wiring layer MN2*a* and the second wiring layer MN2*b* are substantially identical to those of the first interconnect wiring layer M1*a* and the second interconnect wiring layer M1*b* described above. The wiring pattern MN2 may be surrounded by a wiring insulation layer 406 when viewed from above, and the material constituting the wiring insulation layer 406 is substantially identical to the material constituting the wiring insulation layer 396 described above.

FIGS. 11 to 15 are cross-sectional views of a method of manufacturing an integrated circuit device 10*a* according to embodiments, according to a process sequence.

Figure 11:
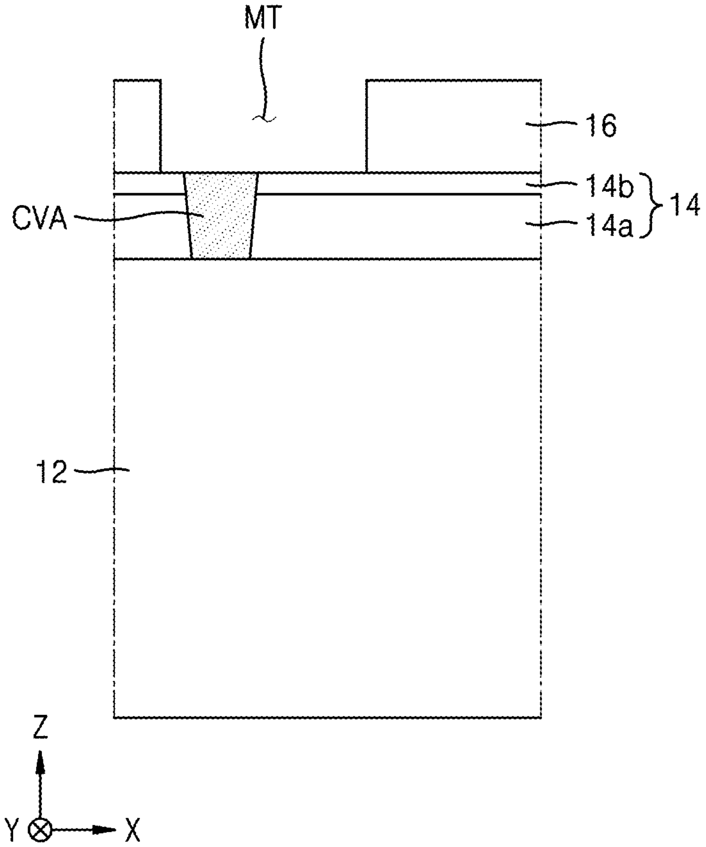
FIGS. 11 to 15 are cross-sectional views of a method of manufacturing a wiring structure according to embodiments, according to a process sequence.

Referring to FIG. 11, the source/drain contact insulation layer 14 may be formed on the lower structure 12. To form the source/drain contact insulation layer 14, the first source/drain contact insulation layer 14*a* and the second source/drain contact insulation layer 14*b* may be sequentially formed on the lower structure 12. The second source/drain contact insulation layer 14*b* may serve as an etch stop layer of the first source/drain contact insulation layer 14*a*. According to embodiments, the first source/drain contact insulation layer 14*a* may include an insulation material such as an oxide or silicon oxide. For example, the first source/drain contact insulation layer 14*a* may include an oxide film, a nitride film, an ultra-low k (ULK) film having an ultra-low dielectric constant k from about 2.2 to about 2.4, or a combination thereof. For example, the first source/drain contact insulation layer 14*a* may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, but is not limited thereto. The second source/drain contact insulation layer 14*b* may include a material having a different etch selectivity from that of the first source/drain contact insulation layer 14*a* and may include an insulation material such as a nitride or silicon nitride. For example, the second source/drain contact insulation layer 14*b* may include silicon carbide (SIC), SiN, nitrogen-doped silicon carbide (SiC:N), SiOC, AlN, AlON, AlO, AlOC, or a combination thereof.

Thereafter, after a contact hole (not shown) penetrating through the source/drain contact insulation layer 14 is formed, the contact hole (not shown) may be filled with a first conductive material constituting a contact plug, thereby forming the source/drain contact via CVA. The first conductive material may include Mo, Cu, W, Co, Ru, Mn, Ti, Ta, Al, or a combination thereof. Alternatively, the source/drain contact via CVA may be formed by filling the contact hole (not shown) with the first conductive material constituting a contact plug and a second conductive material constituting a conductive barrier pattern surrounding a portion of the contact plug. The second conductive material may include Ti, Ta, W, TIN, TaN, WN, WCN, TiSiN, TaSiN, WSiN, or a combination thereof. The contact hole may expose the top surface of a source/drain contact (not shown) connected to a source/drain region (not shown) in the lower structure 12 or a gate contact (not shown) connected to a gate electrode (not shown) in the lower structure 12, such that the source/drain contact via CVA is electrically connected to the source/drain region (not shown) or the gate electrode (not shown) in the lower structure 12.

Thereafter, the interconnect wiring insulation layer 16 covering the source/drain contact via CVA may be disposed. Thereafter, a portion of the interconnect wiring insulation layer 16 may be removed to form the interconnect wiring trench MT, and the top surface of the source/drain contact via CVA and a portion of the top surface of the source/drain contact insulation layer 14 may be exposed through the interconnect wiring trench MT.

Figure 12:
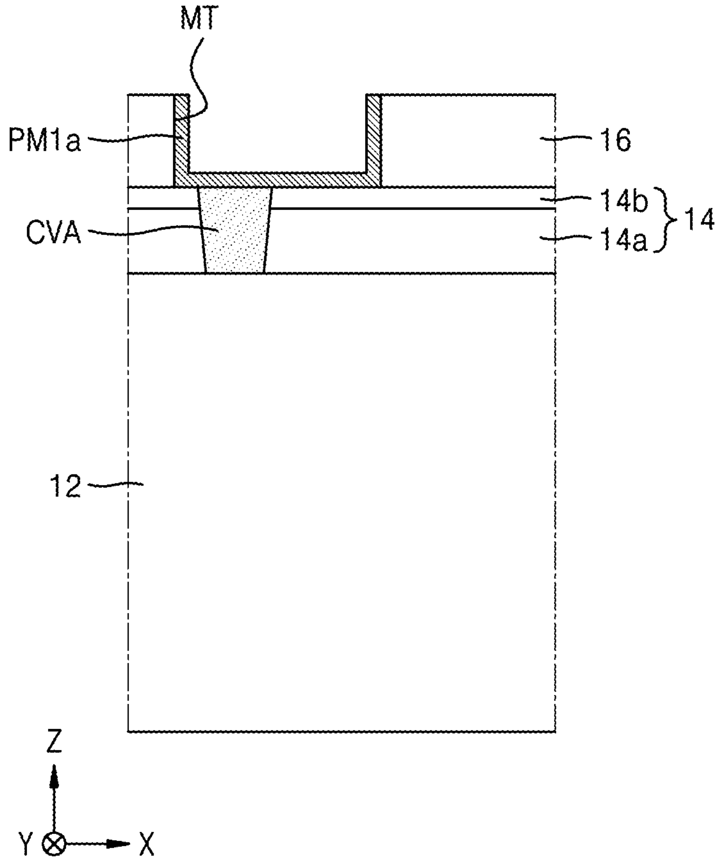

Referring to FIG. 12, a preliminary first interconnect wiring layer PM1*a* may be formed on a result structure of FIG. 11. At this time, the preliminary first interconnect wiring layer PM1*a* may conformally extend along the inner wall of the interconnect wiring trench MT.

To form the preliminary first interconnect wiring layer PM1*a*, a process for depositing a first metal may be performed. The first metal may include Mo. A precursor used in the deposition process of the first metal may include the first metal, e.g., molybdenum halide. The precursor may include, for example, molybdenum oxychloride or $MoO_2Cl_2$.

In the deposition process of the first metal, the interconnect wiring trench MT may be exposed to the precursor, such that the precursor is deposited along the inner wall of the interconnect wiring trench MT through chemical vapor deposition (CVD) or atomic layer deposition (ALD). Thereafter, the first metal may be deposited on the precursor through CVD or ALD.

In the deposition process of the first metal, a process of removing residues other than the first metal from the precursor may be included. The process of removing the residues other than the first metal may include a process using heat or plasma and may include a purge process of pumping with an inert gas. At this time, the remainder of the precursor other than the first metal may not be completely removed and some of the remainder may remain. As described above, a remaining part of the residue of the precursor may be referred to as a first precursor.

Figure 13:
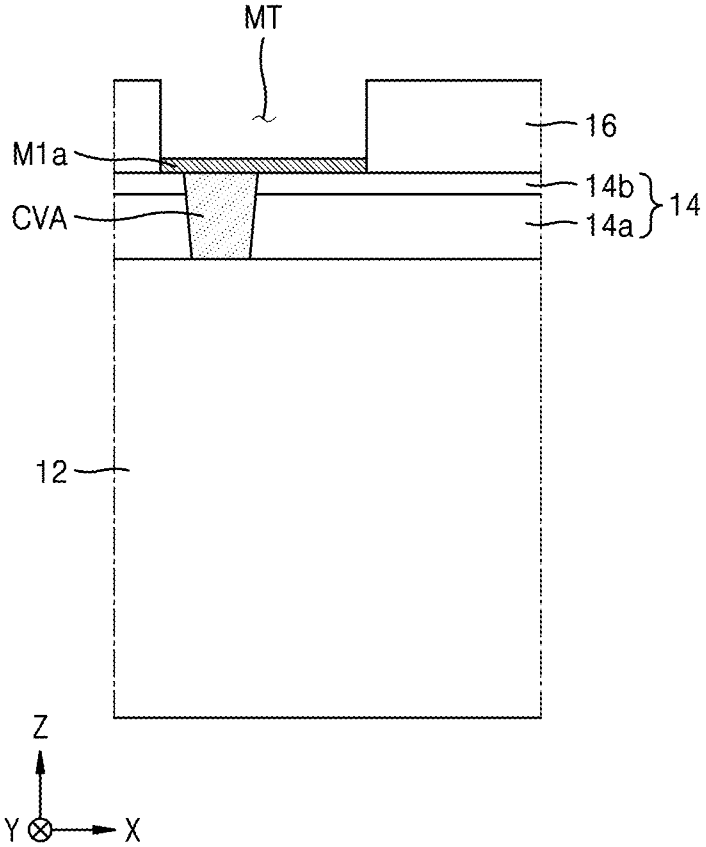

Referring to FIG. 13, a portion of the preliminary first interconnect wiring layer PM1*a* extending along the sidewall of the interconnect wiring trench MT may be partially removed to form the first interconnect wiring layer M1*a* including a portion of the preliminary first interconnect wiring layer PM1*a* covering the bottom of the interconnect wiring trench MT.

The process of removing a portion of the preliminary first interconnect wiring layer PM1*a* may be performed through an etch back process. The etch back process may include a dry etch back process, a wet etch back process, or a combination thereof. The etch back process may be performed, such that the first interconnect wiring layer M1*a* has a thickness from about 2 nanometers to about 10 nanometers in the vertical direction Z.

Figure 14:
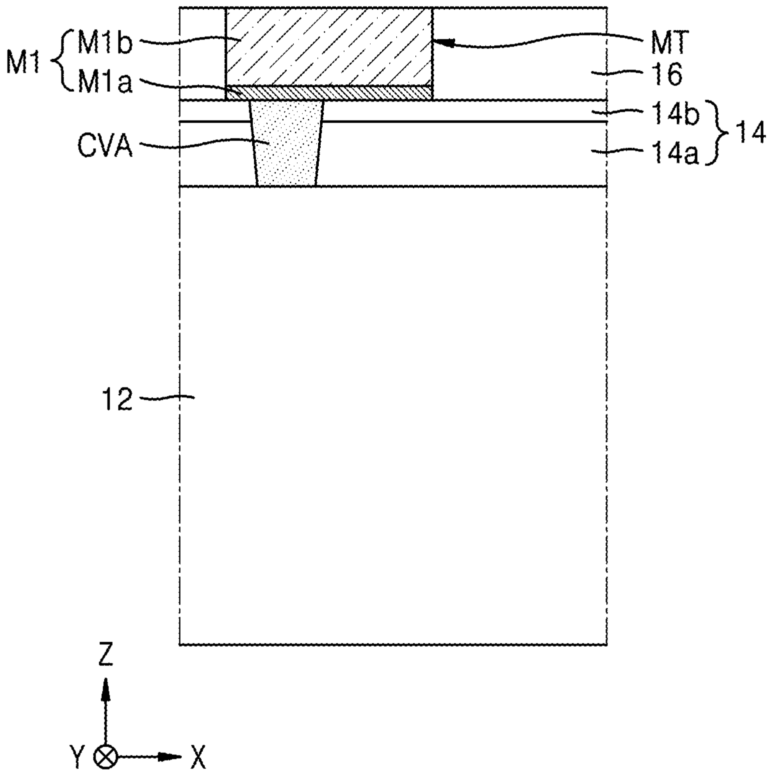

Referring to FIG. 14, the second interconnect wiring layer M1*b* may be formed on the first interconnect wiring layer M1*a*. To form the second interconnect wiring layer M1*b*, a process for depositing a second metal may be performed. The second metal may include Mo. A precursor used in the deposition process of the second metal may include the second metal, e.g., molybdenum halide. The precursor may include, for example, molybdenum chloride or $MoCl_5$.

In the deposition process of the second metal, the interconnect wiring trench MT having formed thereon the first interconnect wiring layer M1*a* may be exposed to the precursor to deposit the precursor on the top surface of the first interconnect wiring layer M1*a* through CVD or ALD, and the second metal may be deposited on the precursor through CVD or ALD. At this time, when the precursor includes $MoCl_5$, due to the characteristics of $MoCl_5$, the precursor is not attached to the inner wall of the interconnect wiring insulation layer 16 exposed by the interconnect wiring trench MT and may be attached onto the first interconnect wiring layer M1*a*, which is a conductive layer.

Therefore, in the deposition process of the second metal, the second metal may grow in the vertical direction Z from the bottom surface of the first interconnect wiring layer M1*a*.

In the deposition process of the second metal, a process of removing residues other than the second metal from the precursor may be included. The process of removing the residues other than the second metal may include a process using heat or plasma and may include a purge process of pumping with an inert gas. At this time, the remainder of the precursor other than the second metal may not be completely removed and some of the remainder may remain. As described above, a remaining part of the residue of the precursor may be referred to as a second precursor.

As a result, the interconnect wiring pattern M1 including the first interconnect wiring layer M1*a* and the second interconnect wiring layer M1*b* may be formed. The first interconnect wiring layer M1*a* may include a first precursor, and the second interconnect wiring layer M1*b* may include a second precursor.

Figure 15:
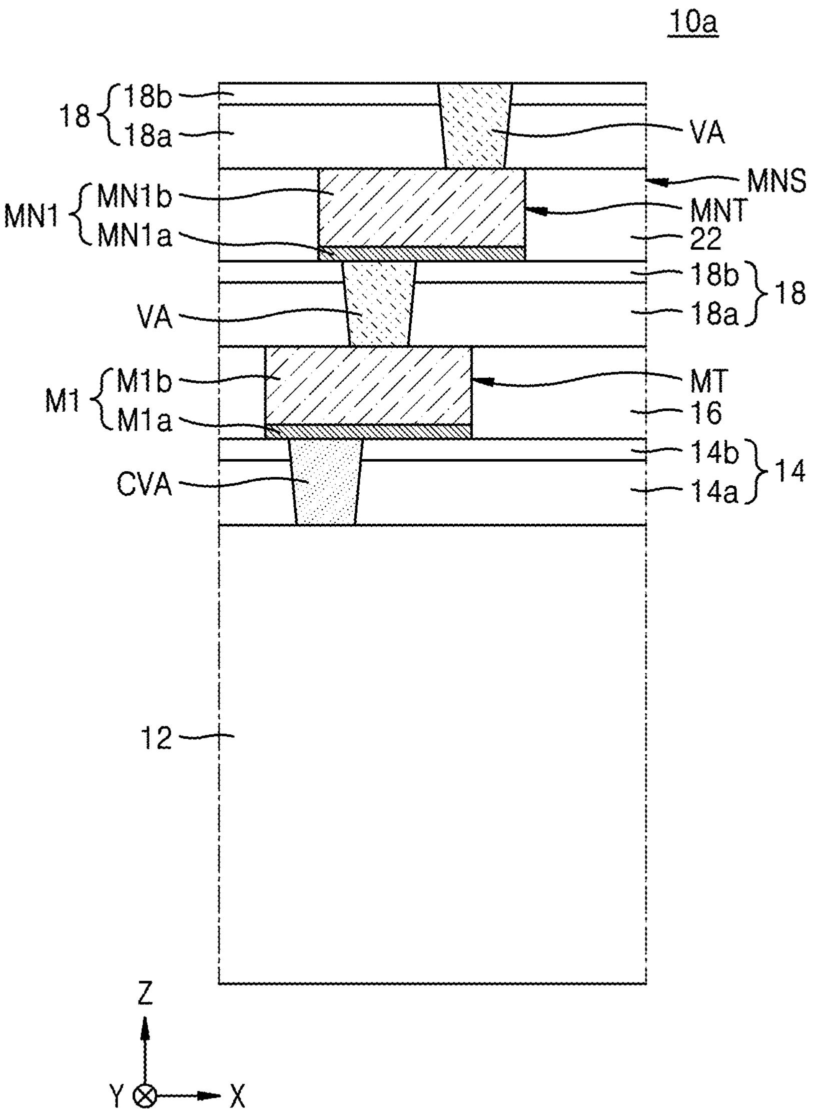

Referring to FIG. 15, to form the contact insulation layer 18 on a result structure of FIG. 14, the first contact insulation layer 18*a* and the second contact insulation layer 18*b* may be sequentially formed on a result structure of FIG. 14. Detailed manufacturing process for the first contact insulation layer 18*a* and the second contact insulation layer 18*b* is identical to that for the first source/drain contact insulation layer 14*a* and the second source/drain contact insulation layer 14*b* described above with reference to FIG. 11. Thereafter, a contact hole (not shown) penetrating through the first contact insulation layer 18*a* and the second contact insulation layer 18*b* may be formed, and then the contact via VA may be formed in the contact hole (not shown). Detailed manufacturing process for the contact via VA is identical to that described for the source/drain contact via CVA of FIG. 11. A portion of the top surface of the interconnect wiring pattern M1 may be exposed through the contact hole.

Thereafter, the wiring insulation layer 22 covering the contact via VA may be disposed. Thereafter, a portion of the wiring insulation layer 22 may be removed to form the wiring trench MNT, and the top surface of the contact via VA and a portion of the top surface of the contact insulation layer 18 may be exposed through the wiring trench MNT.

Thereafter, the first wiring layer MN1*a* and the second wiring layer MN1*b* filling the inside of the wiring trench MNT may be sequentially formed. Detailed manufacturing process for the first wiring layer MN1*a* is identical to that for the first interconnect wiring layer M1*a* the described above, and detailed manufacturing process for the second wiring layer MN1*b* is identical to that for the second interconnect wiring layer M1*b* described above.

Subsequently, to form the plurality of wiring structures MNS on the interconnect wiring structure MS, the manufacturing processes for the contact via VA, the first wiring layer MN1*a*, and the second wiring layer MN1*b* described above may be repeatedly performed.

According to embodiments, after forming the preliminary first interconnect wiring layer PM1*a*, a portion of the preliminary first interconnect wiring layer PM1*a* covering the sidewall of the interconnect wiring trench MT may be removed, thereby limiting and/or preventing the distortion of the interconnect wiring insulation layer 16 due to deformation of the interconnect wiring trench MT by the stress of the preliminary first interconnect wiring layer PM1*a*. Likewise, during the process of forming the first wiring layer MN1*a*, a portion of a preliminary first wiring layer (not shown) covering the sidewall of the wiring trench MNT may be removed like the first interconnect wiring layer M1*a*, thereby limiting and/or preventing the distortion of the wiring insulation layer 22 due to deformation of the wiring trench MNT by the stress of the preliminary first wiring layer.

Also, as a comparative example, unlike the case where the interconnect wiring pattern M1 including a single layer is conformally formed along the inner wall of the interconnect wiring trench MT, the second interconnect wiring layer M1*b* may be formed on the first interconnect wiring layer M1*a* to prevent formation of a seam inside the second interconnect wiring layer M1*b*. Likewise, unlike the case where the wiring pattern MN1 including a single layer is conformally formed along the inner wall of the wiring trench MNT, the second wiring layer MN1*b* may be formed on the first wiring layer MN1*a* to prevent formation of a scam inside the second wiring layer MN1*b*. Therefore, a method of manufacturing an integrated circuit device that may ultimately improve the structural stability of the integrated circuit device may be provided.

FIGS. 16 to 18, 19A, 19B, 19C, 20A, 20B, 21A, 21B, 21C, 22 to 24, 25A, 25B, 25C, 26A, 26B, 26C, 27A, 27B, 27C, 28A, 28B, and 28C are diagrams for describing a method of manufacturing the integrated circuit device 300 according to embodiments, according to a process sequence.

In detail, FIGS. 16 to 18, 19B, 20A, 21B, 25B, 26B, 27B, and 28B are cross-sectional views of an example cross-sectional structure taken along a line Y1-Y1' of FIG. 10B, according to a process sequence. Also, FIGS. 19A, 21A, 22 to 24, 25A, 26A, 27A, and 28A are cross-sectional views of an example cross-sectional structure taken along a line X1-X1' of FIG. 10B, according to a process sequence. FIGS. 19C, 20B, 21C, 25C, 26C, 27C, and 28C are cross-sectional views of an example cross-sectional structure taken along a line Y2-Y2' of FIG. 10B, according to a process sequence.

Figure 16:
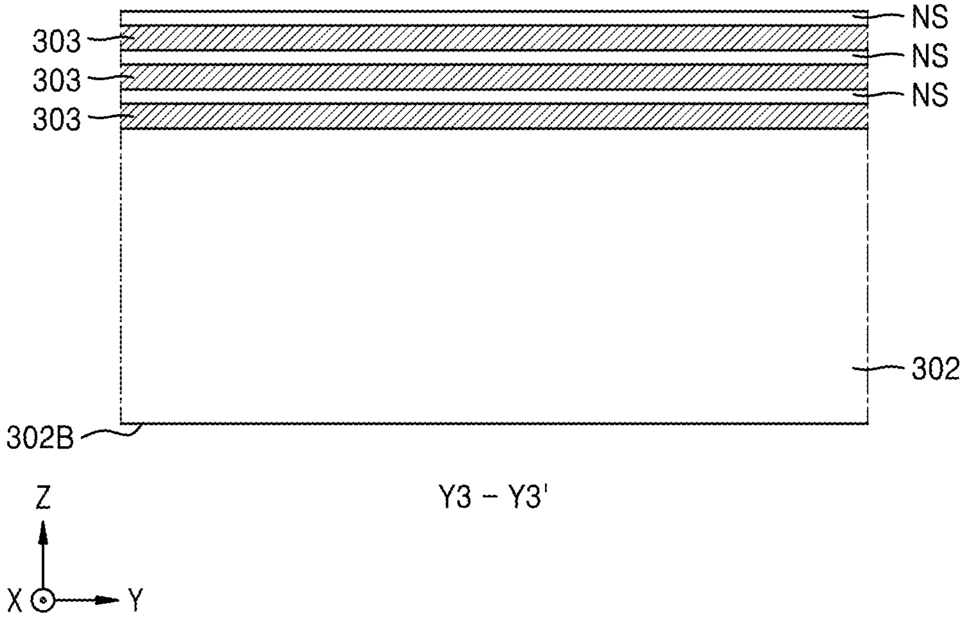
FIGS. 16 to 18, 19A, 19B, 19C, 20A, 20B, 21A, 21B, 21C, 22 to 24, 25A, 25B, 25C, 26A, 26B, 26C, 27A, 27B, 27C, 28A, 28B, and 28C are diagrams for describing a method of manufacturing an integrated circuit device according to embodiments, according to a process sequence.

Referring to FIG. 16, a plurality of sacrificial semiconductor layers 303 and a plurality of nano-sheet semiconductor layers NS may be alternately stacked one-by-one on the substrate 302.

The plurality of sacrificial semiconductor layers 303 and the plurality of nano-sheet semiconductor layers NS may include semiconductor materials having different etch selectivity. According to embodiments, the plurality of nano-sheet semiconductor layers NS may include Si layers and the plurality of sacrificial semiconductor layers 303 may include SiGe layers. According to embodiments, the Ge concentration in the plurality of sacrificial semiconductor layers 303 may be constant. SiGe layers constituting the plurality of sacrificial semiconductor layers 303 may have a certain Ge concentration selected within the range from about 5 atomic % to about 60 atomic %, e.g., from about 10 atomic % to about 40 atomic %. The Ge concentration in the SiGe layers constituting the plurality of sacrificial semiconductor layers 303 may be variously selected as needed.

Figure 17:
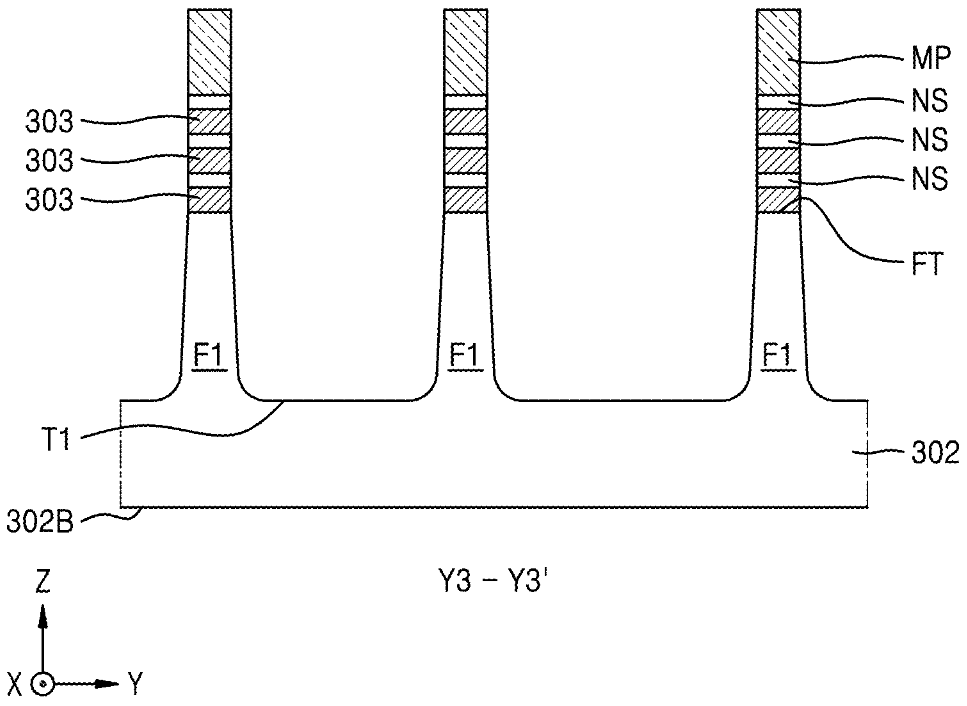

Referring to FIG. 17, after a mask pattern MP is formed on a result structure of FIG. 16, the plurality of sacrificial semiconductor layers 303, the plurality of nano-sheet semiconductor layers NS, and the substrate 302 may be partially etched to form the plurality of fin-type active regions F1 on the substrate 302. The plurality of trench regions T1 may be defined on the substrate 302 by the plurality of fin-type active regions F1. According to embodiments, the mask pattern MP may have a stacked structure including an oxide film pattern and a silicon nitride film pattern. Mask patterns MP may extend parallel to each other in the first horizontal direction X on the substrate 302. A stacked structure of the plurality of sacrificial semiconductor layers 303 and the plurality of nano-sheet semiconductor layers NS may remain on the fin top surface FT of each of the plurality of fin-type active regions F1.

Figure 18:
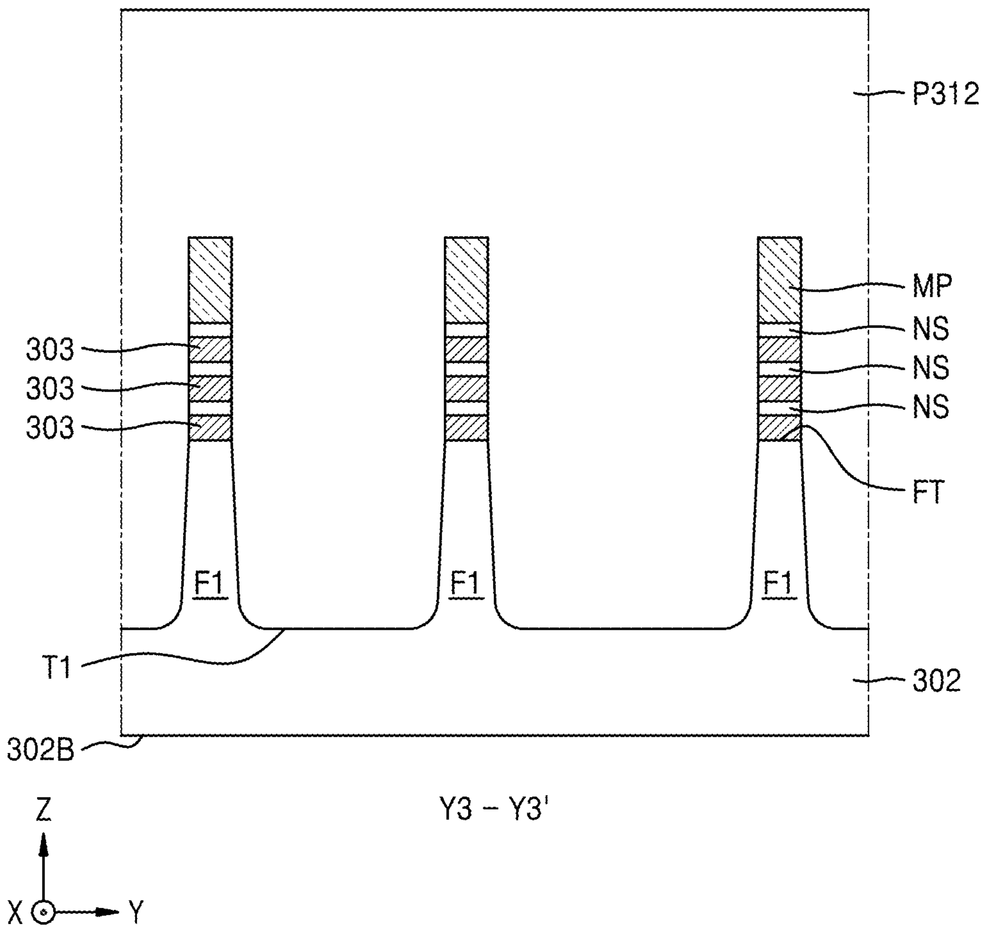

Referring to FIG. 18, a device isolating insulation layer P312 may be formed on a result structure of FIG. 17. The device isolating insulation layer P312 may be formed to a thickness sufficient to fill the remaining spaces of the plurality of trench regions T1. The device isolating insulation layer P312 may include a silicon oxide film.

To form the device isolating insulation layer P312, a plasma enhanced chemical vapor deposition (PECVD) process, a high density plasma (HDP) CVD process, an inductively coupled plasma (ICP) CVD process, a capacitor coupled plasma (CCP) CVD process, a flowable chemical vapor deposition (FCVD) process, a spin coating process, etc. may be used.

Figure 19A:
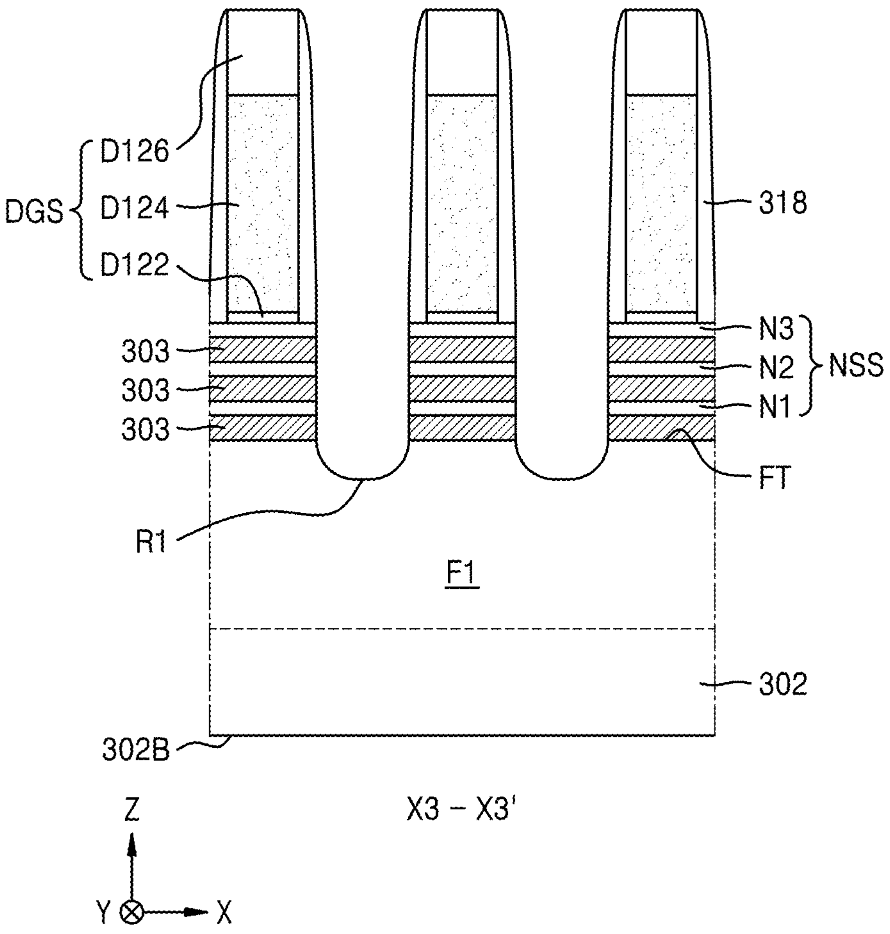
Figure 19B:
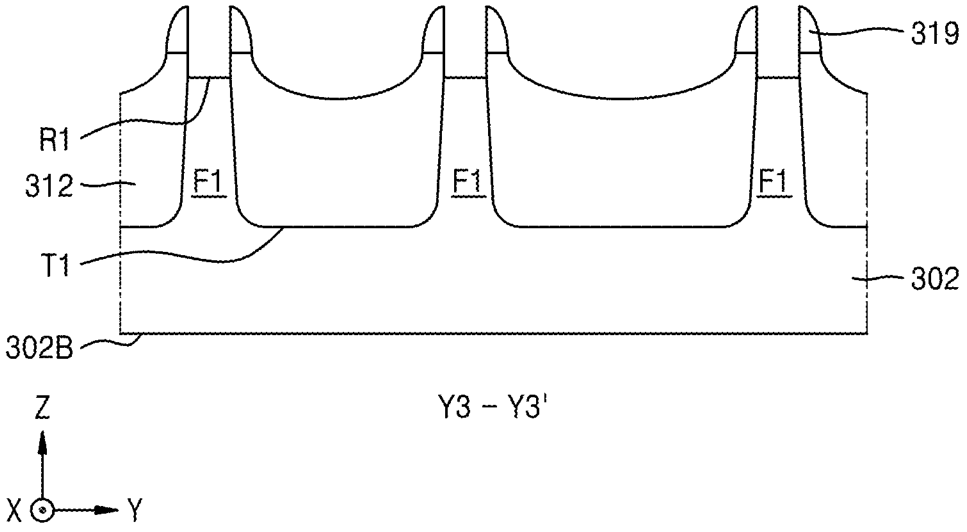
Figure 19C:
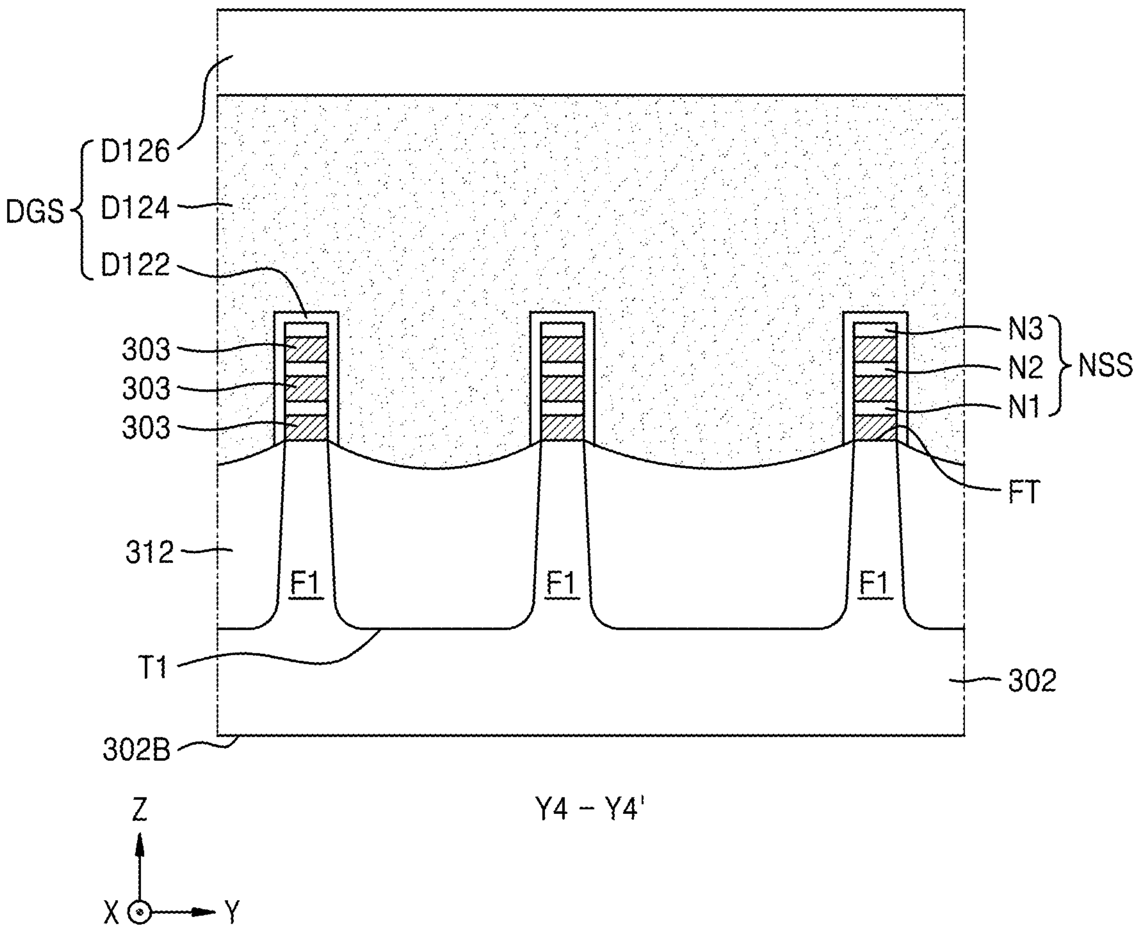

Referring to FIGS. 19A, 19B, and 19C, after a result structure of FIG. 18 is planarized to expose the top surface of the mask pattern MP, the exposed mask pattern MP may be removed, and a recess process for removing a portion of the device isolating insulation layer P312 may be performed, thereby forming the device isolation layer 312. As a result, the plurality of sacrificial semiconductor layers 303 and the plurality of nano-sheet semiconductor layers NS (refer to FIG. 18) may protrude beyond the top surface of the device isolation layer 312.

To perform the recess process of the device isolating insulation layer P312, a dry etching, a wet etching, or an etching process combining the dry etching and the wet etching may be used. At this time, a wet etching process using $NH_4OH$, tetramethyl ammonium hydroxide (TMAH), potassium hydroxide (KOH), etc. as an etchant or a dry etching process like inductively coupled plasma (ICP), transformer coupled plasma (TCP), electron cyclotron resonance (ECR), reactive ion etch (RIE), etc. may be used. In the case of performing a recess process of the device isolating insulation layer P312 using a dry etching process, a fluorine-containing gas such as $CF_4$, a chlorine-containing gas such as $Cl_2$, HBr, etc. may be used as an etching gas.

Thereafter, a plurality of dummy gate structures DGS may be formed on the stacked structure of the plurality of sacrificial semiconductor layers 303 and the plurality of nano-sheet semiconductor layers NS. The plurality of dummy gate structures DGS may each be formed to extend long in the second horizontal direction Y. The plurality of dummy gate structures DGS may have a structure in which an oxide layer D122, a dummy gate layer D124, and a capping layer D126 are sequentially stacked. According to embodiments, the oxide layer D122 may be a layer obtained by oxidizing surfaces of the plurality of sacrificial semiconductor layers 303 and the plurality of nano-sheet semiconductor layers NS (refer to FIG. 12). The dummy gate layer D124 may include polysilicon, and the capping layer D126 may include a silicon nitride film.

After forming the plurality of outer insulation spacers 318 covering both sidewalls of each of the plurality of dummy gate structures DGS, portions of the plurality of sacrificial semiconductor layers 303 and the plurality of nano-sheet semiconductor layers NS and portions of the fin-type active regions F1 may be etched by using the plurality of dummy gate structures DGS and the plurality of outer insulation spacers 318 as an etching mask, thereby dividing the plurality of nano-sheet semiconductor layers NS into a plurality of nano-sheet stacks NSS each including the first nano-sheet N1, the second nano-sheet N2, and the third nano-sheet N3 and forming the plurality of recesses R1 in the fin-type active regions F1. To form the plurality of recesses R1, etching may be performed using dry etching, wet etching, or a combination thereof. After the plurality of recesses R1 are formed, the plurality of recess side insulation spacers 319, which are arranged adjacent to the plurality of recesses R1 on the device isolation layer 312 on both sides of each of the fin-type active regions F1, may be formed.

Figure 20A:
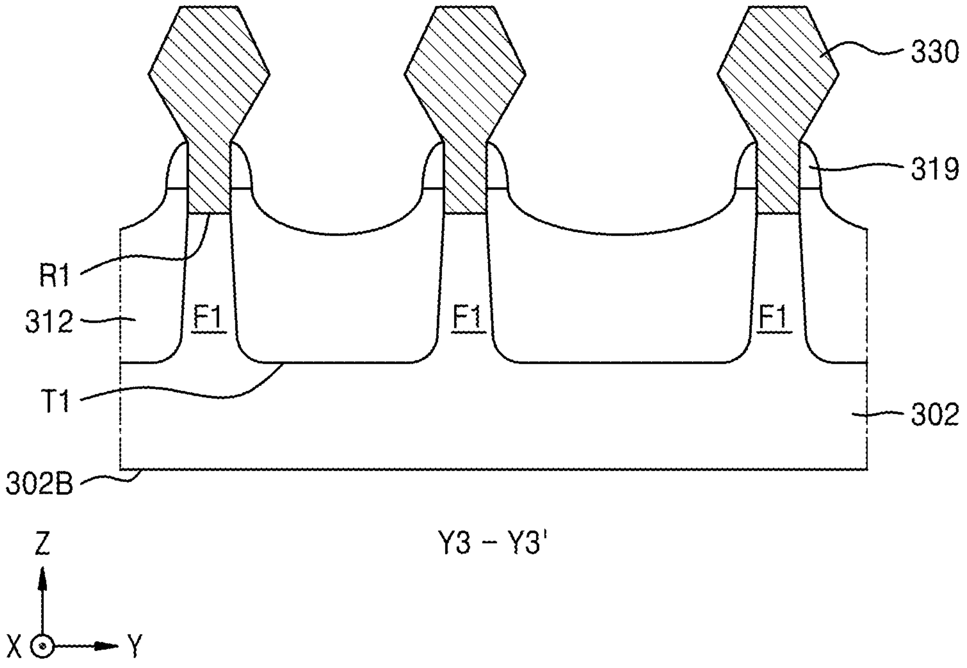
Figure 20B:
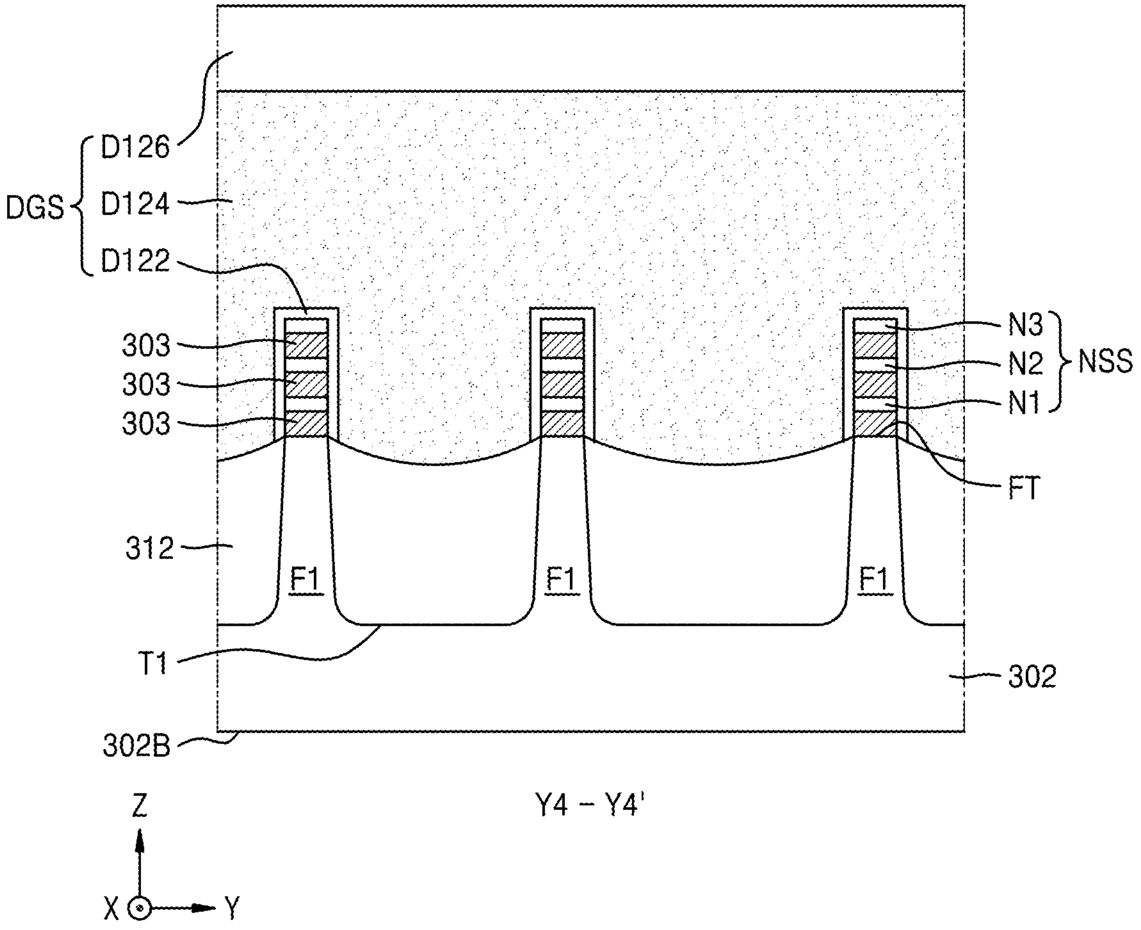

Referring to FIGS. 20A and 20B, the plurality of source/drain regions 330 filling the plurality of recesses R1 may be formed in a result structure of FIGS. 19A, 19B, and 19C.

To form the plurality of source/drain regions 330, a semiconductor material may be epitaxially grown from surfaces of the fin-type active regions FA exposed at the bottom surfaces of the plurality of recesses R1 and sidewalls of the first nano-sheet N1, the second nano-sheet N2, and the third nano-sheet N3 included in the nano-sheet stack NSS.

Figure 21A:
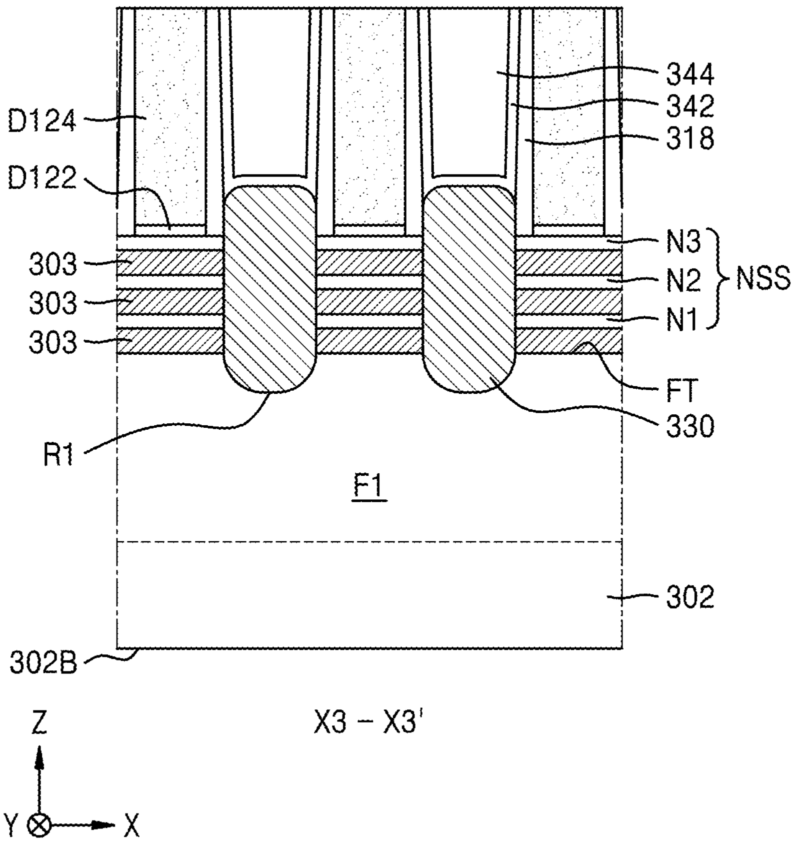
Figure 21B:
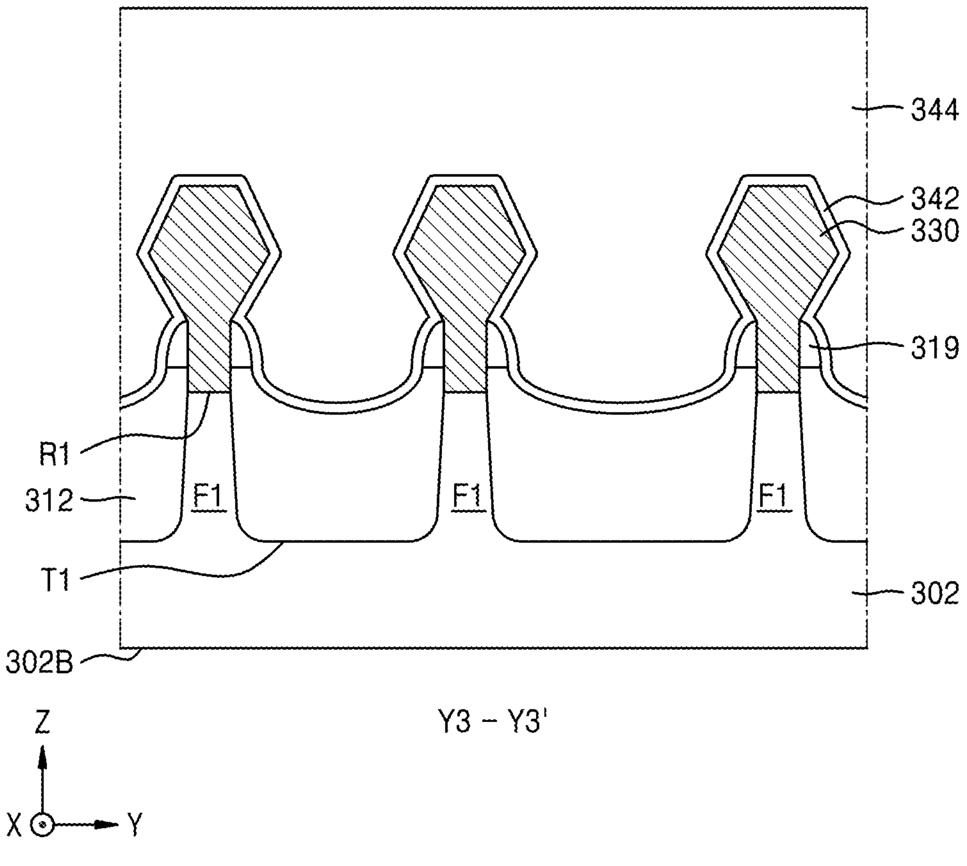
Figure 21C:
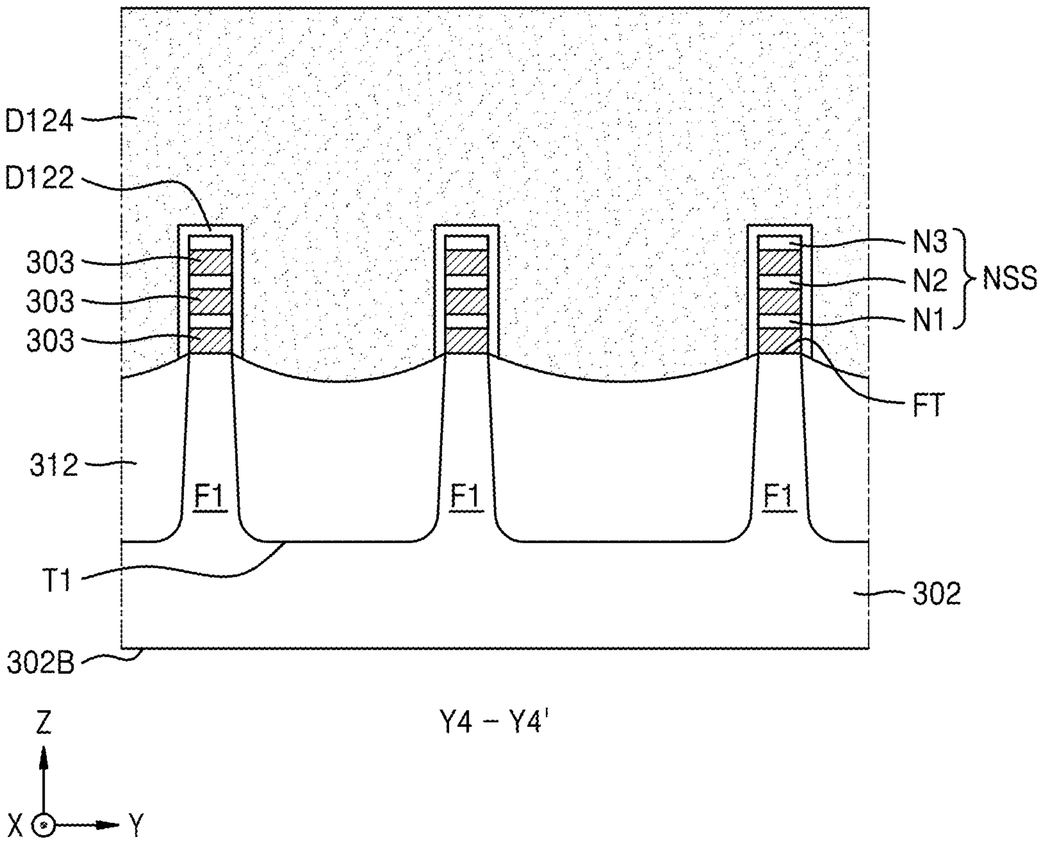

Referring to FIGS. 21A, 21B, and 21C, the insulation liner 342 may be formed to cover a result structure of FIGS. 20A and 20B, the inter-gate insulation layer 344 may be formed on the insulation liner 342, and then the insulation liner 342 and the inter-gate insulation layer 344 may be partially etched, thereby exposing the top surfaces of the plurality of capping layers D126. Thereafter, the dummy gate layer D124 may be exposed by removing the plurality of capping layers D126, and portions of the insulation liner 342 and the inter-gate insulation layer 344 may be removed, such that the top surface of the inter-gate insulation layer 344 and the top surface of the dummy gate layer D124 are at about the same level.

Figure 22:
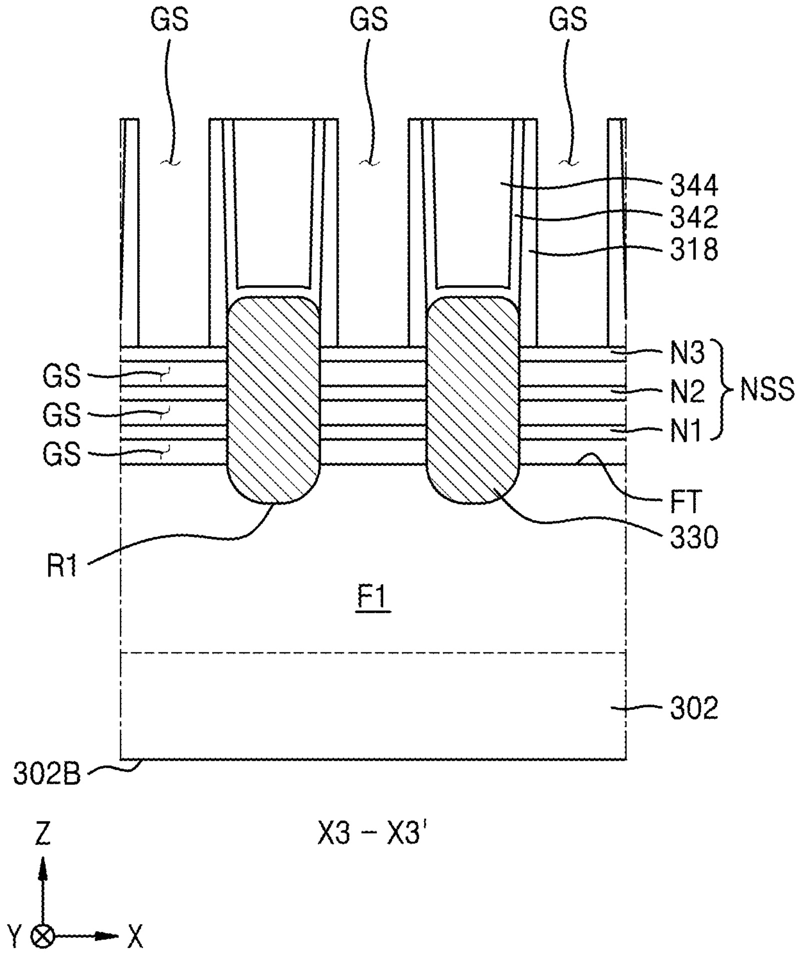

Referring to FIG. 22, from a result structure of FIGS. 21A, 21B, and 21C, the dummy gate layer D124 and the oxide layer D122 therebelow may be removed to forma gate space GS, and the plurality of nano-sheet stacks NSS may be exposed through the gate space GS. Thereafter, the plurality of sacrificial semiconductor layers 303 remaining on the fin active region FA are removed through the gate space GS, and thus the gate space GS may be extended to spaces between the first nano-sheet N1, the second nano-sheet N2, and the third nano-sheet N3 and a space between the first nano-sheet N1 and the top surface FT of the fin active region FA. According to embodiments, to selectively remove the plurality of sacrificial semiconductor layers 303, the difference between the etch selectivity of the first nano-sheet N1, the second nano-sheet N2, and the third nano-sheet N3 and the plurality of sacrificial semiconductor layers 303 may be used.

To selectively remove the plurality of sacrificial semiconductor layers 303, a liquid or gaseous etchant may be used. According to embodiments, to selectively remove the plurality of sacrificial semiconductor layers 303, a $CH_3COOH$-based etchant, e.g., an etchant including a mixture of $CH_3COOH$, $HNO_3$, and HF or an etchant including a mixture of $CH_3COOH$, $H_2O_2$, and HF, may be used, but inventive concepts are not limited thereto.

Figure 23:
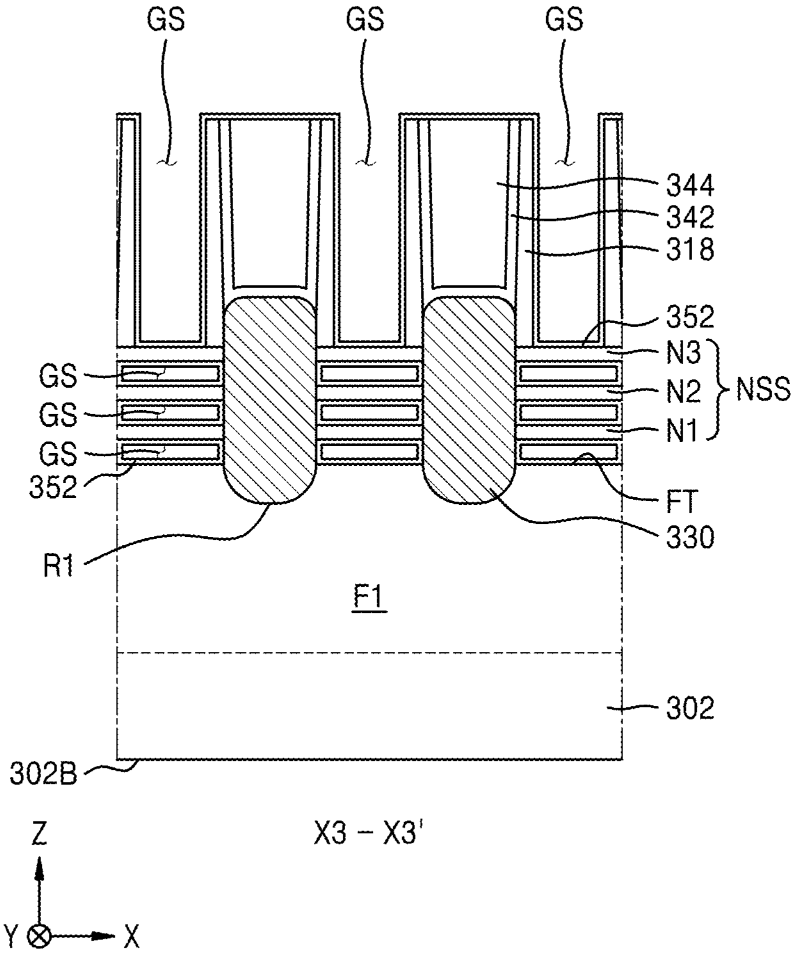

Referring to FIG. 23, in the result structure of FIG. 22, the gate dielectric layer 352 covering exposed surfaces of the first nano-sheet N1, second nano-sheet N2, and third nano-sheet N3 and the fin-type active regions FA may be formed. The gate dielectric layer 352 may be formed through an atomic layer deposition (ALD) process.

Figure 24:
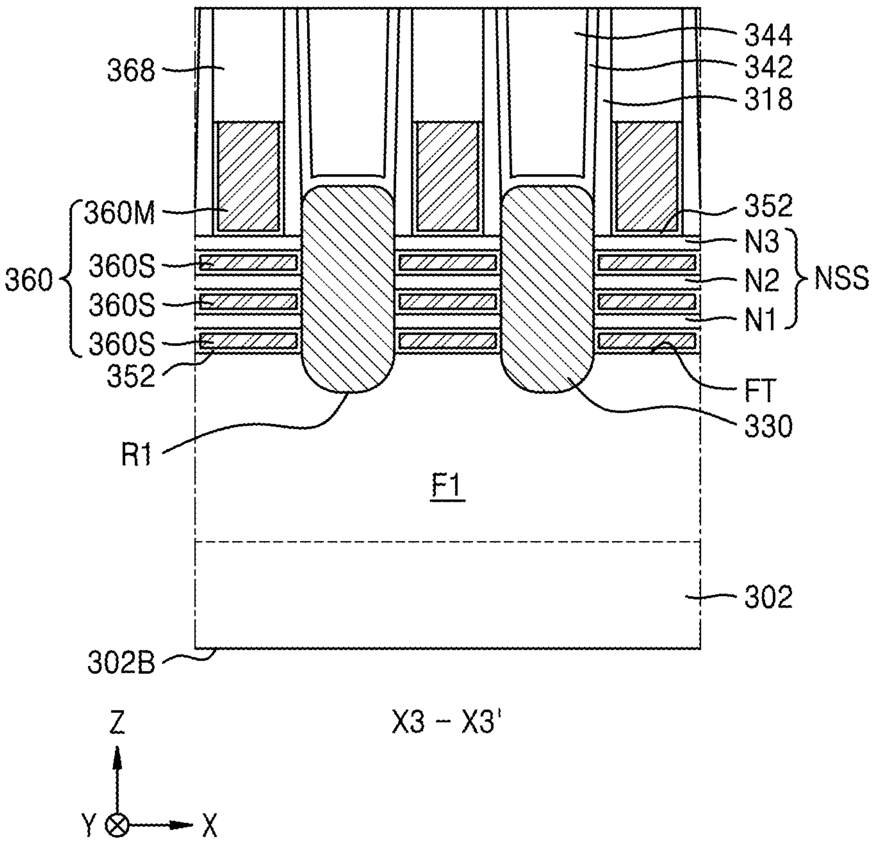

Referring to FIG. 24, the gate line 360 covering the top surface of the inter-gate insulation layer 344 while filling the gate space GS (refer to FIG. 17) on the gate dielectric layer 352 and the capping insulation pattern 368 covering top surfaces of the gate line 360 and the gate dielectric layer 352 in the gate space GS may be formed.

Figure 25A:
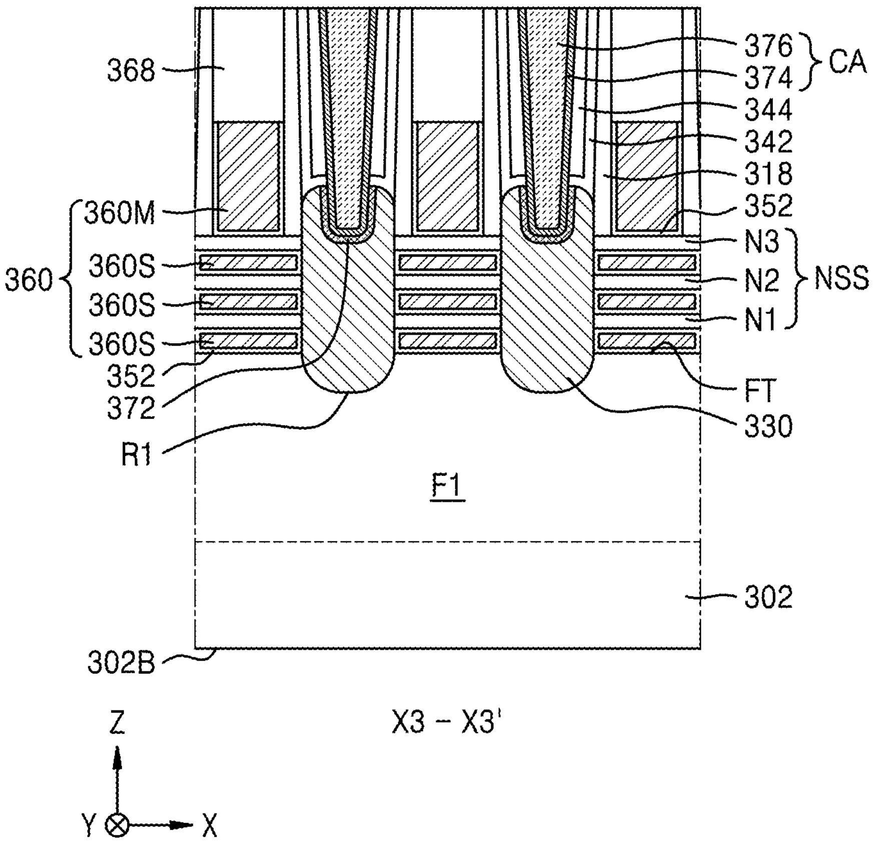
Figure 25B:
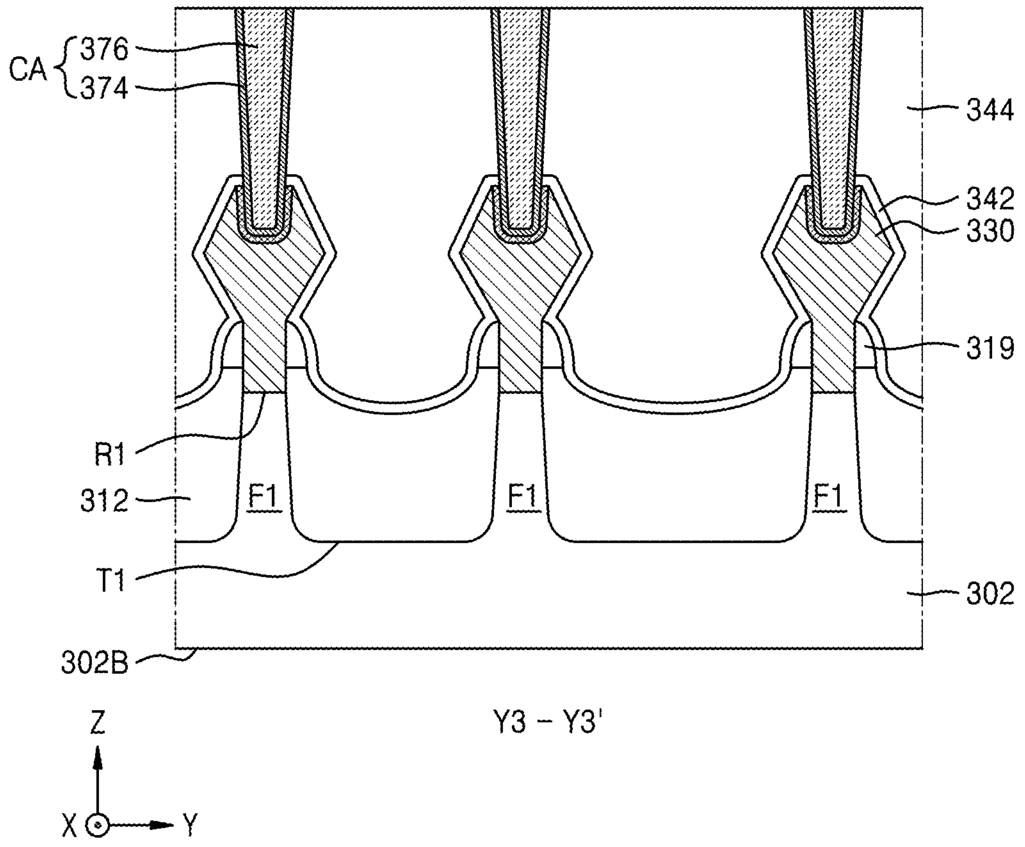
Figure 25C:
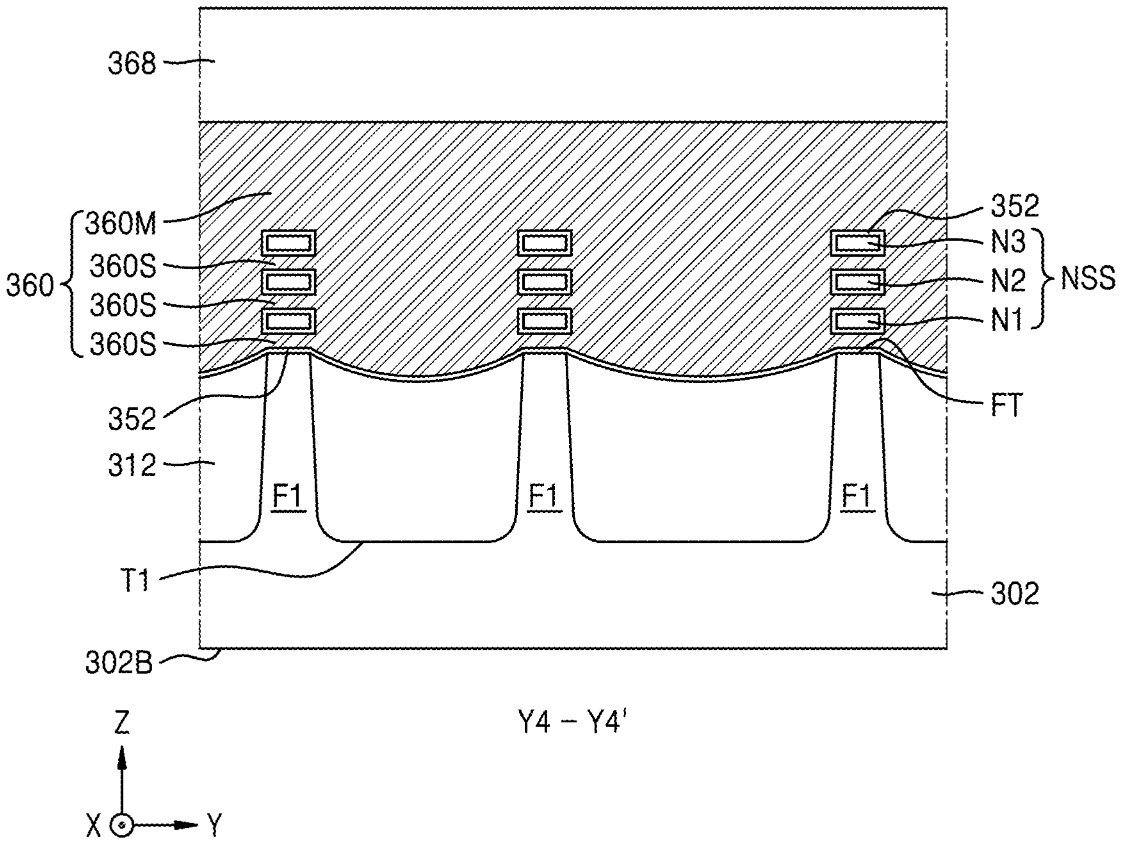

Referring to FIGS. 25A, 25B, and 25C, in a result structure of FIG. 24, after a source/drain contact hole penetrating through an insulation structure including the insulation liner 342 and the inter-gate insulation layer 344 and exposing the source/drain region 330 is formed, a portion of the source/drain region 330 may be removed through the source/drain contact hole through an anisotropic etching process, and thus the source/drain contact hole may further extend toward the substrate 302. Thereafter, the metal silicide layer 372 may be formed on the source/drain region 330 exposed at the bottom side of the source/drain contact hole. According to embodiments, to form the metal silicide layer 372, a process of forming a metal liner (not shown) conformally covering the exposed surface of the source/drain region 330 and inducing a reaction between the source/drain region 330 and a metal constituting the metal liner by heat-treating the metal liner may be included. After the metal silicide layer 372 is formed, remaining portions of the metal liner may be removed. A portion of the source/drain region 330 may be consumed during the process of forming the metal silicide layer 372. According to embodiments, when the metal silicide layer 372 includes a titanium silicide layer, the metal liner may include a Ti layer.

Thereafter, the source/drain contact CA including the conductive barrier pattern 374 and the contact plug 376 may be formed on the metal silicide layer 372.

Figure 26A:
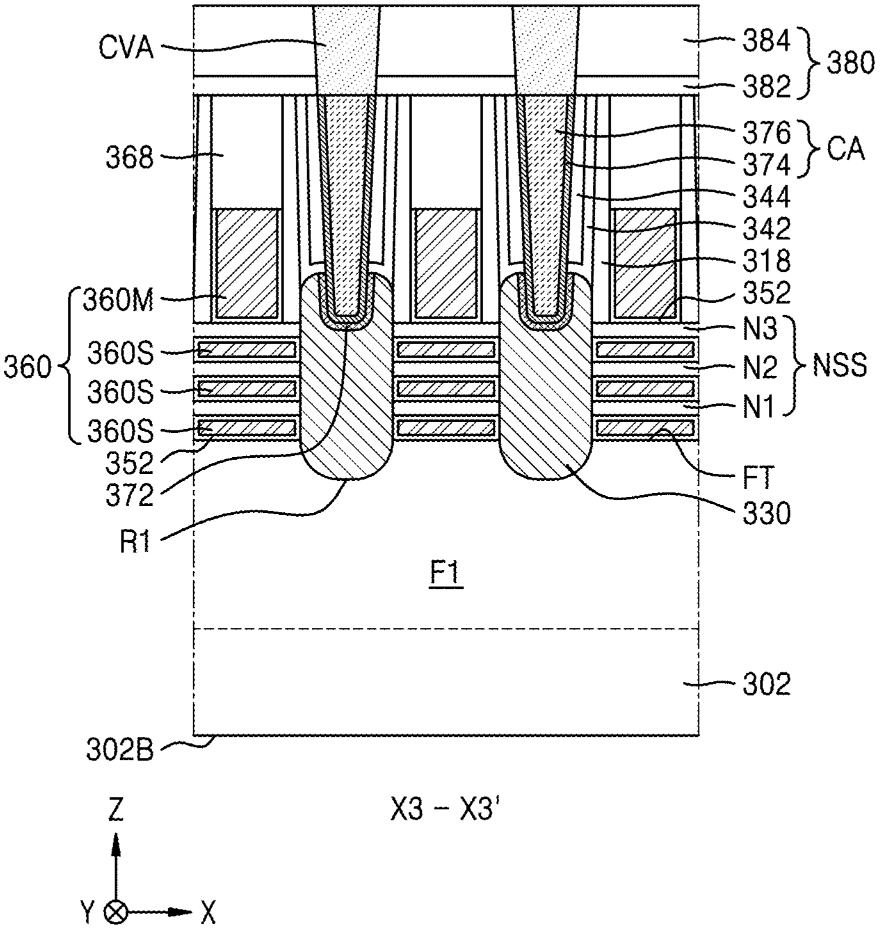
Figure 26B:
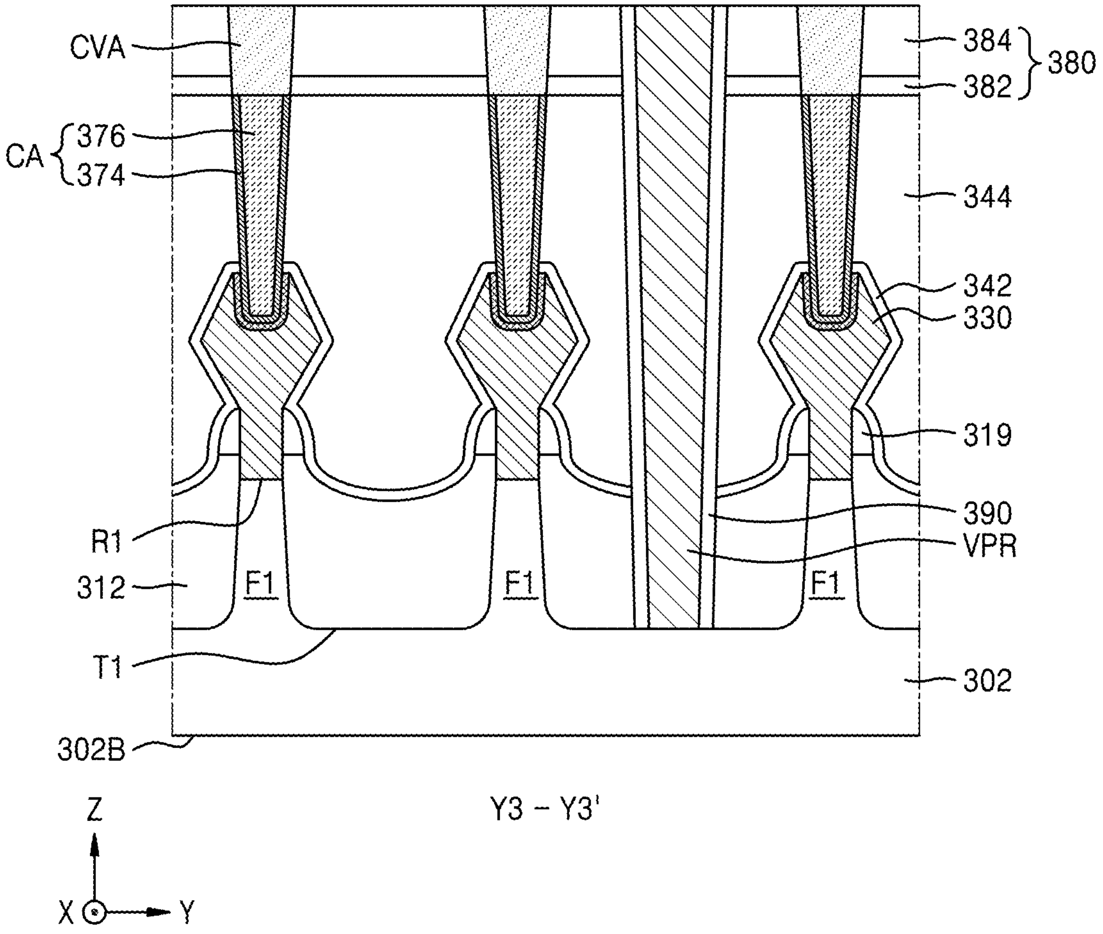
Figure 26C:
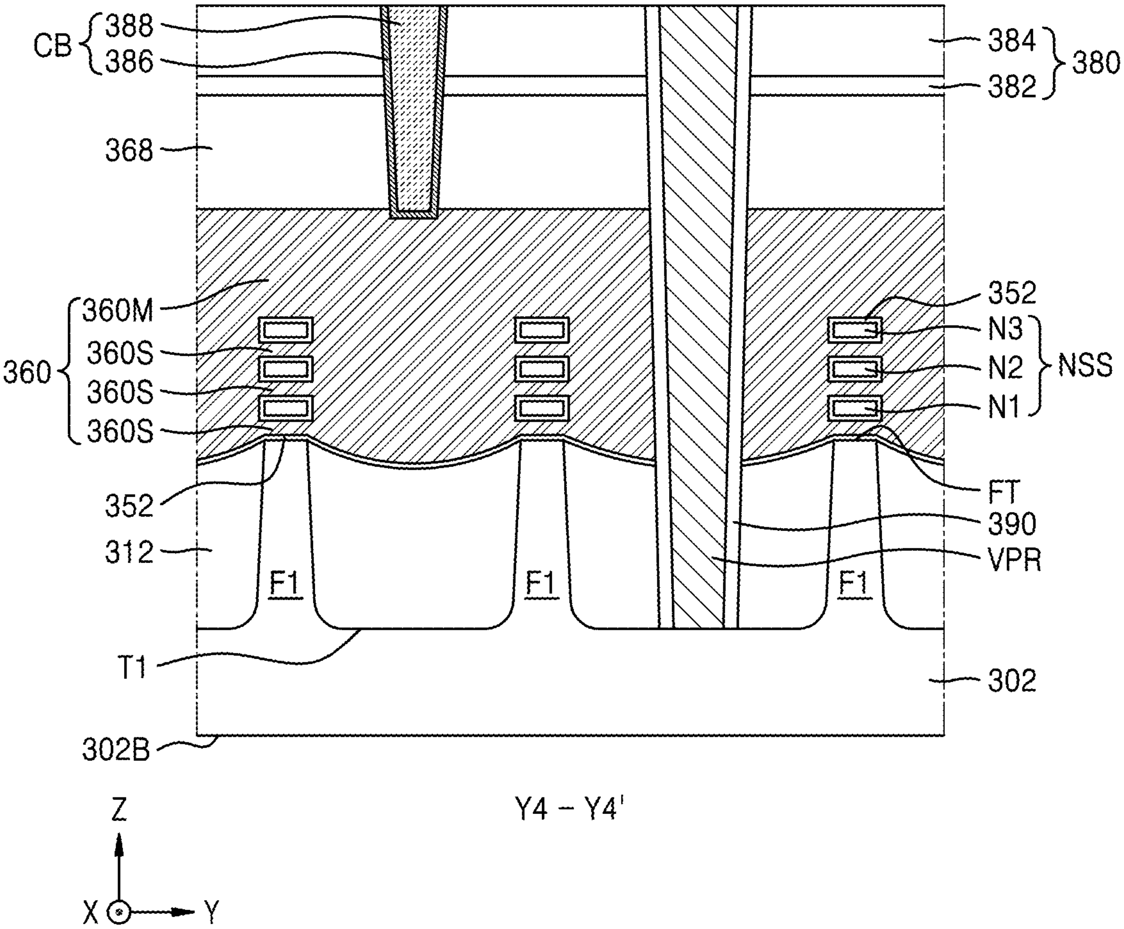

Referring to FIGS. 26A, 26B, and 26C, in a result structure of FIGS. 25A, 25B, and 25C, the etch stop layer 382 covering the top surfaces of the inter-gate insulation layer 344, the plurality of source/drain contacts CA, and the plurality of capping insulation patterns 368 and the source/drain contact insulation layer 384 may be sequentially formed, thereby forming the upper insulation structure 380. The source/drain contact insulation layer 384 may be formed by sequentially stacking a first source/drain contact insulation layer and a second source/drain contact insulation layer.

Thereafter, the plurality of source/drain contact vias CVA that penetrate through the upper insulation structure 380 in the vertical direction Z and are connected to the plurality of source/drain contacts CA, the gate contact CB that penetrates through the upper insulation structure 380 and the capping insulation pattern 368 in the vertical direction Z and are connected to the gate line 360, and a via power rail structure including the via power rail VPR and the insulation spacer 390 may be formed. The order of forming the source/drain contact via CVA, the gate contact CB, and the via power rail structure is not particularly limited.

To form the via power rail structure, it is necessary to form a hole having a large planar area and penetrating through the upper insulation structure 380, the inter-gate insulation layer 344, the insulation liner 342, the gate dielectric layer 352, and the device isolation layer 312 in the vertical direction Z.

Figure 27A:
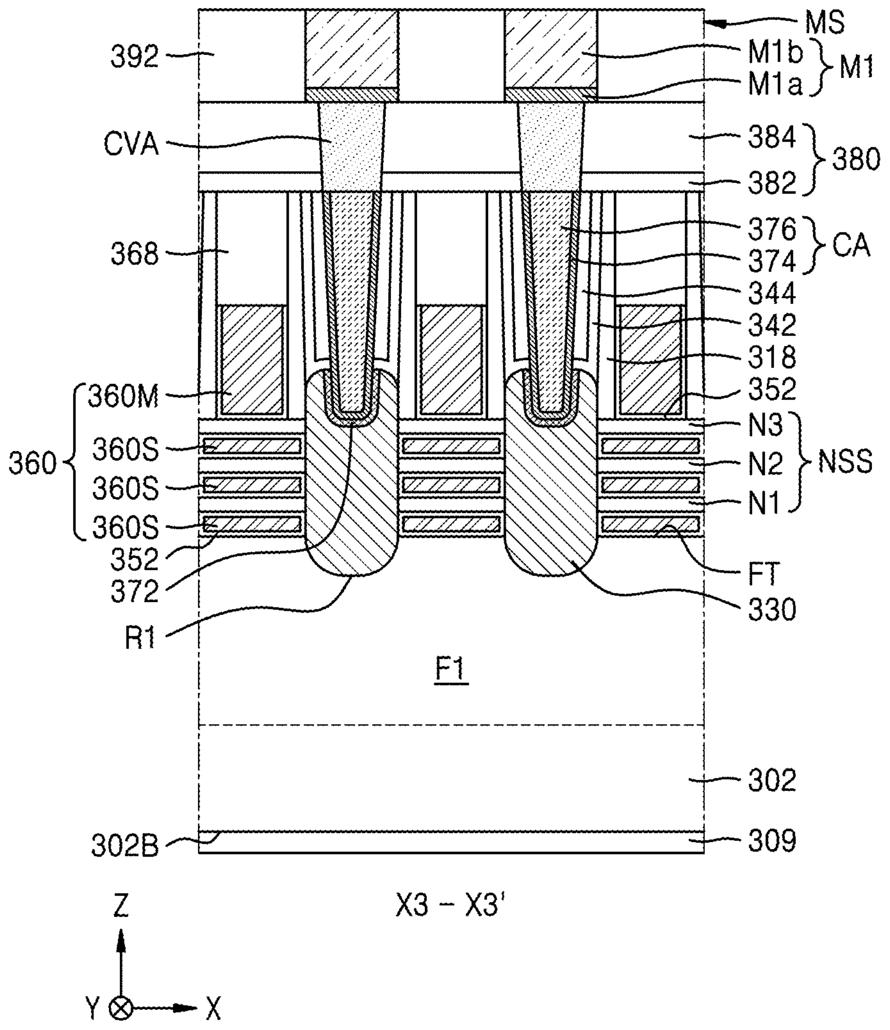
Figure 27B:
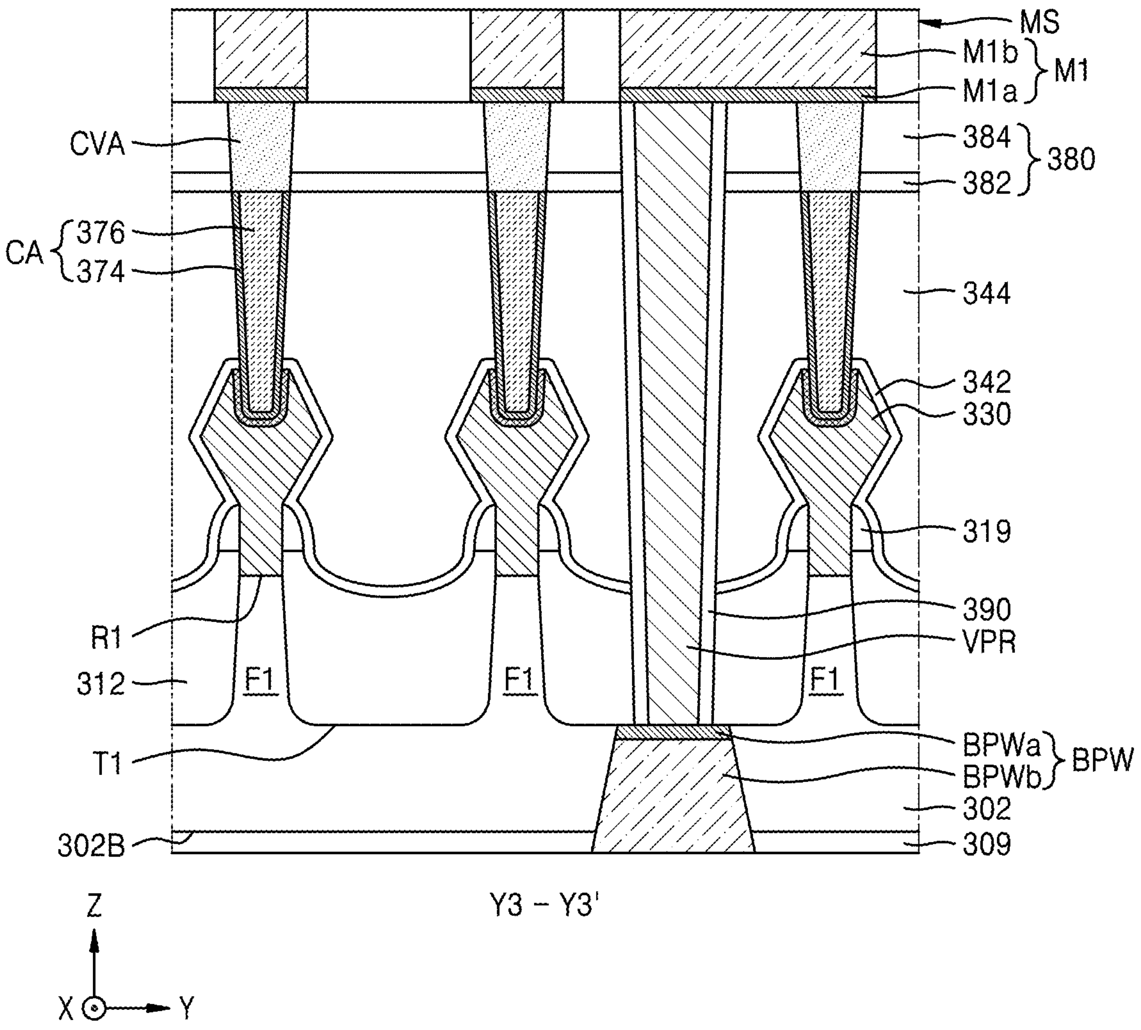
Figure 27C:
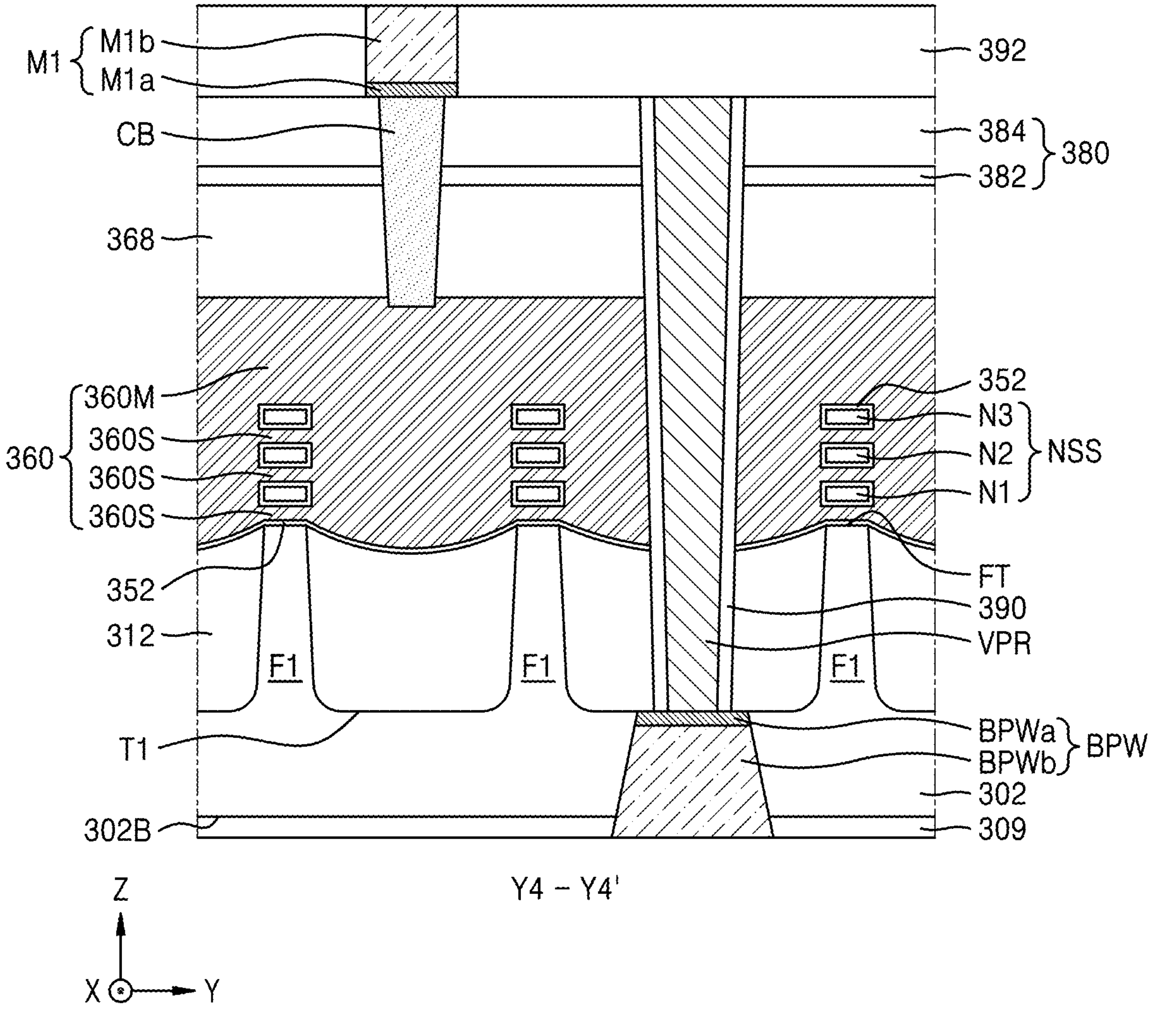

Referring to FIGS. 27A, 27B, and 27C, in a result structure of FIGS. 26A, 26B, and 26C, the interconnect wiring insulation layer 392 covering the upper insulation structure 380 and the plurality of interconnect wiring patterns M1 penetrating through the interconnect wiring insulation layer 392 and connected to the source/drain contact via CVA, the gate contact CB, and the via power rail VPR may be formed. The plurality of interconnect wiring patterns M1 may include a power connection conductive layer PCL connected to the via power rail VPR. To form the plurality of interconnect wiring patterns M1, a plurality of interconnect wiring trenches MT penetrating through the interconnect wiring insulation layer 392 may be formed.

The plurality of interconnect wiring patterns M1 may each include the first interconnect wiring layer M1*a* and the second interconnect wiring layer M1*b*. To form the first interconnect wiring layer M1*a*, a process substantially similar to that described above in the description of FIGS. 12 and 13 may be performed. The second interconnect wiring layer M1*b* may be formed on the first interconnect wiring layer M1*a*, and a process substantially similar to that described above in the description of FIG. 14 may be performed to form the second interconnect wiring layer M1*b*. As a result, the interconnect wiring pattern M1 including the first interconnect wiring layer M1*a* and the second interconnect wiring layer M1*b* may be formed. The first interconnect wiring layer M1*a* may include the above-stated first precursor, and the second interconnect wiring layer M1*b* may include the above-stated second precursor.

Thereafter, the backside insulation layer 309 covering the backside surface 302B of the substrate 302 may be formed, and the backside power rail BPW penetrating through the backside insulation layer 309 and the substrate 302 in the vertical direction Z and contacting one end of the via power rail VPR may be formed. To form the backside power rail BPW, an etching process for removing portions of the backside insulation layer 309 and the substrate 302 may be performed to form a backside trench.

The backside power rail BPW may include the first backside power conductive layer BPWa and the second backside power conductive layer BPWb. To form the first backside power conductive layer BPWa, a first metal layer conformally extending along the inner wall of the backside trench may be formed. The process of forming the first metal layer may be substantially similar to the process of forming the preliminary first interconnect wiring layer PM1*a* of FIG. 12.

Subsequently, an etch back process may be performed to remove a portion of the first metal layer covering the inner wall of the backside trench. The etch back process may include dry etching, wet etching, or a combination thereof. The etch back process may be adjusted, such that, after removing a portion of the upper portion of the first metal layer, the remaining portion of the first metal layer has a thickness from about 2 nanometers to about 10 nanometers in the vertical direction Z.

Thereafter, to form the second backside power conductive layer BPWb, a second metal layer may be formed inside the backside trench where the first backside power conductive layer BPWa is formed. The process of forming the second metal layer may be substantially similar to the process of forming the second interconnect wiring layer M1*b* of FIG. 14. As a result, the backside power rail BPW including the first backside power conductive layer BPWa and the second backside power conductive layer BPWb may be formed. The first backside power conductive layer BPWa may include the above-stated first precursor, and the second backside power conductive layer BPWb may include the above-stated second precursor.

Figure 28A:
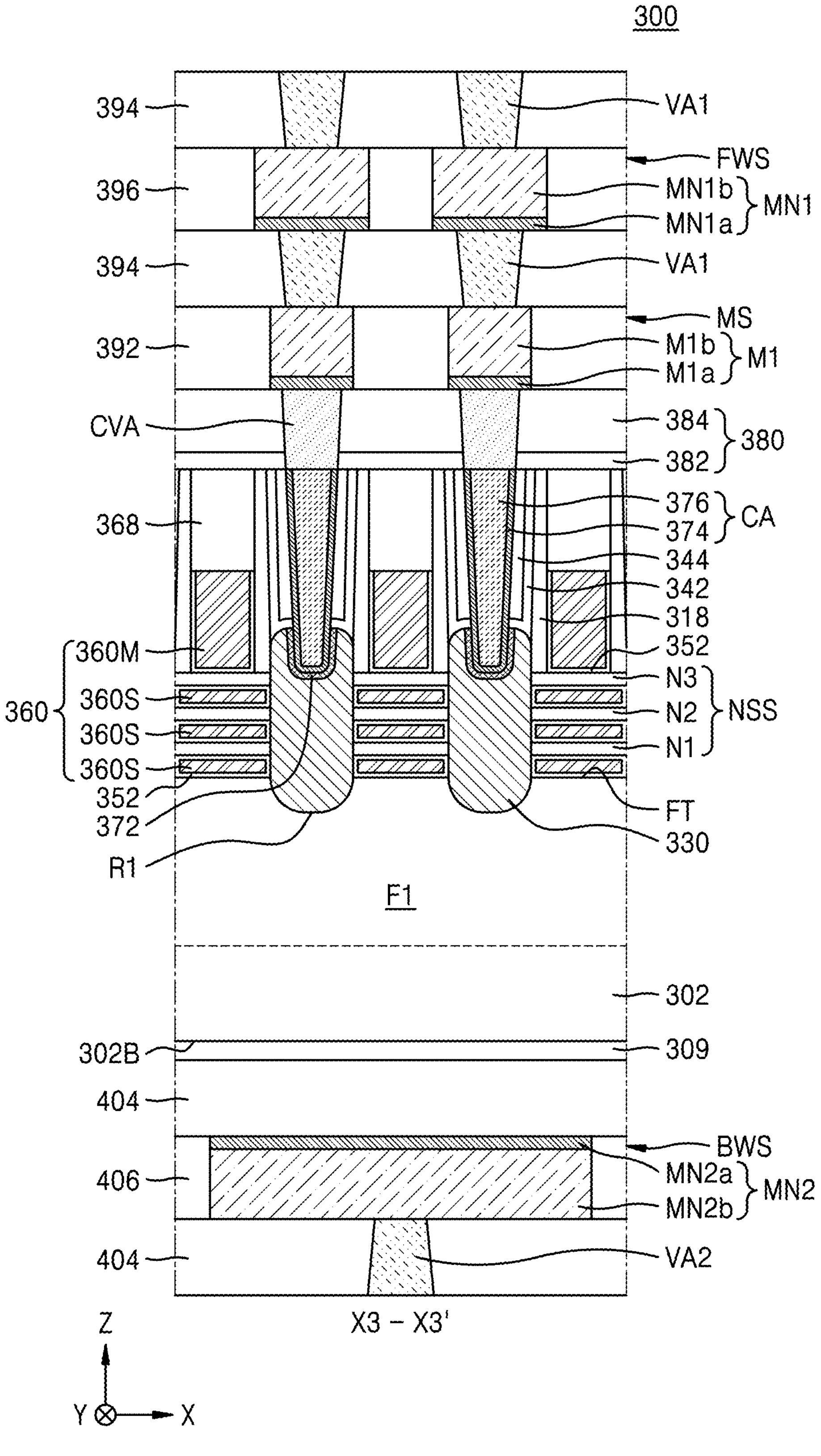
Figure 28B:
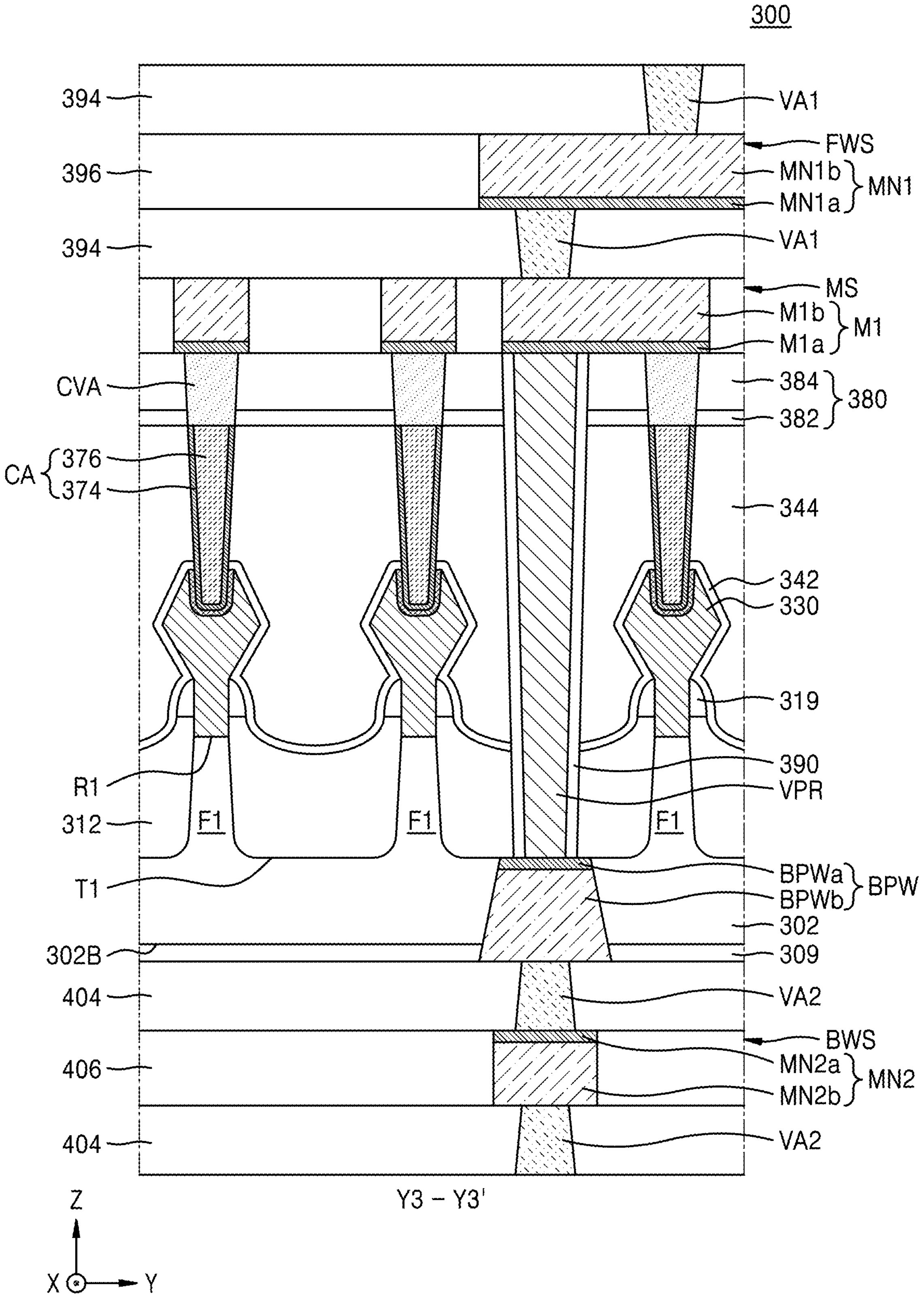
Figure 28C:
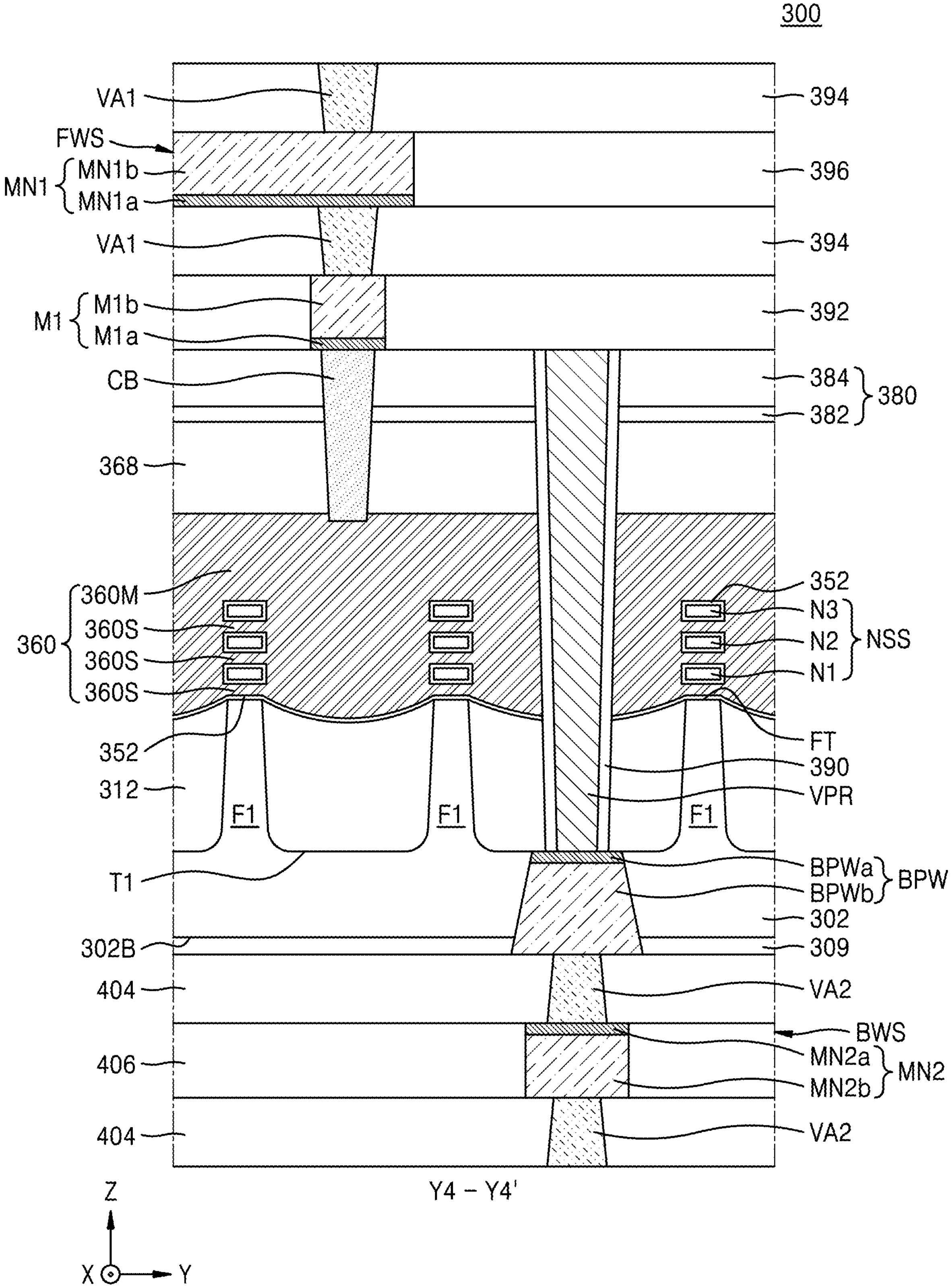

Referring to FIGS. 28A, 28B, and 28C, at least one contact via VA1 disposed on the interconnect wiring pattern M1 and the wiring pattern MN1 disposed on the at least one contact via VA1 and electrically connected to the interconnect wiring pattern M1 through a corresponding contact via VA1 from among the at least one contact via VA1 may be formed. The manufacturing process of the contact via VA1 is substantially identical to the manufacturing process of the source/drain contact via CVA described above, and the manufacturing process of the wiring pattern MN1 is substantially identical to the manufacturing process of the interconnect wiring pattern M1 described above.

The at least one contact via VA2 disposed on the backside power rail BPW, and the wiring pattern MN2 disposed on the at least one contact via VA2 and electrically connected to the backside power rail BPW through the at least one contact via VA2 may be formed. The manufacturing process of the contact via VA2 is substantially identical to the manufacturing process of the source/drain contact via CVA described above, and the manufacturing process of the wiring pattern MN2 is substantially identical to the manufacturing process of the interconnect wiring pattern M1 described above.

While inventive concepts has been particularly shown and described with reference to embodiments thereof, it will be understood that various changes in form and details may be made therein without departing from the spirit and scope of the following claims.

What is claimed is:

1. An integrated circuit device comprising:

a source/drain contact insulation layer on a lower structure;

a source/drain contact via penetrating through the source/drain contact insulation layer;

an interconnect wiring insulation layer on the source/drain contact insulation layer, the interconnect wiring insulation layer including an interconnect wiring trench exposing a top surface of the source/drain contact via;

a first interconnect wiring layer covering a lower portion of a sidewall of the interconnect wiring trench, the first interconnect wiring layer including a first precursor; and a second interconnect wiring layer on the first interconnect wiring layer, the second interconnect wiring layer covering an upper portion of the sidewall of the interconnect wiring trench, and the second interconnect wiring layer including a second precursor, wherein a crystal grain size of the second precursor is larger than a crystal grain size of the first precursor.

2. The integrated circuit device of claim 1, wherein the first interconnect wiring layer and the second interconnect wiring layer comprise a same metal.

3. The integrated circuit device of claim 1, wherein the first interconnect wiring layer and the second interconnect wiring layer comprise molybdenum (Mo).

4. The integrated circuit device of claim 1, wherein the first precursor of the first interconnect wiring layer comprises oxygen.

5. The integrated circuit device of claim 1, wherein the second precursor of the second interconnect wiring layer does not contain oxygen.

6. The integrated circuit device of claim 1, wherein a thickness of the first interconnect wiring layer in a vertical direction is smaller than a thickness of the second interconnect wiring layer in the vertical direction.

7. The integrated circuit device of claim 1, wherein the first precursor is on an inner wall of the interconnect wiring trench.

8. The integrated circuit device of claim 1, wherein the second precursor is at a lower portion of the second interconnect wiring layer.

9. The integrated circuit device of claim 1, further comprising:

a contact insulation layer on the interconnect wiring insulation layer;

a contact via vertically penetrating through the contact insulation layer, the contact via contacting a top surface of the second interconnect wiring layer;

a wiring insulation layer on the contact insulation layer; and a wiring pattern vertically penetrating through the wiring insulation layer and contacting a top surface of the contact via, wherein the wiring pattern comprises a first wiring layer and a second wiring layer, the first wiring layer includes the first precursor, the second wiring layer includes the second precursor, and the second wiring layer is on top of the first wiring layer.

10. The integrated circuit device of claim 9, wherein the first wiring layer and the second wiring layer comprise molybdenum (Mo).

11. The integrated circuit device of claim 1, further comprising:

a via power rail extending from a bottom surface of the first interconnect wiring layer and penetrating through a portion of the lower structure; and a backside power rail extending from a bottom surface of the via power rail and penetrating through a remaining portion of the lower structure, wherein the backside power rail includes a first backside power conductive layer and a second backside power conductive layer, the first backside power conductive layer includes the first precursor and is in contact with the via power rail, and the second backside power conductive layer includes the second precursor and covers a bottom surface of the first backside power conductive layer.

12. The integrated circuit device of claim 11, wherein the backside power rail has a shape in which a width of the backside power rail in a horizontal direction decreases toward the via power rail.

13. An integrated circuit device comprising:

an interconnect wiring pattern on a lower structure;

a source/drain contact via between the interconnect wiring pattern and the lower structure, the source/drain contact via electrically connecting the interconnect wiring pattern and the lower structure to each other;

a via power rail extending from a bottom surface of the interconnect wiring pattern and penetrating through an upper portion of the lower structure; and a backside power rail connected to the via power rail, the backside power rail penetrating through a lower portion of the lower structure that is not penetrated by the via power rail, wherein the backside power rail includes a first backside power conductive layer and a second backside power conductive layer, the first backside power conductive layer contains oxygen and covers a bottom surface of the via power rail, the second backside power conductive layer does not contain oxygen, and the second backside power conductive layer covers a bottom surface of the first backside power conductive layer.

14. The integrated circuit device of claim 13, wherein the first backside power conductive layer and the second backside power conductive layer comprise a same metal.

15. The integrated circuit device of claim 13, wherein the first backside power conductive layer and the second backside power conductive layer comprise molybdenum (Mo).

16. The integrated circuit device of claim 13, wherein a thickness of the first backside power conductive layer in a vertical direction is smaller than a thickness of the second backside power conductive layer in the vertical direction.

17. An integrated circuit device comprising:

a substrate including a fin-type active region protruding from a surface of the substrate;

a source/drain region on the fin-type active region;

a metal silicide layer in contact with a top surface of the source/drain region;

a gate line extending over the fin-type active region in a direction crossing the fin-type active region;

an insulation structure on the source/drain region, the metal silicide layer, and the gate line;

a source/drain contact penetrating through a first portion of the insulation structure in a vertical direction and connecting to the source/drain region through the metal silicide layer;

a gate contact penetrating through a second portion of the insulation structure in the vertical direction and connecting to the gate line;

an interconnect wiring pattern electrically connected to the source/drain contact or the gate contact; and a plurality of wiring structures on the interconnect wiring pattern and arranged at different levels in the vertical direction, wherein the plurality of wiring structures include a plurality of wiring patterns, at least one of the interconnect wiring pattern and the plurality of wiring patterns includes a first wiring layer and a second wiring layer covering a top surface of the first wiring layer, the first wiring layer contains oxygen, and the second wiring layer does not contain oxygen.

18. The integrated circuit device of claim 17, wherein the first wiring layer and the second wiring layer comprise a same metal.

19. The integrated circuit device of claim 17, wherein the first wiring layer comprises a first precursor, the second wiring layer comprises a second precursor, and the second precursor is different from the first precursor.

20. The integrated circuit device of claim 17, further comprising:

a via power rail extending in the vertical direction from a bottom surface of the interconnect wiring pattern; and a backside power rail extending in the vertical direction from a bottom surface of the via power rail, wherein the backside power rail comprises a first backside power conductive layer and a second backside power conductive layer, and the second backside power conductive layer covers a bottom surface of the first backside power conductive layer.

* * * * *